(12) United States Patent
Jono et al.

(10) Patent No.: US 7,339,833 B2
(45) Date of Patent: Mar. 4, 2008

(54) NON-VOLATILE SEMICONDUCTOR MEMORY DEVICE

(75) Inventors: Yusuke Jono, Tokyo (JP); Takashi Kono, Tokyo (JP); Tadaaki Yamauchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/481,782

(22) Filed: Jul. 7, 2006

(65) Prior Publication Data

US 2007/0008781 A1   Jan. 11, 2007

(30) Foreign Application Priority Data

Jul. 7, 2005   (JP)   ............................. 2005-198753

(51) Int. Cl.
*G11C 11/34* (2006.01)
(52) U.S. Cl. .................................. 365/185.25; 365/203

(58) Field of Classification Search ........... 365/185.25, 365/203, 191
See application file for complete search history.

(56) References Cited

U.S. PATENT DOCUMENTS

| | | | | |
|---|---|---|---|---|
| 3,514,765 | A | * | 5/1970 | Christensen ................ 365/205 |
| 6,950,347 | B2 | | 9/2005 | Kurata et al. |
| 2007/0008780 | A1 | * | 1/2007 | Jung et al. ............. 365/185.23 |

FOREIGN PATENT DOCUMENTS

| | | |
|---|---|---|
| JP | 11-330432 | 11/1999 |
| WO | WO 02/073623 A1 | 9/2002 |

* cited by examiner

*Primary Examiner*—Michael T Tran
(74) *Attorney, Agent, or Firm*—McDermott Will & Emery LLP

(57) ABSTRACT

Using charges accumulated in a capacitance element connected to a drain side node of a memory cell, data is written in accordance with source side injection method. The capacitance value of the capacitance element is changed in accordance with the value of write data. A non-volatile semiconductor memory device allowing writing of multi-valued data at high speed with high precision is achieved.

8 Claims, 37 Drawing Sheets

NON-VOLATILE SEMICONDUCTOR MEMORY DEVICE

BACKGROUND OF THE INVENTION

1. Field of the Invention

The present invention relates to a non-volatile semiconductor memory device and, more specifically, to a configuration of a portion related to data writing of a non-volatile semiconductor memory device performing a writing operation by introducing charges to a charge storage layer such as a floating gate. More specifically, the present invention relates to a configuration for highly precise control of threshold voltage distribution of a memory cell when multi-valued data is written.

2. Description of the Background Art

A non-volatile semiconductor memory device stores data utilizing the fact that threshold voltage of a memory cell transistor changes dependent on the amount of charges accumulated in the charge storage layer such as a floating gate. Dependent on the threshold voltage of the memory cell transistor, different amount of current flows when the memory cell is selected. By detecting the current flowing through the memory cell, data is read.

In data writing (programming), charges (electrons) are injected in accordance with information to be stored, in the charge storage layer of the memory cell transistor. Specifically, for data writing, a channel is formed at a surface of a semiconductor substrate region below the memory cell transistor, hot electrons are generated by accelerating current flowing through the channel, and the hot electrons are introduced into the charge storage layer such as the floating gate. When the amount of injected electrons increases, the threshold voltage of memory cell transistor becomes higher (when the memory cell transistor is formed of an N-channel transistor). Therefore, distribution of threshold voltages that differ in multi-steps allows storage of different data using different threshold voltages, and hence, it becomes possible to store multi-valued data in one memory cell transistor.

A non-volatile semiconductor memory device storing such multi-valued data is disclosed in Reference 1 (pamphlet of WO 2002/073623) and Reference 2 (Japanese Patent Laying-Open No. 11-330432).

In the device of Reference 1, an MOS transistor is connected in series with a memory cell transistor. The MOS transistor functions as an assist gate or a select gate that is rendered conductive in accordance with a word line potential. An assist gate forms a channel at a surface of a semiconductor region of the underlying layer in accordance with an applied voltage, and functions as a diffusion source/drain line in data reading. In data writing, the assist gate is set to a conductive state with relatively high resistance, and electrically couples adjacent memory cell transistors. A current is caused to flow from a drain region of one of the adjacent memory cell transistors to a source region of the other memory cell transistor. A high electric field generates in the channel region below the assist gate, and the high electric field produces channel hot electrons. An electric field in a vertical direction generated by a high voltage applied to a control gate (word line) of the memory cell transistor attracts the hot electrons toward the control gate, so that electrons are introduced to the floating gate.

A select transistor connects an adjacent memory cell transistor to a bit line (data line) in accordance with the word line potential, to form a path of current flow for the memory cell transistor. In data writing, a current is supplied through the select transistor to a memory cell transistor, and hot electrons are generated by a high electric field at the drain, so that the electrons are introduced into the floating gate.

According to Reference 1, in order to suppress variation in writing efficiency due to variation in threshold voltage of the MOS transistor (assist gate or select gate) connected in series with these memory cell transistors, a prescribed capacitance is connected to a drain bit line, and a write current is formed using charges accumulated in the capacitance.

In order to prevent a problem that variation in threshold voltage in the MOS transistors leads to much variation of gate current, which in turn leads to significant variation of the amount of injected charges, in Reference 1, variation in write characteristics is suppressed to be comparable to variation in electron injection efficiency and the width of threshold voltage distribution for each data value is narrowed when multi-valued data is written, so as to reduce time necessary for writing.

According to Reference 2, magnitude of a write current supplied to a memory cell is adjusted in accordance with the value of write data. This is to prevent a problem caused by a rush current in the initial stage of writing with the drain voltage kept constant, that is, to prevent the problem that excessive current flows to the memory cell and deteriorates memory cell characteristics.

In Reference 1 described above, the amount of electrons to be injected is determined using parasitic capacitance of a metal bit line and a bit line of a diffusion layer as a capacitance for storing charges at the time of writing. Therefore, in the structure disclosed in Reference 1, the amount of electrons to be injected to a selected memory cell is determined by the amount of charges accumulated in the capacitance. Accordingly, the amount of change in the threshold voltage of the selected memory cell per one writing (injection) is constant. Typically, for writing multi-valued data, the threshold voltage is increased stepwise, and the data is written accordingly.

Consider writing four-values of data "11", "10", "00" and "01", respectively. Data "01" corresponds to a written (programmed) state with the highest threshold voltage and data "10" corresponds to a written (programmed) state with the lowest threshold voltage. The state storing data "11" corresponds to an erased state. The threshold voltage of memory cell transistor is adjusted in accordance with the stored data, with the erased state being the starting state.

In the structure shown in Reference 1, when a data is written, the amount of charges injected for one writing operation is fixed, as the capacitance value is fixed. Therefore, the time necessary for writing data "01" corresponding to the written state of highest threshold voltage becomes longer than the time necessary for writing data "10" corresponding to the written state of lowest threshold voltage. In order to avoid this problem, the following write sequence may be used. Following a data writing (an erasure operation) to a memory cell having the lowest threshold voltage, when data "10" of high threshold voltage is written, writing is executed also to memory cells to which other data "00" and "01" are to be written. After writing of data "10" is complete, data writing is executed again to memory cells to store data "00" and "01", and after writing of data "00" is complete, writing is again executed to the memory cell to store data "01".

When this write sequence is adopted and data corresponding to a state of low threshold voltage is written, it is necessary as a write-verify to perform a verifying operation on each memory cell as the object of writing for determining whether the threshold voltage is in a prescribed voltage range. Therefore, the verifying operation takes long time. Further, the number of cycles of writing to the memory cell of the highest threshold voltage becomes considerably large, which means that a high voltage for writing is applied repeatedly thereto and the number of voltage stress application increases. Thus, deterioration of memory cell characteristics would be more likely.

Reference 2 changes the amount of write current in accordance with the value of each write data, when multi-valued data is written. An arrangement utilizing a series-connection including a capacitor, a resistance and a diode is shown, as an example, for changing magnitude of a supplied write current in accordance with the write data. By using the capacitor, the amount of charges to be supplied is adjusted and the amount of write current is adjusted accordingly.

Reference 2 is directed to a cell structure of a memory cell transistor by itself, where an MOS transistor such as the assist gate is not connected in series with the memory cell transistor. The problem of variation in the amount of charges for writing derived from the variation in threshold voltage of MOS transistors such as the assist gate, that is, the problem of variation in threshold voltage of the memory cell transistors, is not at all considered.

SUMMARY OF THE INVENTION

An object of the present invention is to provide a non-volatile semiconductor memory device allowing writing of multi-valued data accurately at high speed.

The present invention provides a non-volatile semiconductor memory device, including: a plurality of non-volatile memory cells each for storing data of at least three values and each causing current flow of different amount in accordance with stored data; a plurality of first signal lines arranged corresponding to each column of the memory cells; a plurality of second signal lines arranged corresponding to each column of the memory cells; a capacitance control circuit changing a capacitance value of at least one of the first and second signal lines in accordance with a value of write data, when data is written to a memory cell; and a write control circuit supplying charges accumulated in one of the first and second signal lines as a write current to the selected memory cell. The other of the first and second signal lines receives the write current applied through the selected memory cell.

In data writing, the capacitance of a signal line supplying the write current is changed in accordance with the value of write data. Consequently, it becomes possible to supply charges of the amount corresponding to the write data, to the signal line supplying the write current. Therefore, variation in the threshold voltage can be suppressed to be comparable to the variation of charge injection efficiency, and the width of threshold voltage distribution can be made narrower. This achieves highly precise writing, and in writing multi-valued data, the number of verifying operations for adjusting the width of threshold value distribution is reduced and hence the time for writing is reduced. Further, as the amount of supplied charges is adjusted in accordance with the value of write data, the amount of change in threshold voltage can be set in accordance with the write data. As a result, the number of times of data writing (injection) for writing data at a state of high threshold voltage is not much increased and, accordingly, the time necessary for data writing can be made shorter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
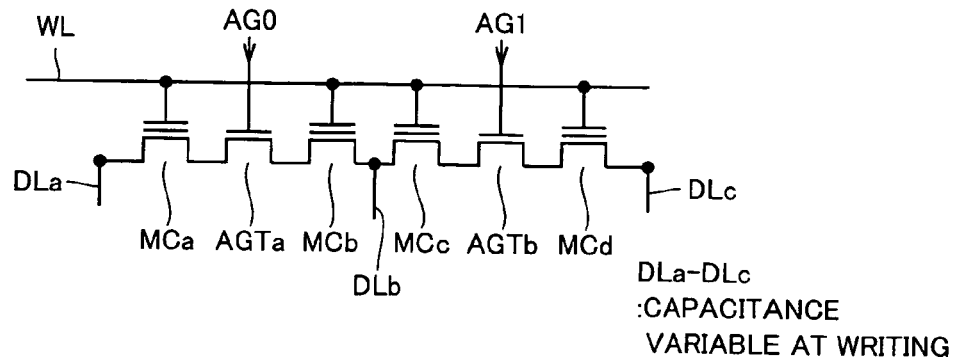
FIG. 1 shows an exemplary arrangement of memory cells in a semiconductor memory device in accordance with the present invention.

FIG. 1 schematically shows an arrangement of memory cells of a non-volatile semiconductor memory device to which the present invention is applied. Referring to FIG. 1, memory cells MCa to MCd are connected to a word line WL. Between memory cells MCa and MCb, an assist gate AGTa is arranged, and between memory cells MCc and MCd, an assist gate AGTb is arranged. To these assist gates AGTa and AGTb, assist gate selecting signals AG0 and AG1 are applied, respectively.

Memory cells MCa to MCc are formed of stacked gate type transistors having a floating gate, and a node opposite to a node connected to the assist gate is connected to a diffusion line DL (DLa to DLc) formed of an impurity diffusion layer of low resistance.

Assist gates AGTa and AGTb continuously extend in the column direction, in the same direction as diffusion lines DLa to DLc, and form inverted layers at the surface of substrate regions immediately below the gates, in accordance with assist gate selecting signals AG0 and AG1, respectively. These assist gates AGTa and AGTb do not have source/drain regions and they simply form inversion layers at the surface of substrate region immediately therebelow, in accordance with assist gate selecting signals AG0 and AG1. In FIG. 1, however, assist gates AGTa and AGTb are represented by the same symbol as common MOS transistors, as they form inversion layers.

The overall configuration of the memory array will be described later. Diffusion layers are further connected selectively to a metal interconnection line (global bit line) through a select gate.

In data reading, assist gate AGTa or AGTb is set to a selected state and forms an inversion layer therebelow, and the inversion layer serves as a source line. A selected memory cell has its corresponding diffusion line DL connected to the global bit line (metal interconnection line). By way of example, when memory cell MCb is selected for data reading, assist gate selecting signal AG0 attains to the selected state of H level and assist gate selecting signal AG1 attains to the unselected state of L level. Therefore, an inversion layer is formed below assist gate AGTa, that is, a source line for memory cell MCa is formed. Diffusion line DLb is connected to the global bit line. A read current is supplied to diffusion line DLb, and a current corresponding to the stored data is caused to flow through the inversion layer of assist gate AGTa. By detecting the amount of current flowing through diffusion line DLb, the data stored in memory cell MCb is read.

Here, assist gate selecting signal AG1 is in the unselected state and the inversion layer is not formed below assist gate AGTb, and in memory cell MCc, even when the word line WL is selected, a read current does not flow. Further, diffusion line DLa is in a floating state or set to a ground voltage level, so that no current flows to memory cell MCa. Therefore, it is possible to cause a current to flow through diffusion line DLb in accordance with the data stored in memory cell MCb, and to correctly read the memory cell data.

At the time of data writing, electrons are injected to the floating gate in accordance with Source Side Injection (SSI) method, in which electrons are injected to the floating gate from the source side of the memory cell transistor. Here, a "writing" operation corresponds to injection of electrons to the floating gate.

Figure 2:
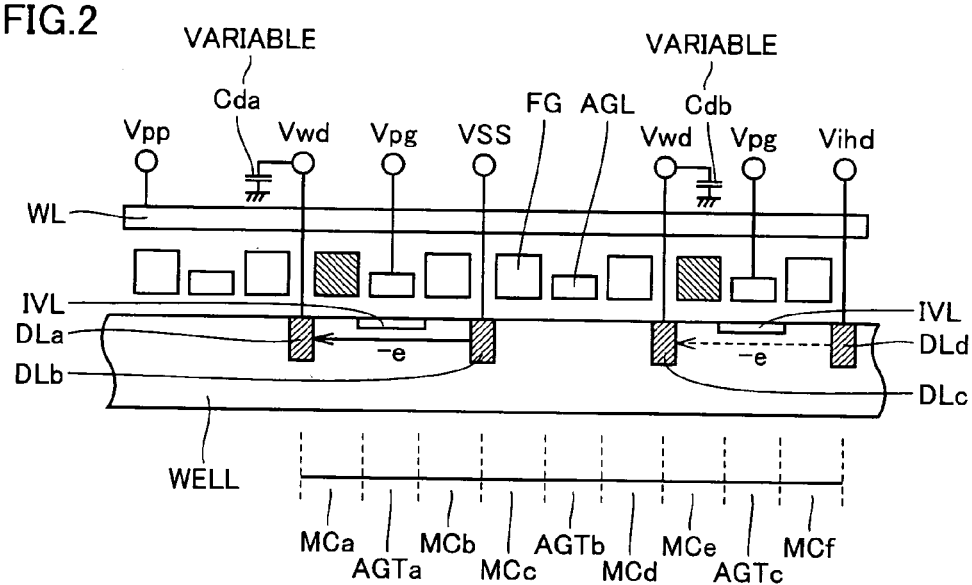
FIG. 2 shows voltages applied at the time of data writing to a series of memory cells shown in FIG. 1.

FIG. 2 shows a cross-sectional structure of the memory cell arrangement shown in FIG. 1 and voltages applied to various nodes at the time of data writing. FIG. 2 additionally shows memory cells MCe and MCf as well as an assist gate AGTc arranged between these memory cells MCe and MCf.

Diffusion lines DLa, DLb and DLc are formed of impurity regions spaced from each other at a surface of a semiconductor substrate region (well region) WELL and each serve as a source/drain region of the memory cell transistor. Memory cells MCa to MCf respectively have one conduction node (source/drain node) formed by diffusion lines DLa, DLb and DLc arranged adjacent thereto. FIG. 2 also shows a diffusion line DLe provided for memory cell MCf.

These memory cells MCa to MCf each include a floating gate FG, and have a control gate formed by a word line WL provided on floating gate FG.

Assist gates AGTa, AGTb and AGTc are each formed of an assist gate line AGL, and assist gate line AGL is arranged between the floating gates of adjacent memory cells. In accordance with the current applied to assist gate line AGL, an inversion layer IVL is formed at the surface of substrate region WELL. In the following description, the term "assist gate AGT" will be used to refer to the assist gate line AGL and the inversion layer therebelow.

At the time of data writing, a positive high voltage Vpp for writing is supplied to word line WL. When data is to be written to memory cell MCa, a drain write voltage Vwd is supplied to diffusion line DLa, and diffusion line DLb is set to the ground voltage VSS. A gate write (programming) voltage Vpf of, for example, about 0.6V to 1.5V is applied to assist gate line AGL of assist gate AGTa. Assist gates AGTa and AGTc commonly receive assist gate selecting signal AG0 shown in FIG. 1 and, therefore, the gate write voltage Vpg of the same voltage level is supplied to assist gate lines AGL of assist gates AGTa and AGTc, whereby inversion layers IVL are formed at the surfaces of the substrate regions below these gates. The selecting voltage is not applied to assist gate line AGL of assist gate AGTb and it is maintained at the ground voltage level, so that the inversion layer is not formed therebelow.

When writing of data to memory cell MCe is to be inhibited, a write inhibiting voltage Vihb is supplied to diffusion line DLc. As for the levels of voltages supplied for data writing, by way of example, word line write voltage Vpp is 15V, assist gate write voltage Vpg is 0.6V to 1.5V, drain write voltage Vwd is 4.5V, and write inhibiting voltage Vihb is 2V.

In this state, a current flows from diffusion line DLa through inversion layer IVL to diffusion line DLb. FIG. 2 shows the flow of electron "–e." The voltage level of gate programming voltage Vpg is, for example, 1.5V, which is slightly higher than the threshold voltage of the assist gate, and the inversion layer IVL of assist gate AGTa has a relatively high resistance. Therefore, the current flowing from diffusion line DLa generates hot electrons because of a high electric field near the inversion layer IVL of assist gate AGTa, and the hot electrons are drawn in the direction along the word line and injected to the floating gate above (represented by the hatching), by an electric field in the vertical direction derived from the high voltage of word line WL. By this injection of electrons, the threshold voltage of memory cell MCa becomes higher (assuming that the memory cell transistor is an N-channel type transistor). The writing operation of injecting electrons to the floating gate from the source side of memory cell MCa is referred to as the source side injection (SSI) writing.

In memory cell MCe, inversion layer IVL is formed at assist gate AGTe, and therefore, a current flows from diffusion line DLc to diffusion line DLd. To the diffusion line DLd, however, write inhibiting voltage Vihb is supplied, and voltage difference between diffusion lines DLc and DLd is small. Therefore, electrons are not so much accelerated as to generate hot electrons, and hence, injection of electrons to the floating gate of memory cell MCe does not occur. Accordingly, data writing to memory cell MCe is inhibited.

The threshold voltages of memory cells MCa to MCf are determined in accordance with the amounts of current injected to respective floating gates. Therefore, by charging the write voltage Vwd supplied to diffusion line DLa to capacitance element Cda and using the accumulated charges as the write current, the amount of electrons injected to the floating gate FG of memory cell MCa can be adjusted and, accordingly, the amount of change in the threshold voltage can be adjusted.

Therefore, by adjusting the capacitance values of capacitances Cda and Cdb connected to diffusion lines DLa and DLc, to which write voltage Vwd is transmitted, in accordance with the value of write data, the amount of electrons to be injected to the floating gate of the selected memory cell can be adjusted, that is, the mount of electrons to be injected per one writing can be adjusted. Therefore, by adjusting the amount of charges to be accumulated in capacitances Cda and Cdb at the time of writing multi-valued data, it becomes possible to write multi-valued data with the width of each respective threshold value distribution made narrower.

Figure 3:
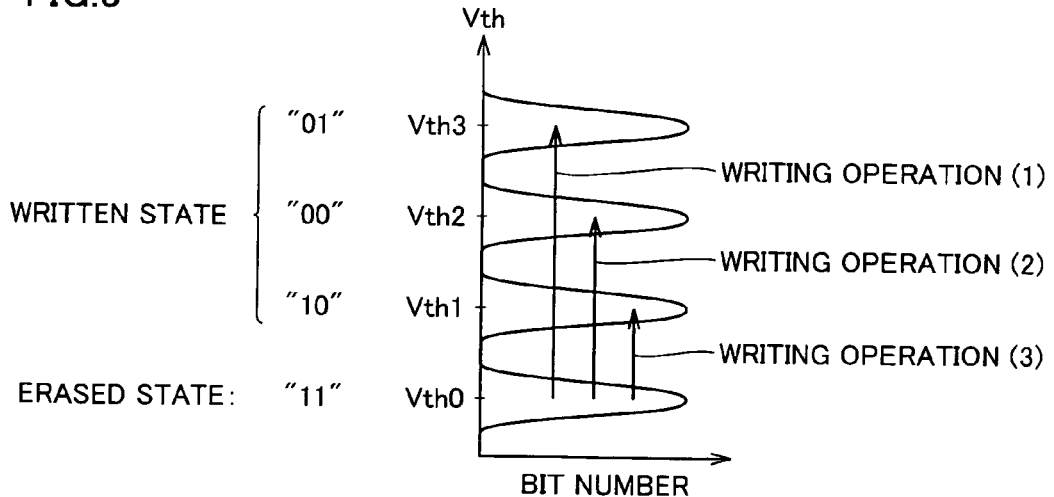
FIG. 3 illustrates correspondence between data stored in memory cells and threshold voltages.

FIG. 3 shows a relation between respective data values and the threshold voltages when 4-valued data is used as the multi-valued data. The ordinate represents threshold voltage Vth and the abscissa represents number of bits of the memory cells.

Referring to FIG. 3, a state storing data "11" corresponds to an erased state, and the central value of threshold voltage distribution is Vth0. States storing data "10", "00" and "01" are written states (programmed states), and the central threshold voltages of the threshold voltage distributions are Vth1, Vth2 and Vth3, respectively. The upper and lower limits of threshold value distributions corresponding to the 4-valued data respectively are determined beforehand and writing of data (injection of electrons) is performed such that the threshold voltage of the memory cell falls within the threshold voltage range between the upper and lower limits.

As shown in FIG. 3, at the time of data writing, all memory cells are set to the erased state, and the threshold voltage Vth is set to the lowest value. From this state, writing operations (1), (2) and (3) are executed to the memory cells as the objects of writing, in accordance with the write data, so that respective threshold voltages increase. Therefore in writing operation (1) of writing data "01", the threshold voltage changes the most, the amount of change in the threshold voltage is second largest in writing operation (2) of writing "00", and the amount of change in the threshold voltage is the smallest in writing operation (3) of writing "10". The amount of change in the threshold voltage is determined by the amount of electrons injected to the floating gate. Therefore, by adjusting capacitance values of capacitances Cda and Cdb shown in FIG. 2 and adjusting the amount of charges to be accumulated in diffusion lines in accordance with respective writing operations, it becomes possible to write data with the width of threshold voltage distribution made narrower.

Figure 4:
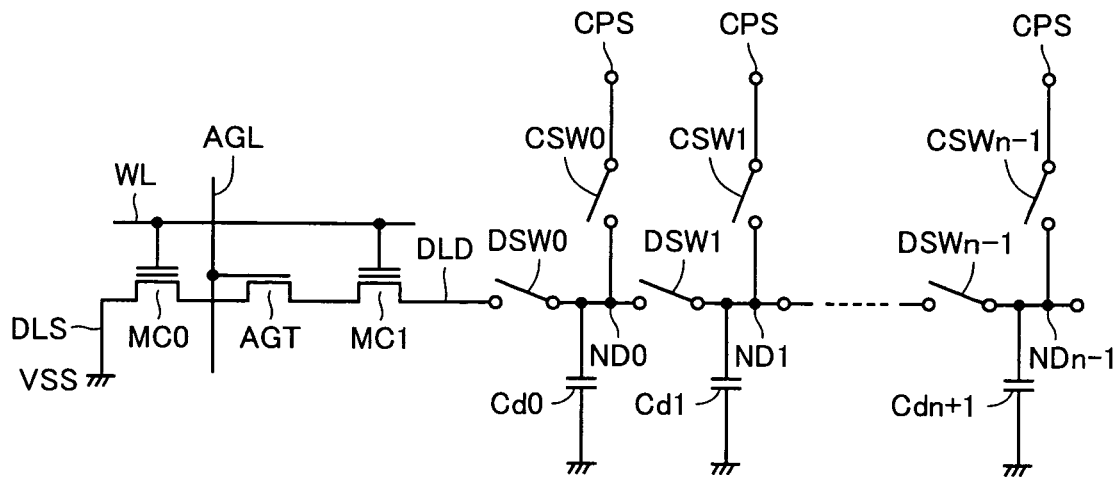
FIG. 4 schematically shows a configuration of a data writing unit in accordance with Embodiment 1 of the present invention.

FIG. 4 schematically shows a configuration of a write capacitance control unit in accordance with Embodiment 1 of the present invention. In FIG. 4, connection of memory cells MC0 and MC1 at the time of data writing is shown as a representative. Memory cells MC0 and MC1 have their control gates connected to the word line WL. A source node DLS of memory cell MC0 receives (through diffusion line) the ground voltage VSS. Between memory cells MC0 and MC1, an assist gate AGT is arranged, and a control gate of assist gate AGT forms a part of an assist gate line AGL.

Switching elements DSW0 to DSWn−1 are connected in series with a drain node DLB of memory cell MC1. Capacitance elements CD0 to Cdn−1 are arranged between nodes ND0 to NDn−1 corresponding to switching elements DSW0 to DSWn−1 and the ground node. Switching elements CSW0 to CSWn−1 for charging, which are coupled to a write voltage supplying node CPS when in conductive state, are connected respectively to nodes ND0 to NDn−1.

In the connection shown in FIG. 4, data is written to memory cell MC0, and a current flows from the drain node (diffusion line) DLD of memory cell MC1. The data written to memory cell MC0 is multi-valued data and, in accordance with the value of write data, the number of capacitance elements C0 to Cn−1 to be connected to drain node DLD is adjusted by rendering conductive/non-conductive the switching elements DSW0 to DSWn−1 at the time of selection. Thus, the capacitance value of capacitance elements coupled to drain node DLD is adjusted and hence, the amount of accumulated charges is adjusted.

By way of example, for writing operation (1) shown in FIG. 3, the largest amount of electrons are injected and, therefore, largest number of switching elements DSW0 to DSWn−1 are selectively set to an ON state (conductive state), to increase the number of capacitance elements connected to drain node DLD. For writing operation (3) shown in FIG. 3, the number of switching elements set to the ON state (conductive state) among the switching elements DSW0 to DSWn−1 is reduced to the smallest. When we represent the capacitance values of capacitances accumulating charges for writing used for writing operations (1), (2) and (3) as Cc1, Cc2 and Cc3, respectively, there is the following relation:

$$Cc1 \geq Cc2 \geq Cc3.$$

In each write cycle, charges to be accumulated in the capacitance element are supplied to the memory cell. The amount of electrons to be injected to the floating gate of memory cell MC0 is determined by the amount of charges accumulated in the capacitance associated with the drain node DLD. Therefore, although there is still a variation derived from difference in injection efficiency, the amount of electrons injected to the floating gate at each writing operation becomes almost the same. In each of writing operations (1), (2) and (3) shown in FIG. 3, variation in threshold voltage in one write cycle is small, and the width of threshold voltage distribution becomes small. As a result, in the verifying operation for writing operations (1), (2) and (3), the number of rewriting cycles can be reduced and hence the time necessary for writing can be reduced. Further, as the width of threshold voltage distribution becomes narrower, it becomes possible to store multi-valued data with high precision.

Figure 5:
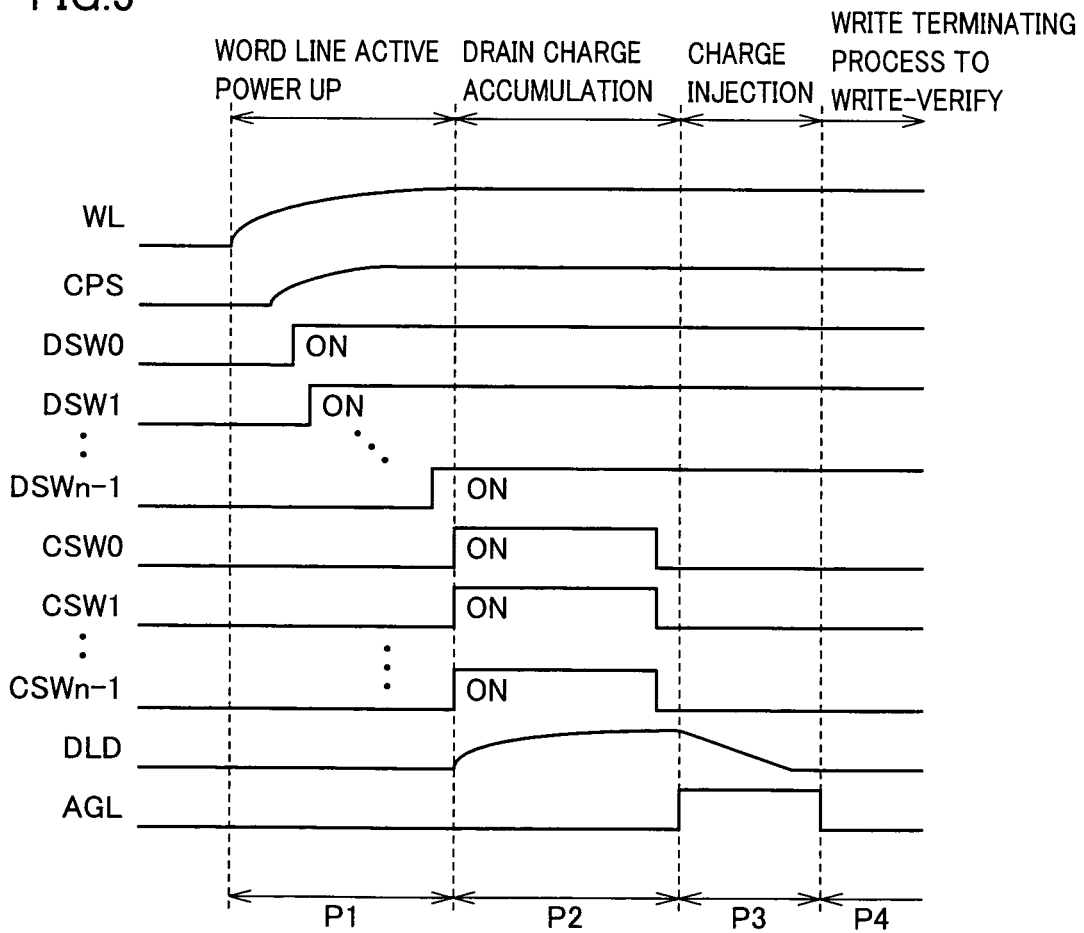
FIG. 5 is a diagram of waveforms representing an operation in data writing by the configuration shown in FIG. 4.

FIG. 5 is a diagram of signal waveforms representing an operation at the time of data writing by the circuit shown in FIG. 4. FIG. 5 shows an example in which writing operation (1) of FIG. 3 is performed, utilizing charges accumulated in all capacitance elements Cd0 to Cdn−1.

First, in a period P1 of word line activation and power up, word line WL is driven to a selected state of a high voltage level for writing, and voltage level of node CPS for supplying write voltage is increased to a write voltage level. In this period, after word line WL has been driven to the writing high voltage level, switching elements DSW0 to DSWn−1 are all selectively set to the conductive (ON) state. For writing data "01" through writing operation (1), switching elements DSW0 to DSWn−1 are all rendered conductive. Switching elements DSW0 to DSWn−1 are successively and sequentially set to the conductive state after the word line WL has been driven to the selected state of writing high voltage level, in order to prevent the change in capacitance of drain node (diffusion line) DLD from affecting the selecting operation of word line WL. Further, switching elements DSW0 to DSWn−1 are successively and sequentially rendered conductive in order to prevent any change in voltage of an internal node caused by noise when the capacitance value changes as the capacitance elements are connected.

After the necessary number of capacitances (Cd0 to Cdn−1) are connected to the drain node (diffusion line) DLD, in period 2 of accumulating drain charges, switching elements CSW0 to CSWn−1 for charging are rendered conductive, and the drain write voltage is supplied from write voltage supplying node CPS to capacitance elements Cd0 to Cdn−1. In the charging operation of period P2, switching elements DSW0 to DSWn−1 are all on, and the voltage level of drain node DLD increases in accordance with the charging operation.

When period P2 for accumulating drain charges is complete, voltage level of assist gate line AGL is increased, to form an inversion layer at assist gate AGT. Consequently, charges flow from drain node DLD through source node DLS to the ground node, through memory cell MC1, assist gate AGT and memory cell MC0.

Because of high resistance of the inversion layer at assist gate AGT, a high electric field is formed on the source side of memory cell MC1, and by source side injection, electrons are injected to the floating gate, increasing the threshold voltage of memory cell MC1. Here, as capacitance elements Cd0 to Cdn−1 are discharged, the voltage level of drain node DLD also decreases, and when the voltage level of drain node DLD attains to a certain voltage level or lower, formation of hot electrons stops, and injection of electrons stops. In charge injection period P3, charges accumulated in drain node DLD are eventually all discharged to the ground node.

When the period P3 of injecting charges is complete, an operation necessary for terminating writing is performed in period P4, in which assist gate line AGL is driven to the unselected state and the inversion layer at assist gate AGT disappears. As a result, memory cells MC1 and MC0 are electrically isolated, discharge from drain node DLD is fully stopped, and the writing operation is completed. Further, the selected word line is driven to the unselected state. A write-verify operation for determining whether data has been correctly written or not is performed (when the verifying operation is to be done for every writing).

In the period P3 of injecting charges, switching elements CSW0 to CSWn−1 for charging are all non-conductive, and write voltage supplying node CPS is isolated from corresponding nodes ND0 to NDn−1. Therefore, only the charges that have been accumulated in capacitance elements Cd0 to Cdn−1 are supplied to drain node DLD, and even when memory cell MC1 has low threshold voltage at the start of writing, flow of a large current can be prevented.

Figure 6:
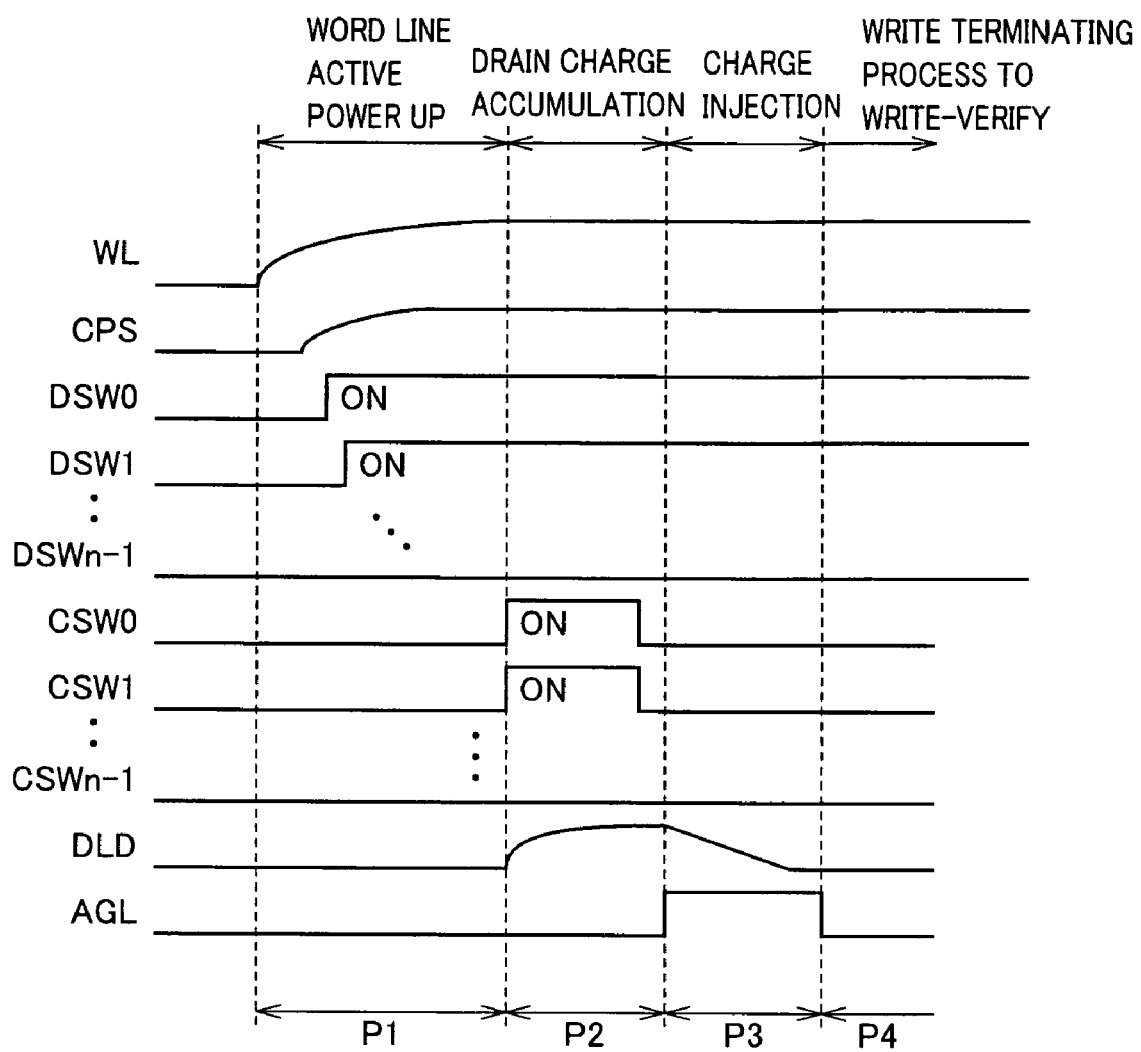
FIG. 6 schematically shows another sequence at the time of data writing by the configuration shown in FIG. 4.

FIG. 6 is a diagram of waveforms representing writing operation (3) shown in FIG. 3. The data writing operation of FIG. 6 differs from the writing operation of FIG. 5 in the following points. Specifically, in period P1 of activating the write power supply for the word line, switching elements DSW0 and DSW1 are set to the conductive state, and remaining switching elements (DSW2 (not shown) to DSWn−1) are kept non-conductive. Thus, capacitance elements Cd0 and Cd1 are connected in series with drain node DLD.

In period P2 of accumulating drain charges, only the capacitance elements Cd0 and Cd1 are used for writing, and therefore, switching elements CSW0 and CSW1 for charging are set to the conductive state and capacitance elements Cd0 and Cd1 and drain node DLD are charged. To the write voltage supplying node CPS, a write voltage is supplied from an internal write voltage generating circuit. Therefore, the amount of charging current for capacitance elements Cd0 to Cd1 is determined by the amount of driving current of the write voltage generating circuit. Here, only two capacitance elements Cd0 and Cd1 are charged, and it is possible to charge the two capacitance elements using all the current supplied by the drain write voltage generating circuit. Therefore, as shown in FIG. 6, when capacitance elements Cd0 and Cd1 are charged, the time width of period P2 necessary for charging can be made shorter than when all the capacitance elements Cd0 to Cdn−1 are to be charged.

Therefore, in accordance with the number of capacitance elements used or with the value of write data, that is, in accordance with the amount of accumulated charges used for writing, the time width of period P2 of accumulating drain charges is adjusted. Thus, the overall time necessary for writing all the data can be made shorter.

Further, in period P3 of injecting charges (injection period), assist gate line AGL is driven to the selected state, and the inversion layer is formed at assist gate AGT shown in FIG. 4. Here, the amount of charges (electrons) injected to the floating gate of memory cell MC1 is small, and therefore, period P3 necessary for electron injection can be made short. Data writing (injection of electrons to the floating gate) automatically stops, when voltage difference between drain node DLD and source node DLS attains to a prescribed value or lower and generation of hot electrons stops. Here, by adjusting the time width of period P3 of charge injection in accordance with the amount of charges to be injected, it is possible to accurately determine the time period in which electrons are injected to the floating gate, and hence, the amount of injected electrons, that is, the amount of electrons accumulated in the floating gate, can be adjusted. Therefore, highly precise writing, with narrow width of threshold voltage distribution after data writing, becomes possible.

Time width of periods P2 and P3 may be adjusted in accordance with the value of write data. Further, the switching element or elements to be set to the conductive state among switching elements GSW0 to GSWn0−1 and CSW0 to CSWn−1 may be set in accordance with the value of write data.

Figure 7:
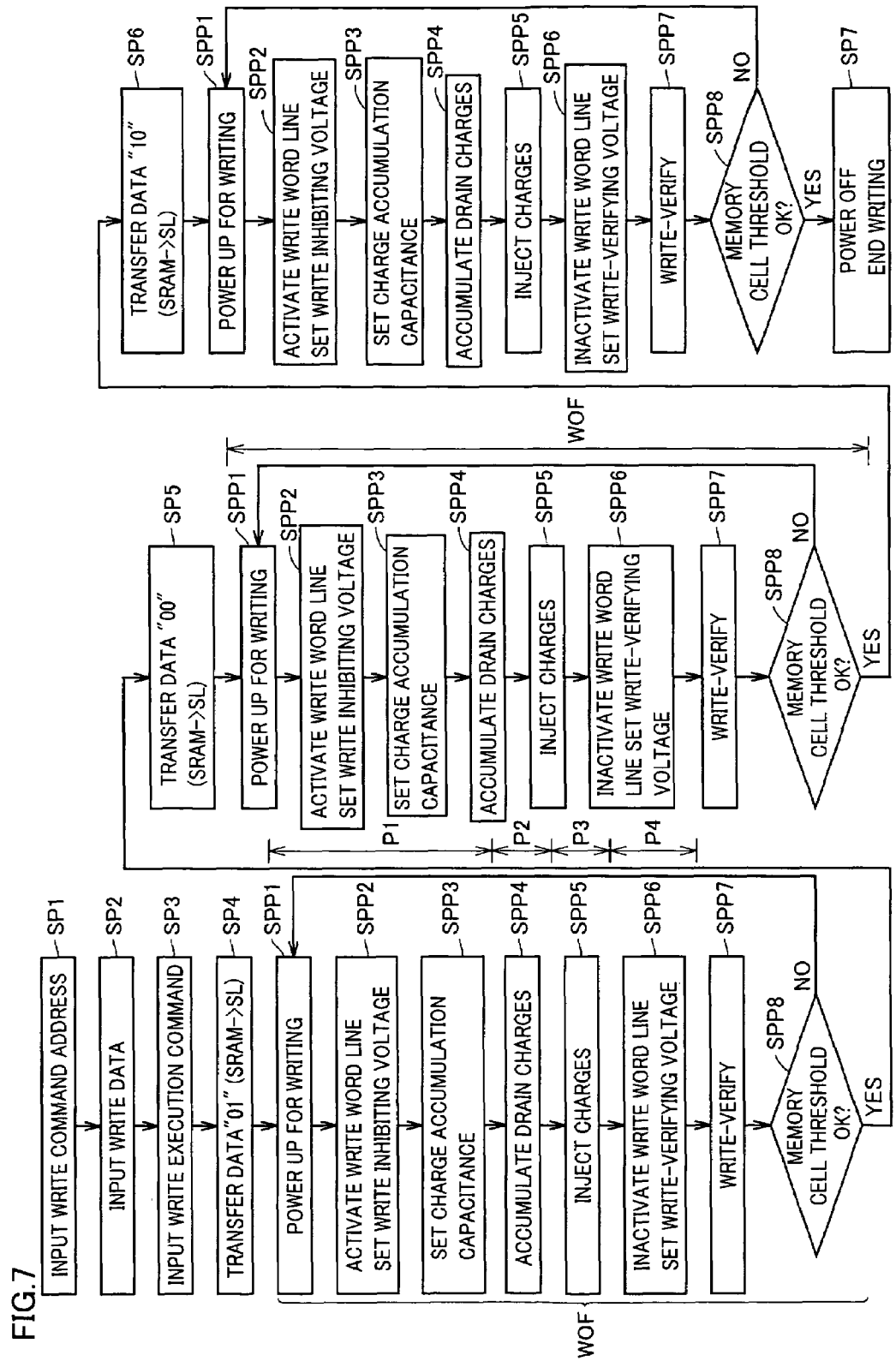
FIG. 7 is a flow chart representing an operation in data writing of the semiconductor memory device in accordance with Embodiment 1 of the present invention.

FIG. 7 is a flow chart representing an operation at the time of data writing according to Embodiment 1 of the present invention. In the following, the operation at the time of data writing according to Embodiment 1 of the present invention will be described with reference to FIG. 7.

First, in data writing, a write command is applied from an outside of the memory, together with an address (step SP1). Thus, data writing is designated, and the start address for writing data is designated.

Thereafter, write data is applied (step SP2). As for the write data, write data corresponding to the number of data for a unit of writing are transferred. By way of example, for writing page-size data, write data corresponding to one page are transferred. The write data are stored in an internal write data register.

After all write data are transferred, a write execution command is applied, and an internal writing operation starts (step SP3).

In response to the write execution command, first, an internal erasure operation takes place, in which data "11" is written to every memory cell of the writing target.

Thereafter, the data that have been written and stored in data register (SRAM: Static Random Access Memory) in step SP2 are transferred to a sense amplifier latch (SL) (step SP4). First, writing of data "01" (writing operation (1)) is executed, and therefore data "01" is transferred to sense amplifier latch SL arranged corresponding to each column of memory cells. Here, other than to the memory cell to which the data should be written, data representing write inhibition (write inhibiting voltage) is transferred, as will be described in detail later.

Thereafter, a threshold value changing sequence WOF for actually writing data to the selected memory cell is executed. In the threshold value adjusting sequence, first, a write power supply is activated (step SPP1). The write power supply includes internal voltage generating circuits respectively generating a word line write voltage, a drain write voltage applied to the drain node of a memory cell, a gate program voltage applied to the assist gate line in writing and the like. Each of the voltage generating circuits of the write power supply may be formed, for example, by a circuit utilizing a charge-pump operation of a capacitor.

After the activation of write power supply, the write word line is driven to the selected state, and the write inhibiting voltage (Vihb) for inhibiting data writing is transmitted to memory cells that are not the object of writing, so that the voltage of the source node is set to either one of the ground voltage and the write inhibiting voltage (step SPP2).

Thereafter, charge accumulating capacitance for accumulating charges to be transmitted to the drain node is set (step SPP3). The charge accumulating capacitance is set by selectively setting each of the drain switching elements (DSW0 to DSWn−1) to the conductive state in period P1 shown in FIG. 6. Charges from the drain write voltage generating unit included in the write power supply are accumulated in the drain side capacitance elements (Cd0, . . . ) and the parasitic capacitance of drain node.

When accumulation of drain charges is completed, data writing to the memory cell is performed (step SPP5). In the step SPP5 of charge injection, the voltage of assist gate line is driven to the selected state to cause a memory cell current to flow, whereby electrons are injected to the floating gate of the selected memory cell.

After the completion of charge injection, a write terminating process is performed, in which the voltage level of the write word line is lowered, and a write-verifying voltage is set for determining whether writing has been done successfully (step SPP6).

Using the write-verifying voltage, the written data is read, and whether the threshold voltage of the memory cell to which data "01" has been written satisfies the condition of threshold voltage distribution range for data "01" or not is determined (step SPP8).

At determination step SPP8, when it is determined that the threshold voltage of memory cell is out of the distribution range, the operation from step SPP1 is repeated on the memory cell of which writing has been unsuccessful. Here, writing is inhibited to the memory cell of which threshold voltage is determined to be normal (the write inhibiting voltage is set or latched data of the corresponding sense latch is set to the write-complete state).

When it is determined at determination step SPP8 that the threshold voltage is within the prescribed distribution range (not lower than the lower limit threshold voltage and not higher than the upper limit threshold voltage), the threshold value changing sequence WOF for data "01" is completed.

Thereafter, the data "00" that has been stored in the data register (SRAM) is transferred to the sense latch (SL) (step SP5). Then, in accordance with the transferred data "00", the threshold changing sequence WOF similar to that for writing data "01" is executed. For writing data "00", in step SPP3 of setting charge accumulating capacitance, the number of accumulating capacitances used is reduced, and in step SPP4 of accumulating drain charges, the time period of charge accumulation is made shorter. Further, at step SPP5 of charge injection, the time period of charge injection is made shorter. In threshold value changing sequence WOF, steps SPP1 to SPP3 correspond to the period P1 of word line activation and power supply activation shown in FIGS. 5 and 6, and step SPP4 of accumulating drain charges corresponds to period P2 of accumulating drain charges. Step SPP5 of charge injection corresponds to P3. Step SPP6 corresponds to the process period P4 for the write termination process and the write-verify.

After completion of threshold value changing sequence WOF for data "00", writing of data "10" takes place (step SP6). At step SP6, the data "10" that has been stored in the data register (SRAM) is transferred to the sense amplifier latch (SL). After the end of step SP6, the threshold changing sequence WOF similar to that for writing data "01" and "00" is executed. When it is determined that the threshold voltages of memory cells are all normal (OK) for data "10" at determination step SP8, the write power supply system is inactivated and the data writing ends (step SP7).

The capacitance for charge accumulation at the drain node connected to the memory cell may be implemented by using, for example, an MOS capacitor connected independently to each drain diffusion layer, or parasitic capacitance of diffusion line may be used. A configuration that implements variable capacitance for charge accumulation will be described in detail later.

Memory cell structure is not limited to a so-called AG_AND flash memory using an assist gate, and the invention is similarly applicable to a memory cell structure having a selection transistor connected in series with the memory cell transistor.

The charge accumulating layer for accumulating charges is not limited to the floating gate, and a charge trap insulating film, accumulating charges in a nitride film of an ONO (oxide-nitride-oxide) film, may be used as the charge accumulating layer.

As described above, according to Embodiment 1 of the present invention, for a memory cell in which multi-valued data is to be stored, the amount of charge accumulation is adjusted in accordance with the value of the write data, a write current is generated by the accumulated charges and injected to the charge accumulating layer such as the floating gate of the memory cell. Therefore, the amount of electrons injected to the charge accumulating layer of the memory cell at one write cycle can accurately be adjusted and the width of threshold voltage distribution of the memory cell after data writing can be made narrower, so that highly precise writing becomes possible and the time necessary for writing can be reduced (as the number of times of verifying operations can be reduced).

Embodiment 2

Figure 8:
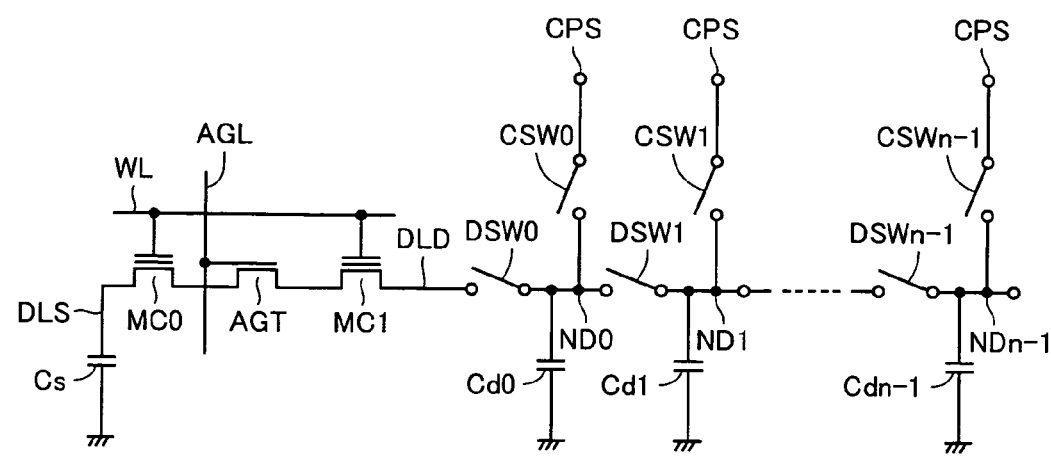
FIG. 8 schematically shows a configuration of a main portion of a non-volatile semiconductor memory device in accordance with Embodiment 2 of the present invention.

FIG. 8 schematically shows a configuration of a main portion of a non-volatile semiconductor memory device according to Embodiment 2 of the present invention. The configuration shown in FIG. 8 differs from that of FIG. 4 in the following point. Specifically, in the configuration shown in FIG. 8, capacitance element Cs is connected also to the source node DLS of memory cell MC0. Except for this point, the configuration shown in FIG. 8 is the same as that of FIG. 4. Therefore, corresponding portions are denoted by the same reference characters and detailed description thereof will not be repeated.

In Embodiment 2 of the present invention, charges are distributed between capacitance Dc (combined capacitance of capacitances used among Cd0 to Cdn−1) of drain node DLD and capacitance Cs connected to the source node (diffusion line) DLS, so that a current is caused to flow between the source/drain of the memory cell and data is written in accordance with source side injection method. The manner of adjusting the capacitance of charge accumulation connected to drain node DLD is the same as that in Embodiment 1 above.

Now, the magnitude of a capacitance connected to drain node DLD is represented by Cd and the magnitude of a capacitance connected to source node DLS is represented by Cs. It is assumed that the capacitance Cs of source node DLS is initially in a discharged state. When we represent the amount of accumulated charges of drain node capacitance Dc by Q and the drain write voltage by Vcps, the amount Q of accumulated charges at drain node DLD is given by the following equation:

$$Q = Vcps \cdot Cd$$

The charges Q of drain node are shared with capacitance Cs, by charge distribution. Therefore, from the law of conservation of electric charges, the following equation holds:

$$Q = Vcps \cdot Cd = Vsd(Cd + Cs),$$

where Vsd represents voltage of source node DLS and drain node DLD after charge distribution.

Therefore, the amount of change Qd of charges at drain node DLD is given by:

$$\begin{aligned} Qd &= Vcps \cdot Cd - Vsd \cdot Cd \\ &= (Vcps - Vsd) \cdot Cd \\ &= Vcps \cdot Cs / (Cd + Cs) \end{aligned}$$

The capacitance value Cs of source node DLS, capacitance value Cd of the drain node and the drain write voltage Vcps can be set to exact values, respectively. Therefore, the amount of charges Qd that move from the drain node DLD to the source node DLS can be set exactly and hence, the amount of electrons injected to the floating gate of the memory cell in one write cycle can be set exactly. Therefore, data writing with higher precision and limited distribution width of threshold voltage becomes possible.

It is noted that not all the moving charges are injected to the floating gate. When the voltage difference between the drain node DLD and the source node DLS becomes small and generation of hot electrons stops, injection of electrons stops. In this case also, the drain and source voltages to be the voltage for stopping writing (injection) can be predicted, and the amount of electrons to be injected can be calculated.

[Modification 1]

Figure 9:
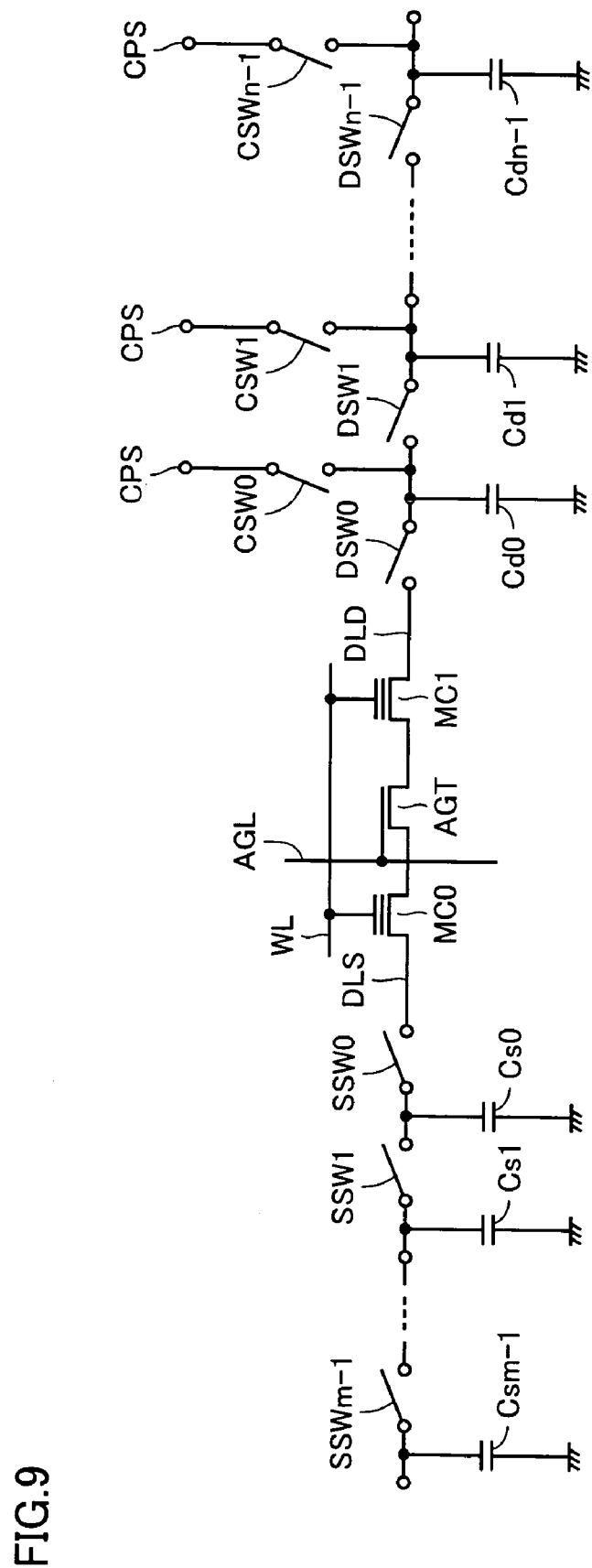
FIG. 9 schematically shows another configuration of the main portion of the non-volatile semiconductor memory device in accordance with Embodiment 2 of the present invention.

FIG. 9 schematically shows a configuration of a first modification of the non-volatile semiconductor memory device according to Embodiment 2. The configuration shown in FIG. 9 differs from that of non-volatile semiconductor memory device shown in FIG. 8 in the following point. Specifically, in the configuration shown in FIG. 9, a plurality of capacitance elements Cs0 to Csm-1 are provided as capacitance elements connected to source node DLS. Corresponding to these capacitance elements Cs0 to Csm-1, switching elements SSW0 to SSWm-1 for adjusting source capacitance values are arranged and connected in series. Except for this point, the configuration of non-volatile semiconductor memory device shown in FIG. 9 is the same as that of non-volatile semiconductor memory device shown in FIG. 8. Therefore, corresponding portions are denoted by the same reference characters and detailed description thereof will not be repeated.

In the configuration shown in FIG. 9, by adjusting the number of capacitance elements connected to the source node DLS, the capacitance value of capacitance elements connected to the source node DLS can be adjusted. Therefore, as compared with the configuration shown in FIG. 8, the amount of charges transferred from the drain node DLD to the source node DLS can more delicately be adjusted. Specifically, from the equations above, it is understood that the amount of charges Qd that move from the node DLD on the drain side to the node DLS on the source side is in proportion to $1/((1/Cd)+(1/Cs))$. Therefore, by adjusting the capacitance values of drain node capacitance Cd and source node capacitance Cs, the amount of charges that move can be adjusted. When the node capacitance Cs on the source side is sufficiently larger than the capacitance of drain node Cd, the charges accumulated in node DLD on the drain side can be transferred, and when, on the other hand, the node capacitance Cs on the source side is smaller than the capacitance Cd on the side of the drain node, the amount of charges transferred form the drain node to the source node becomes smaller. When the source node is coupled to the ground, the source capacitance corresponds to infinite value.

Accordingly, the amount of charges to be transferred in one writing operation (operation of injecting electrons to the floating gate; one writing operation will be hereinafter referred to as an injection) can be adjusted with high precision, the amount of electrons to be injected can be adjusted, and the variation in threshold voltages can be reduced.

As described above, according to Embodiment 2 of the present invention, capacitances are connected to the source side and drain side of the memory cell, and a write current is generated by utilizing electron distribution among the capacitances. Therefore, more delicate adjustment in the amount of write charges becomes possible, variation in threshold voltages can be suppressed, and writing with high precision becomes possible.

Embodiment 3

Figure 10:
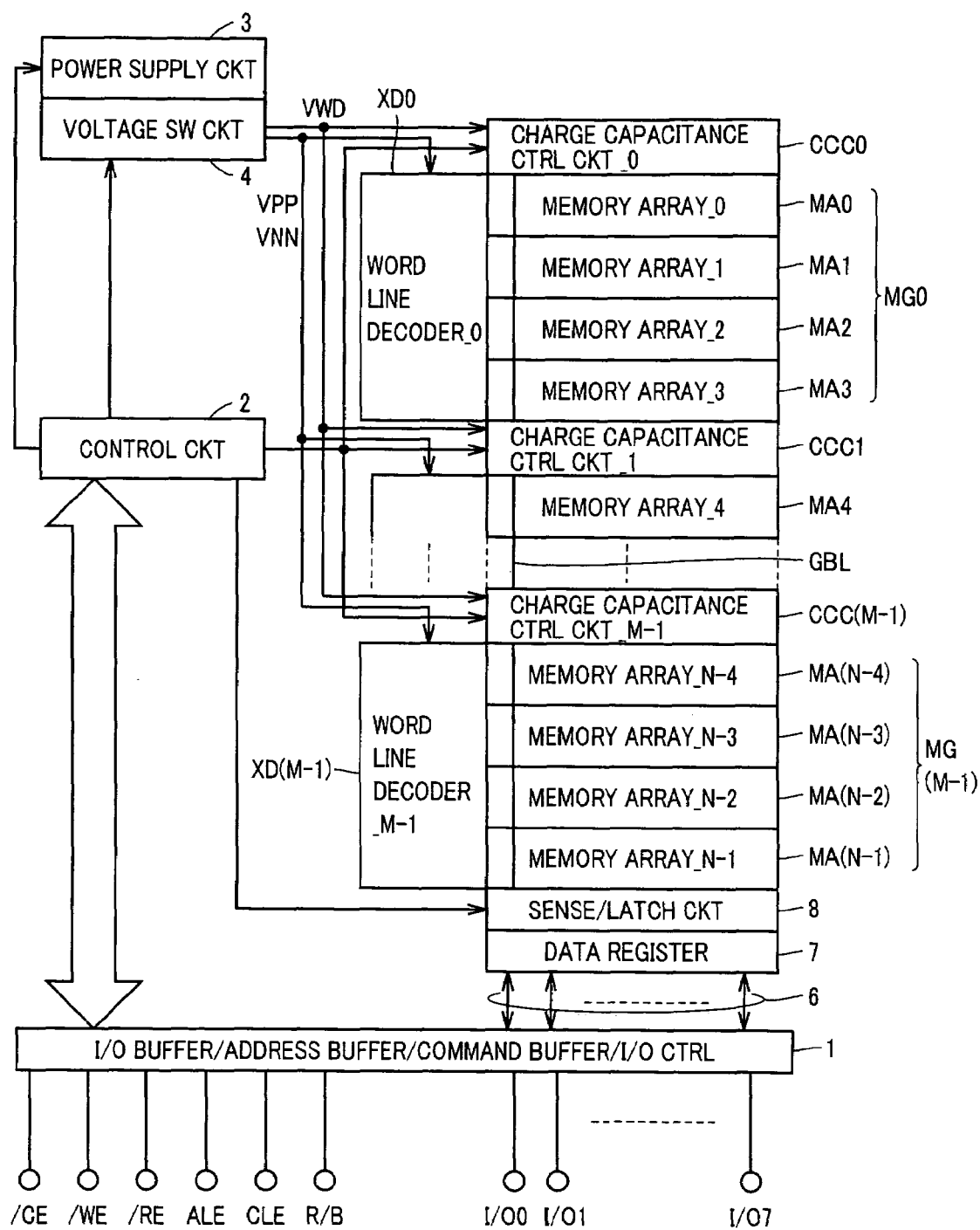
FIG. 10 schematically shows an overall configuration of a non-volatile semiconductor memory device in accordance with Embodiment 3 of the present invention.

FIG. 10 schematically shows an overall configuration of a non-volatile semiconductor memory device according to Embodiment 3 of the present invention. The non-volatile semiconductor memory device shown in FIG. 10 implements the configurations of Embodiments 1 and 2 described above.

Referring to FIG. 10, the non-volatile semiconductor memory device includes memory array groups MG0 to MG(M-1) each including a plurality of (in the example of FIG. 10, four) memory arrays. Memory array group MG0 includes memory arrays MA0 to MA3, and memory array group MG(M-1) includes memory arrays MA(N-4) to MA(N-1). In each of the memory arrays MA to MA(N-1), the internal configuration of which will be describe in detail later, memory cells are arranged in a matrix of rows and columns. A word line is provided corresponding to each row of memory cells, and a bit line is provided corresponding to each column of memory cells, to be shared by adjacent columns. In FIG. 10, a global bit line GBL provided common to the columns of memory cells in memory arrays MA0 to MA(N-1) is shown as a representative. The bit line of the memory array (or the assist gate line) is coupled to a corresponding global bit line through a select gate.

Corresponding to respective memory array groups MG0 to MG(M-1), word line decoders XD to XD(M-1) are provided. Word line decoders XD0 to XD(M-1), when selected, drive the word line to the selected state in one of the memory arrays of the corresponding memory array group.

For memory array groups MG0 to MG(M−1), charge capacitance control circuits CCC0 to CCC(M−1) are provided.

By charge capacitance control circuits CCC0 to CCC(M−1), the capacitance values of charge accumulating capacitances of the drain node and the source node of selected memory cell are adjusted.

The non-volatile semiconductor memory device further includes: an interface circuit 1 receiving external control signals /CE, /WE, /RE, ALE, CLE and R/B and outputting data I/O0 to I/O7; a control circuit 2 receiving a control signal from interface circuit 1 and generating a necessary control signal in accordance with the designated operation mode; a power supply circuit 3 generating an internal voltage under the control of control circuit 2; and a voltage switching circuit 4 switching voltage level and voltage polarity of the voltage generated by power supply circuit 3.

Power supply circuit 3 generates an internal voltage necessary for writing, reading and verifying. Voltage switching circuit 4 sets the internal voltage generated by power supply circuit 3 to the voltage level designated by control circuit 2. In FIG. 10, voltage switching circuit 4 is shown generating a drain write voltage VWD, a word line write voltage VPP and a negative voltage VNN, as an example. The negative voltage VNN is used in an erasure mode. Voltages VPP and VNN are applied to word line decoders XD0 to XD(M−1), and in the write mode, the selected word line is set to the positive high voltage VPP and in the erasure mode, the selected word line is set to the negative voltage VNN. The drain write voltage VWD is supplied to a write voltage supplying node (CPS) of the charge capacitance control circuit, at the time of data writing.

Control signal /CE is a chip enable signal indicating that the non-volatile semiconductor memory device is selected and an operation related to a data access will be performed on the semiconductor memory device. Control signal /WE is a write enable signal, indicating that a data writing mode is designated. Control signal /RE is a read enable signal, indicating that data reading is designated.

Control signal ALE is an address latch signal, providing an instruction for latching an applied address signal (generally applied through a data input/output terminal) to an address buffer included in interface circuit 1 and providing latch timing.

Control signal CLE is a command latch enable signal, similarly designating a mode for taking an external command into a command buffer included in interface circuit 1 and providing a latch timing.

Control signal R/B is a ready/busy signal indicating that it is ready for data writing, and that data writing and verifying operations are being performed inside and any external access cannot be accepted.

Interface circuit 1 includes an input/output buffer transmitting/receiving data I/00 to I/07, an address buffer latching an address signal, a command buffer latching a command, and an input/output control circuit for input/output control (determining direction of data transfer for writing and reading), and operation timings are given in accordance with the control signals described above.

A data register 7 is provided for transferring internal data to/from interface circuit 1 through data bus 6. Data register receives and latches data read from a memory cell of a selected row of a selected memory array, and latches write data to a selected memory cell in data writing. In the data register, register circuits are arranged corresponding to columns of memory cell for transferring data to/from the corresponding column (global bit line).

For executing write operations (1) to (3) shown in FIG. 3 at the time of data writing, a sense/latch circuit 8 taking and latching data from data register 7 is provided. Sense/latch circuit 8 includes a sense amplifier provided corresponding to each column of memory arrays MA0 to MA(M−1), and in data writing, receives and latches data transferred from data register 7. In data writing, data register 7 generates data for executing or inhibiting data writing for each column in accordance with stored data, and transfers the generated data to sense/latch circuit 8. In sense/latch circuit 8, in accordance with a write inhibiting instruction from data register 7, a write inhibiting voltage is generated for inhibiting writing in each of writing operations (1) to (3).

In the non-volatile semiconductor memory device shown in FIG. 10, the capacitance value of capacitances accumulating charges for writing is adjusted by charge capacitance control circuits CCC0 to CCC(M−1). Here, the value of drain side capacitance or source side capacitance may be adjusted in each of the charge capacitance control circuits CCC0 to CCC(M−1). In the present invention, however, parasitic capacitances of diffusion lines (source diffusion line and drain diffusion line) and of the global bit line coupled to sense/latch circuit 8 are utilized, and by adjusting the length of these lines, the capacitance value is adjusted and the layout area of the memory mat (memory array arranging area) is reduced. Specific configurations of various portions will be described in the following.

Figure 11:
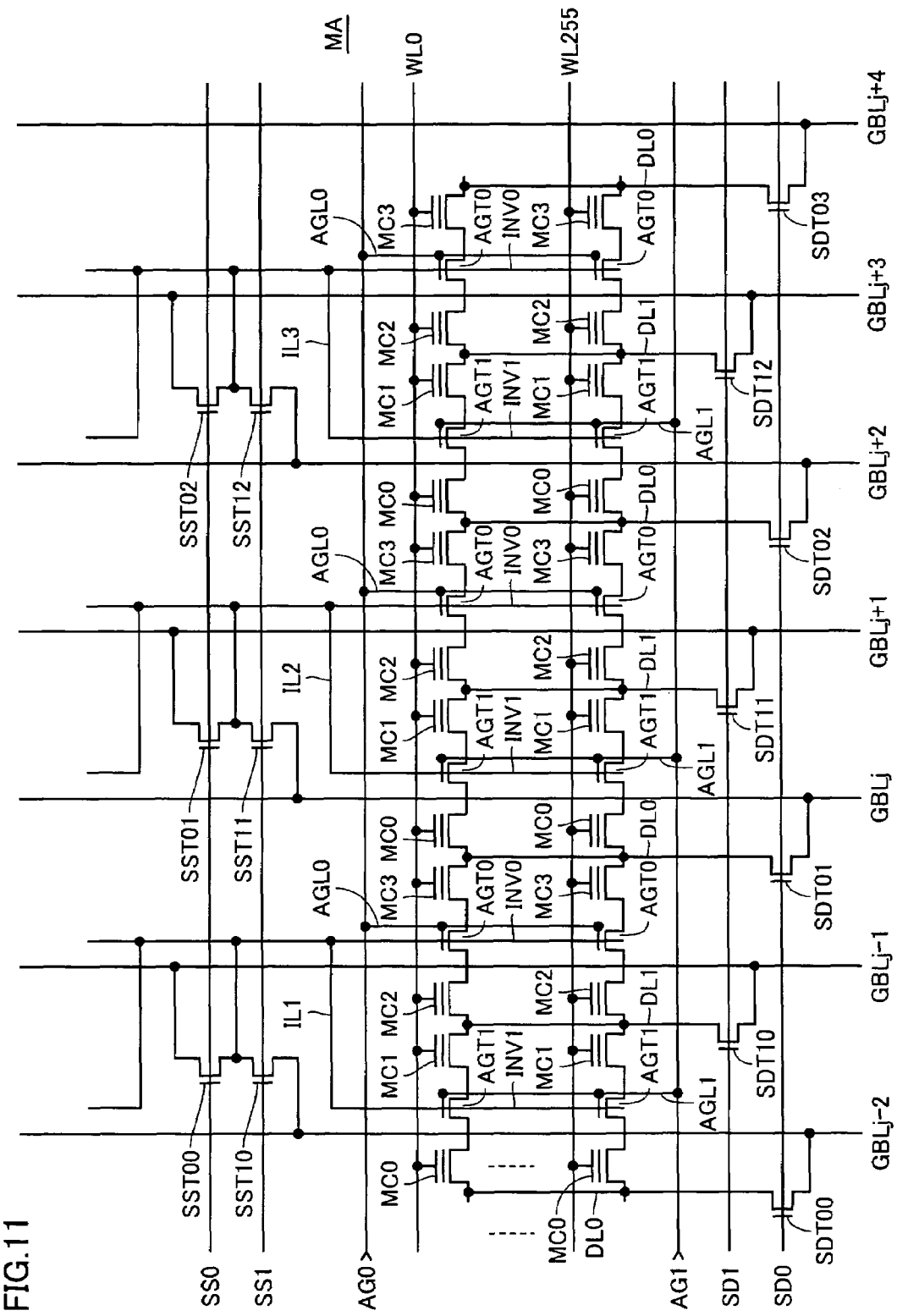
FIG. 11 shows an exemplary configuration of the memory array shown in FIG. 10.

FIG. 11 schematically shows a configuration of memory arrays MA0 to MA(M−1) of FIG. 10. Memory arrays MA0 to MA(M−1) each have the same configuration and, therefore, FIG. 11 shows memory array MA as a representative of these memory arrays MA0 to MA(M−1).

Referring to FIG. 11, memory array MA includes memory cells MC arranged in a matrix of rows and columns. Memory cells MC include four different kinds of memory cells, that is, MC0 to MC3, which are connected in different manners at the time of data writing. At the time of data writing, data are written in parallel to memory cells of the same kind.

Between memory cells MC0 and MC1, assist gate AGT1 is arranged, and between memory cells MC2 and MC3, assist gate GT0 is arranged. Memory cell MC0, assist gate AGT1, memory cells MC1 and MC2, assist gate AGT0 and memory cell MC3 form one unit, and the units are arranged repeatedly along the row direction (direction in which the word line extends). In each column, memory cells MCi (i=0-3) of the same kind are arranged.

Word line WL is arranged corresponding to each row of memory cells, and control gates of memory cells MC0 to MC3 are commonly connected to the corresponding word line WL (control gate of each memory cell form a part of the word line WL). FIG. 11 shows an example in which 256 word lines WL0 to WL255 are arranged as the word lines WL. Assist gates AGT1 arranged aligned in the column direction share assist gate line AGL1, and when selected, form inversion layers INV1, at the surface of semiconductor substrate regions therebelow, continuously extending in the column direction. Assist gates AGT0 share assist gate line AGL0 and, when selected, form inversion layers INV0 therebelow, continuously extending in the column direction. Therefore, although assist gates are shown as arranged independently and separately in each column in FIG. 11, assist gates AGT0 and AGT1 shown to be arranged aligned in the column direction are each implemented by one MOS transistor formed by the inversion layer forming region extending continuously in the column direction and assist gate line AGL and having its channel width set in the column direction.

These inversion layers INV0 and INV1 form a pair and are coupled to source lines IS (IL1, IS2 and IL3). A diffusion layer DL1 is provided commonly to one conduction node of each of memory cells MC1 and MC2, which diffusion layer DL1 extends continuously along the column direction to form the diffusion line. Similarly, a diffusion layer DL0 is commonly coupled to one conduction node of each of memory cells, and the diffusion layer DL0 extends continuously along the column direction to form the diffusion line.

On memory array MA, global bit lines GBL are provided extending along the column direction. As an example, FIG. 11 shows a state in which global bit lines GBLj−2 to GBLj+4 are arranged. Global bit lines GBLj−2 to GBLj+4 are commonly provided for memory arrays MA0 to MA(N−1) shown in FIG. 10. Global bit line GBL is selectively used as a source side bit line or a drain side bit line, in accordance with the position (kind) of the selected memory cell.

In the memory array MA, there are further provided selection transistors SDT00, SDT01, SDT02 and SDT03 coupling a diffusion layer DL0 to global bit lines GBLj−2 GBLj, GBLj+2 and GBLj+4, respectively, in accordance with the diffusion line selecting signal (drain selecting signal) SD0, and selection transistors SDT10, SDT11 and SDT12 coupling a diffusion layer DL1 to global bit lines GBLj−1, GBLj+1 and GBLj+3 arranged in the corresponding columns, respectively, in accordance with the diffusion line selecting signal SDT1.

Further, in order to selectively set assist gates AGT0 and AGT1 to the selected state (to form the inversion layer), an assist gate selecting signal AG0 is applied to the assist gate line AGL0, that is, to the corresponding assist gate AGT0. In order to selectively set assist gate AGT1, an assist gate selecting signal AG1 is applied to the assist gate line AGL1, that is, to assist gate AGT1.

Further, in order to connect the inversion layer of the assist gate to the global bit line for data reading, selection transistors SST00, SST01 and SST02 coupling source lines IL1, IL2 and IL3 to global bit lines GBLj−1, GBLj+1 and GBLj+3, respectively, in accordance with selecting signal SS0 are provided and, similarly, selection transistors SST10, SST11 and SST12 coupling source lines IL1, IL2 and IL3 to global bit lines GBLj−2, GBLj and GBLj+2, respectively, in accordance with selecting signal SS1 are provided.

In memory array MA shown in FIG. 11, in the writing operation (including write-verify) and the reading operation, current paths are set in memory cells MC0, MC1, MC2 and MC3, respectively, and data is written/read. Specifically, when one row address is designated, one word line (for example, word line WL0) is driven to the selected state. Among the four kinds of memory cells MC0 to MC3 connected to the selected word line WL0, a selected memory cell is specified in accordance with the row address, and dependent on the kind of the selected memory cell, the manner of connection path between the selected memory cell and the global bit line is determined. At the time of data writing, of the pair of global bit lines arranged for the selected memory cell, one is used as the drain bit line, and the other is used as the source bit line. Here, dependent on the position of selection of the memory cell, which of the pair of global bit lines is to be used as the source bit line and the other as the drain bit line is determined. In accordance with the determined function of the global bit line, the path for transmitting applied voltages at the time of data writing is determined.

In erasing operation, all memory cells MC0 to MC3 connected to one word line are erased at one time (collective erasure). In the selected memory cells, between each substrate region (well region WELL) and the floating gate, electrons are discharged by tunneling current. Only the selected word line is set to a voltage level that allows discharge of electrons (negative voltage VNN), and erasing operation is performed.

Figure 12:
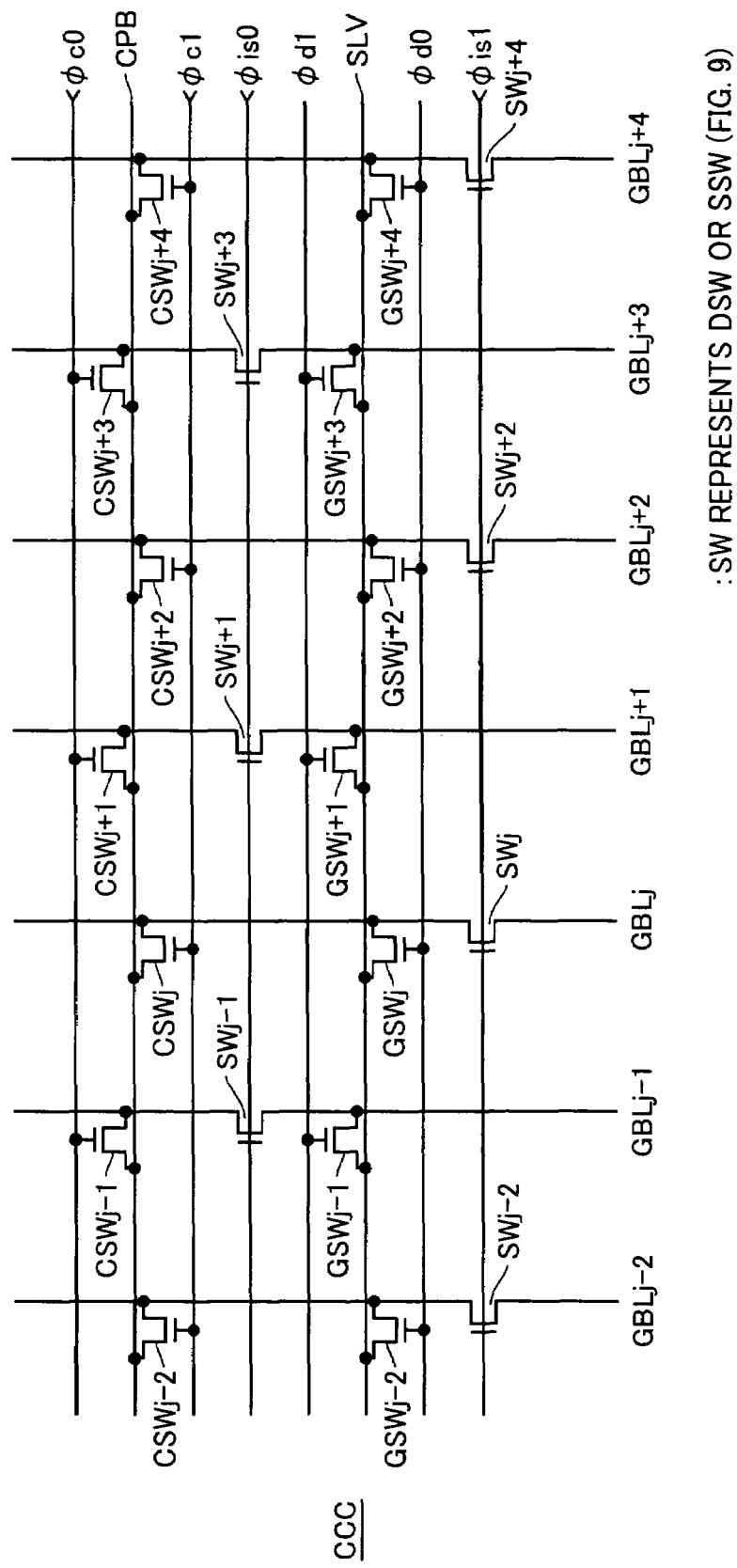
FIG. 12 schematically shows a configuration of a charge capacitance control circuit shown in FIG. 10.

FIG. 12 shows an exemplary configuration of charge capacitance control circuits CCC0 to CCC(M−1) shown in FIG. 10. These charge capacitance control circuits CCC0 to CCC(M−1) have the same configuration and, therefore, in FIG. 12, charge capacitance control circuit CCC generally represents these charge capacitance control circuits CCC0 to CCC(M−1).

Referring to FIG. 12, charge capacitance control circuit CCC includes: switching elements CSWj−2 to CSWj+4 for power supply, provided corresponding to the global bit lines GBLj−2 to GBLj+4 and when conducted, transmitting a voltage on the write voltage supplying node CPB to the corresponding global bit line; switching elements GSWj−2 to GSWj+4 for adjusting source side capacitance, provided corresponding to the global bit lines GBLj−2 to GBLj+4 and when conducted, transmitting a voltage on the source voltage transmission line SLV to the corresponding global bit line; and switching elements SWj−2 to SWj+4 provided corresponding to the global bit lines GBLj−2 to GBLj+4 and selectively separating the corresponding global bit lines.

Switching elements CSWj−2 to CSWj+4 correspond to switching elements CSW0 to CSWn−1 for charging, shown in FIG. 9. To switching elements CSWj−2, CSWj, CSWj+2 and CSWj+4, a conduction control signal $\phi c1$ is applied, and to switching elements CSWj−1, CSWj+1 and CSWJ+3, a conduction control signal $\phi c0$ is applied.

Though not shown in FIG. 9, switching elements GSWj−2 to GSWj+4 are switching elements for discharging the source side capacitance elements Cs0 to Csm−1 to the ground voltage level, respectively. To the gates of switching elements GSWj−2, GSWj, GSWj+2 and GSWJ+4, a conduction control signal $\phi d0$ is applied, and to the gates of switching elements GSWj−1, GSWj+1 and GSWj+3, a conduction control signal $\phi d1$ is applied.

Among global bit lines GBLj−2 to GBLj+4, two global bit lines are used as a pair for each of the selected memory cells, and of the pair of bit lines, one is used as the drain bit line and the other is used as the source bit line. Here, the roles of source bit line and drain bit line are exchanged dependent on the kind of a selected memory cell. Therefore, for global bit lines GBLj−2 to GBLj+4, switching elements CSWj−2 to CSWj+4 for charging and switching elements GSWj−2 to GSWj+4 for discharging (initialization) are arranged respectively, so that each global bit line can function as either of the source bit line and the global bit line.

To switching elements SWj−2, SWj, SWj+2 and SWj+4 for connection, an isolation control signal $\phi is1$ is applied, and to switching elements SWj−1, SWj+1 and SWj+3, an isolation control signal $\phi is0$ is applied. Switching elements Wj−1, SWj+1 and SWj+3 are respectively arranged between switching elements CSWj−1, CSWj+1, CSWj+3 and switching elements GSWj−1, GSWj+1 and GSWj+3, while switching elements SWj−2, SWj, SWj+2 and SWj+4 are arranged at the boundary area of the memory array (not shown in FIG. 12). The global bit line is divided and the parasitic capacitance of the divided global bit line (line capacitance) is used as a capacitance for accumulating the drain write voltage. Here, the divided global bit line that is isolated and not used is not set to the floating state but fixed at a prescribed voltage level (in order to suppress influence of noise).

As the switching elements SWj−1, SWj+1 and SWj+3 are arranged between switching elements CSWj−1, CSWj+1 and CSWj+3 for charging and switching elements GSWj−1, GSWj+1 and GSWj+3 for discharging, each divided global bit line can be charged and discharged no matter whether it functions as a source bit line or global bit line, and hence, it can be used as the source side capacitance and drain side capacitance.

Figure 13:
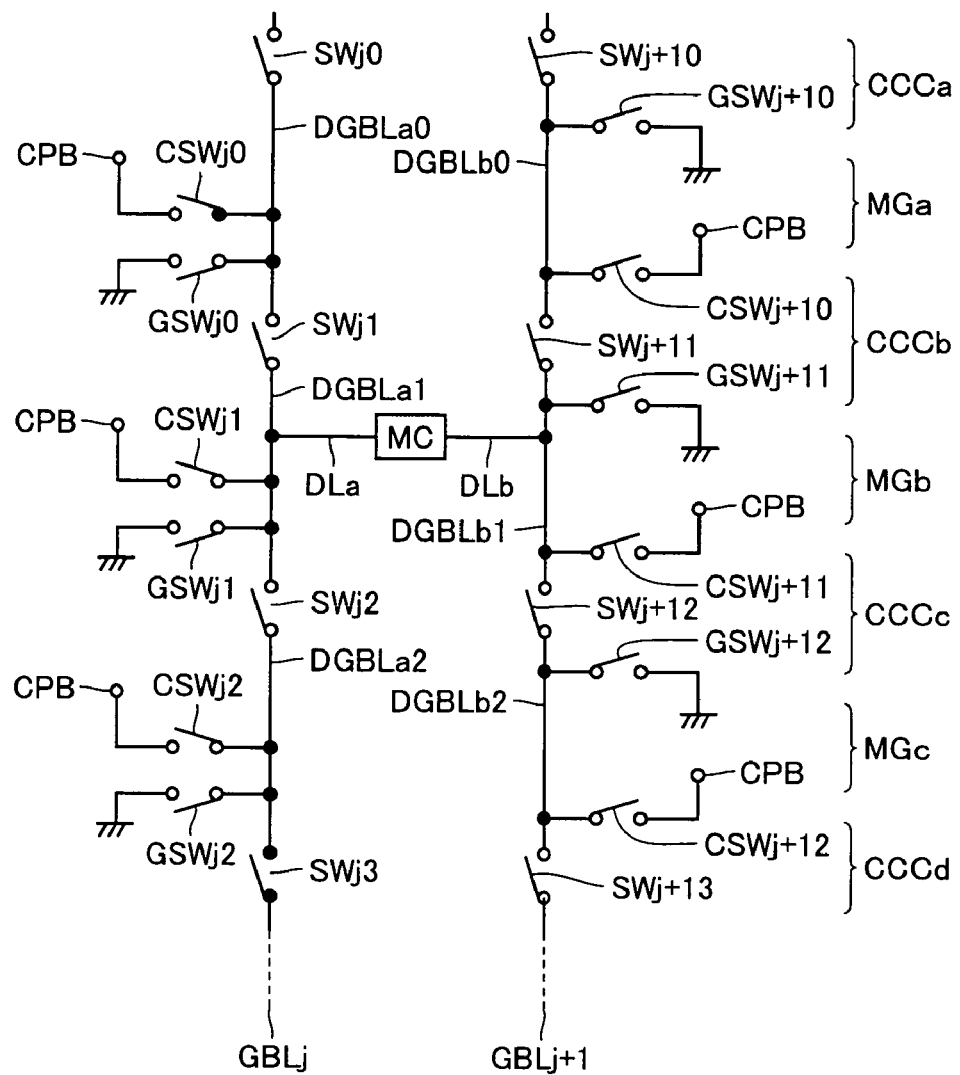
FIG. 13 schematically shows connection to divided global bit lines when the charge capacitance control circuit of FIG. 12 is used.

FIG. 13 shows an exemplary state of connection of the switching elements when the global bit lines are in a divided state. Referring to FIG. 13, global bit lines GBLj and GBLj+1 are divided into a plurality of divided global bit lines. Specifically, in FIG. 13, global bit line GBLa is divided into divided global bit lines DGBLa0, DGBLa1 and DGBLa2, and global bit line GBLb is divided into divided global bit line DGBLb0, DGBLb1 and DGBLb2, corresponding to memory array groups MGa, MGb and MGc.

A charge capacitance control circuit CCCa is arranged at a position on an upper side of memory array group MGa, and charge capacitance control circuits CCCb and CCCc are arranged in the area between memory array groups MGa and MGb and in the area between memory array groups MGb and MGc, respectively. A charge capacitance control circuit CCCd is arranged at a position on a lower side of memory array group MGc.

Charge capacitance control circuit CCCa includes a switching element SWj0 provided corresponding to divided global bit line DGBLa0, a switching element SWj+10 provided corresponding to divided global bit line DGBLb0, and a switching element GSWj+10 for source line discharge, provided corresponding to divided global bit line DGBLb0.

Charge capacitance control circuit CCCb includes a switching element CSWj0 for charging and a switching element GSWj0 for discharging arranged at an end portion of divided global bit line DGBLa0, a switching element CSWj+10 for charging provided corresponding to divided global bit line DGBLb0, switching elements SWj1 and SWj+11 provided corresponding to divided global bit lines DGBLa0 and DGBLb0, and switching element GSWj+11 for discharging.

Charge capacitance control circuit CCCc includes a switching element CSWj1 for charging provided corresponding to divided global bit line DGBLa1, a switching element GSWj1 for discharging provided corresponding to divided global bit line DGBLa1, a switching element SWj2 for separation provided corresponding to divided global bit line DGBLj1, a switching element CSWj+11 for charging provided corresponding to divided global bit line DGBLb1, a switching element SWj+12 for separation provided corresponding to divided global bit line DGBLb1, and a switching element GSWj+12 for discharging provided corresponding to divided global bit line DGBLb2.

Charge capacitance control circuit CCCd includes a switching element CSWj2 for charging provided corresponding to divided global bit line DGBLa2, a switching element GSWj2 for discharging provided corresponding to divided global bit line DGBLa2, a switching element CSWj+12 for charging provided corresponding to divided global bit line DGBLb2, a switching element SWj+13 for separation provided corresponding to divided global bit line DGBLb2, and a switching element for discharging, provided corresponding to a divided bit line, not shown, on the lower side.

In the arrangement shown in FIG. 13, it is assumed that writing is done to a memory cell MC arranged corresponding to the divided global bit lines DGBLa1 and DGBLb1. Here, one of the divided global bit lines DGBLa1 and DGBLb1 is used as the drain bit line and the other is used as the source bit line. The memory cell MC is electrically coupled to divided global bit lines DGBLa1 and DGBLb1, through diffusion lines DLa and DLb, respectively.

At the time of data writing, when global bit line GBLj is used as the drain bit line and global bit line GBLj+1 is used as the source bit line, divided global bit line DGBLa1 is charged to the write voltage level, and divided global bit line DGBLb1 is charged to the voltage level of a write permitting voltage (ground voltage) from the sense/latch circuit or a write inhibiting voltage Vihb. Here, switching element GSWj+11 for discharging is off, and it is used for setting the ground voltage level when the global bit line GBLj+1 is initialized after completion of the writing operation.

Therefore, switching elements CSW and GSW for charging and discharging the global bit line used as the source bit line are both set to the non-conductive state, so that the voltage level of the source bit line is maintained at a voltage level transmitted from the sense amplifier.

The non-used global bit line is fixed, for example, at the ground voltage level at the time of injection. In this example, in each of the charge capacitance control circuits CCCa to CCCd, when the switching element SW(SWj (SWjo-SWj3), Swj+1 (Swj+10-SWj13)) for separation is set to the separating state, for global bit line GBLj, switching transistor GSWj for discharging arranged above switching element SWj for separation is set to the conductive state, and for global bit line GBLj+1, switching element CSWj+1 for charging arranged above switching element SWj+1 for separation is set to the non-conductive state. In the charge capacitance control circuit provided for the non-used divided global bit line of global bit line GBLj+1, switching elements GSWj+10 and GSWj+12 for discharging are turned on.

Consequently, when the divided global bit line DGBLb1 is used, it is possible to maintain the state where it is set to the voltage level transmitted from sense/latch circuit, by setting off the switching elements GSWj+11 and CSWj11. Further, non-used divided global bit line DGBLb0 can be maintained at the ground voltage level, by setting on the switching element GSWj+10 for discharging, by charge capacitance control circuit CCCa.

Here, switching transistor GSWj+12 for discharging is also set off, for non-used global bit line DGBLb2. Therefore, dependent on the position of selected memory array group, the direction of extension of the global bit line differs, and the manner of control differs slightly, dependent on the direction in which the length of the global bit line extends.

Specifically, the state of conduction/non-conduction of the switching elements in the charge capacitance control circuit for the used divided global bit line is simply reversed dependent on whether the divided bit line extends upward or downward, whereby the non-used divided global bit line can reliably be fixed at a prescribed voltage, for example, the ground voltage level, and further, the source bit line can be maintained at the level of the voltage transmitted from the sense/latch circuit.

Figure 14:
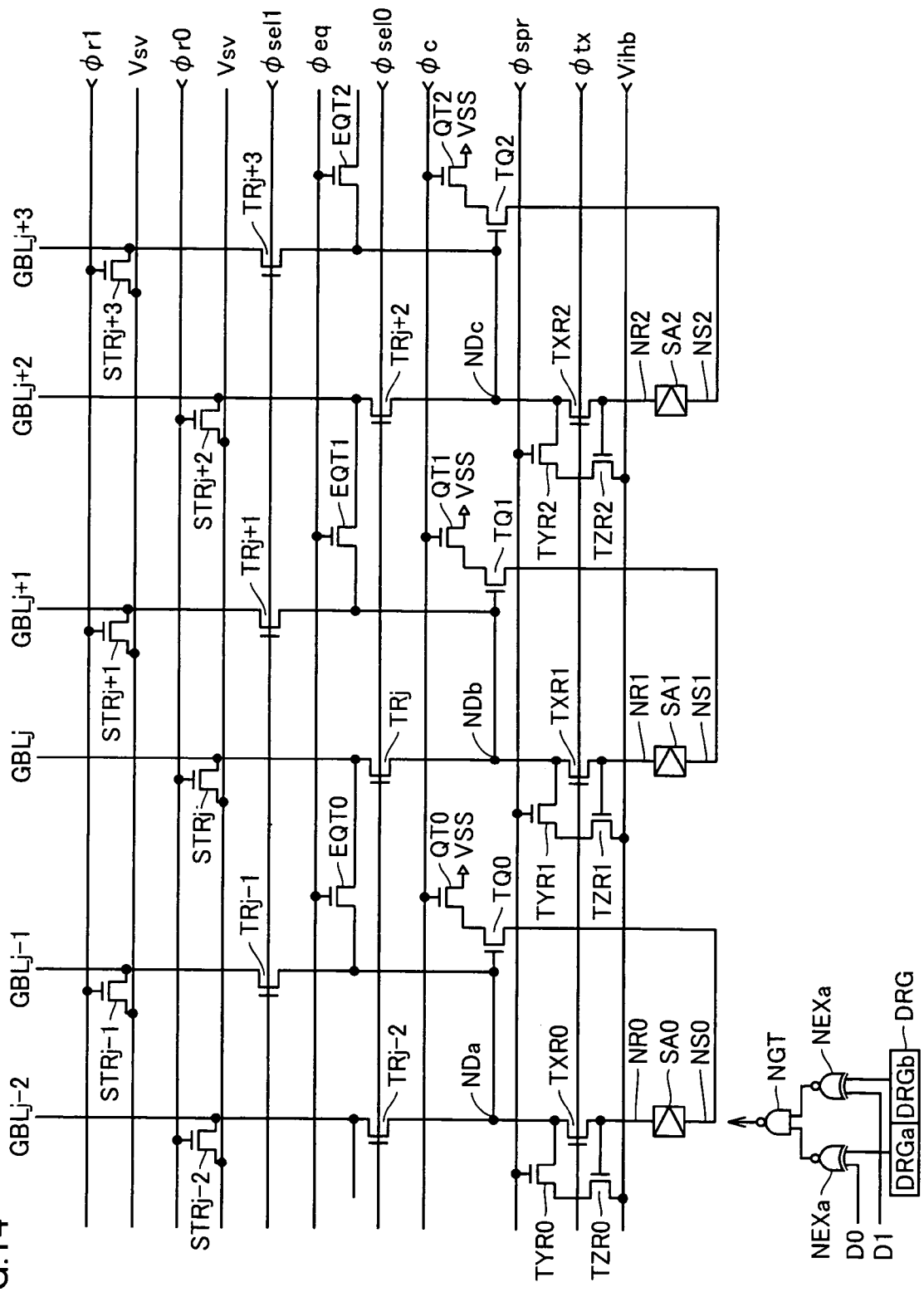
FIG. 14 schematically shows a configuration of a sense/latch circuit of FIG. 10.

FIG. 14 shows an exemplary configuration of sense/latch circuit 8 shown in FIG. 10. Referring to FIG. 14, sense/latch circuit 8 includes sense amplifiers respectively provided corresponding to the global bit lines. In FIG. 14, sense amplifiers include a sense amplifier SA0 provided for the pair of global bit lines GBLj−2 and GBLj−1, a sense amplifier SA1 provided for the pair of global bit lines GBLj and GBLj+1, and a sense amplifier SA2 provided for the pair of global bit lines GBLj+2 and GBLj+3.

By way of example, these sense amplifiers have the configuration of cross-coupled sense amplifiers, and are implemented by CMOS inverter latches. Therefore, each of the sense amplifiers SA0 to SA2 latch complementary data at reference node NR (NR0-NR2) and sense node NS (NS0-NS2).

Sense/latch circuit 8 further includes: transfer gates TXR0, TXR1 and TXR2 transferring signals at reference nodes NR of sense amplifiers SA0 to SA2 in accordance with a transfer designating signal φtx; transfer gates TZR0 to TZR2 provided corresponding to sense amplifiers SA0 to SA2, respectively, for transferring write inhibiting control voltage Vihb in accordance with the potential of the reference node of corresponding sense amplifier; transfer gates TYR0 to TYR2 further transmitting signals that have been transmitted from transfer gates TZR0 to TZR2, respectively, to nodes ND0 to ND3 in accordance with a global bit line precharge signal φspr; transfer gates QT0 to QT2 provided corresponding to sense amplifiers SA0 to SA2, respectively, for transferring the ground voltage VSS in accordance with a control signal φc; and transfer gates TQ0 to TQ2 further transmitting the ground voltage that has been transmitted by transfer gates QT0 to QT2 to corresponding sense nodes NS0 to NS2, in accordance with the voltage at nodes NDa to NDc.

Sense/latch circuit 8 further includes: transfer gates TRj−2, TRj and TRj+2 coupling nodes NDa to NDc to global bit lines GBLj−2, GBLj and GBLj+2, respectively, in accordance with a selecting signal φsel0; transfer gates TRj−1, TRj+1 and TRj+3 coupling nodes NDa to NDc to global bit lines GBLj−1, GBLj+1 and GBLj+3, respectively, in accordance with a transfer selecting signal φsel1; an equalize transistor EQT0 equalizing global bit lines GBLj−1 and GBLj in accordance with an equalize instructing signal φeq; an equalize transistor EQT1 equalizing global bit lines GBLj+1 and GBLj+2 in accordance with the equalize instructing signal φeq; and an equalize transistor EQT2 equalizing global bit lines GBLj+3 and GBLj+4, not shown, in accordance with the equalize instructing signal φeq.

By equalizing the potentials of global bit lines provided for adjacent sense amplifiers, each global bit line comes to have the same initial voltage level, and therefore, the rate of voltage change during operation is made equal to each other.

Sense/latch circuit 8 further includes: transfer gates STRj−2, STRj and STRj+2 provided corresponding to global bit lines GBLj−2, GBLj and GBLj+2, and transmitting a voltage Vsv to the source bit line in accordance with a read source line voltage setting signal φr0; and transfer gates STRj−1, STRj+1 and STRj+3 transferring source line voltage Vsv in accordance with a read source line voltage setting signal φr1. These transfer gates STRj−2 to STRj+3 set the source bit lines to the source line voltage Vsv of a prescribed voltage level (ground voltage level) at the time of data reading (including verifying operation at the time of writing).

FIG. 14 further shows a data register circuit included in the data register. The data register circuit includes register circuits DRGa and DRGb each storing data, an EXNOR gate NEXa receiving a write data designating signal D0 and data stored in data register circuit DRGa, an EXNOR gate NEXb receiving a write data designating signal D1 and data stored in data register circuit DRGb, and an NAND gate NGT receiving output signals of these EXNOR gates NEXa and NEXb. An output signal of NAND gate NGT is transmitted to a reference node NR of the corresponding sense amplifier.

Write data designating signals D0 and D1 indicate one of four values, representing data value to be written in the write cycle.

In the data register circuit, when the stored data matches the write designating signals D0 and D1 at the time of data writing, the output signals from EXNOR gates NEXa and NEXb both attain to the H level, and in response, the output signal of NAND gate NGT attains to the L ("0") level. When write data designating signals D0 and D1 do not match the stored data at the time of data writing, the output signal of either one of the EXNOR gates NEXa and NEXb attains to the L level and, in response, the output signal of NAND gate NGT attains to the H level. When the voltage level of reference node NR is at the L level, the ground voltage is transferred so that data writing is executed, and when it is at the H level, the write inhibiting voltage Vihb is transmitted to inhibit data writing.

Here, writing to two memory cells is executed through one global bit line, and therefore, in order to select the memory cell, a transfer circuit transferring data in accordance with a column-related address signal is provided between the sense amplifier (or EXNOR gates NEXa and NEXb) and the data register circuit. In FIG. 14, however, the selective transfer gate for transferring data from the data register to the sense amplifier is not shown.

To sense amplifiers SA0 to SA2, stored data from data register 7 shown in FIG. 10 are transferred in parallel. At the time of data transfer during a write cycle, to a sense amplifier corresponding to a memory cell to which data is written, data "0" (L level signal) designating writing is transferred, and to a sense amplifier corresponding to a memory cell to which data is not written, data "1" (H level signal) is transferred.

Next, an operation of the sense/latch circuit shown in FIG. 14 will be described. It is assumed that at the time of data writing, global bit lines GBLj−2, GBLj and GBLj+2 are used as drain bit lines, and global bit lines GBLj−1, GBLj+1 and GBLj+3 are used as the source bit lines. Data writing is executed to one memory cell MCi among memory cells MC0 to MC3, as shown in FIG. 11.

Figure 15:
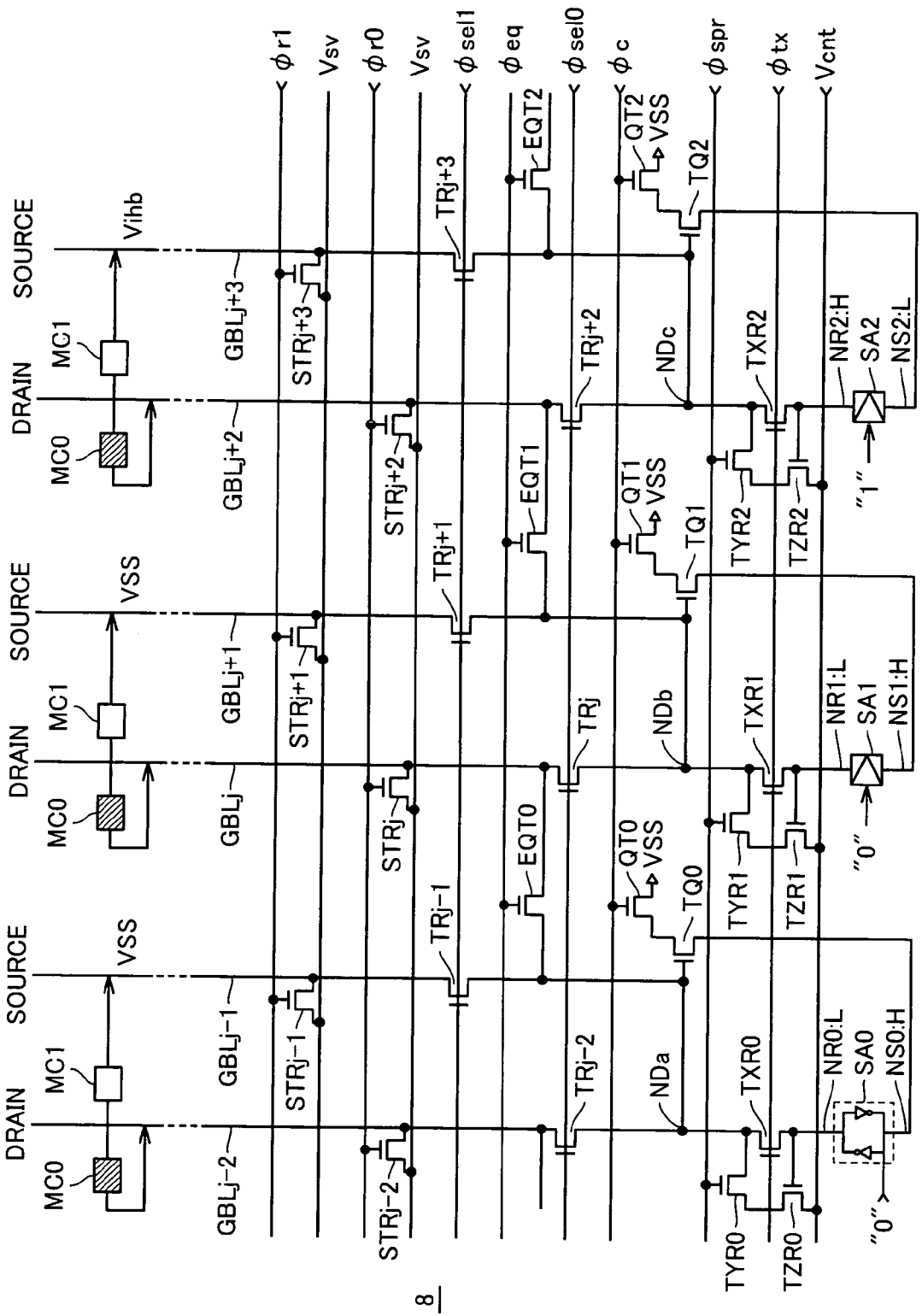
FIG. 15 schematically shows operational voltages in data writing and connection to memory cells, of the sense/latch circuit shown in FIG. 14.

Now, it is assumed that data is written to memory cell MC0 shown in FIG. 4. As shown in FIG. 15, memory cells MC have respective drain nodes coupled to corresponding global bit lines GBLj−2, GBLj and GBLj+2, respectively, and respective source nodes coupled to global bit lines GBLj−1, GBLj+1 and GBLj+3, through assist gates, not shown, and memory cells MC1 (by selecting signals SD1 and SD2 and assist gate selecting signals AG0 and AG1, the memory cell of the writing target is selected). Selecting signals SD0 and SD1 are set to a high voltage of 6V, for example, at the time of data writing, enabling transfer of a write high voltage from the corresponding (divided) global bit line to the corresponding drain diffusion line.

It is assumed that data is written to memory cells MC0 connected to global bit lines GBLj−2 and GBLj and not to memory cell MC0 coupled to global bit line GBLj+2 (as the logic value of write data is different). In this case, data "0" is transferred to corresponding sense amplifiers SA0 and SA1, and data "1" is transferred to sense amplifier SA2. As shown in FIG. 15, sense amplifier SA is formed by an inverter latch, and to reference node NR, a signal from the corresponding data register is transferred. Therefore, in sense amplifiers SA0 and SA1, reference nodes NR0 and NR1 are each set to the L level and sense nodes NS0 and NS1 are each set to the H level. In sense amplifier SA2, reference node NR2 is set to the H level and sense node NS2 is set to the L level.

In this state, in order to generate the write inhibiting voltage Vihb, control voltage Vcnt is set, for example, to the voltage level of 2V, and global bit line precharge signal φspr is set to the voltage level of 0.5V+Vthn. Here, Vthn represents the threshold voltage of transfer gates TYR0 to TYR2.

In this state, reference nodes NR0 and NR1 of sense amplifiers SA0 and SA1 are at the L level, and transfer gates TZR0 and TZR1 are off, and even when transfer gates TYR0 and TYR1 are turned on, voltage levels at nodes NDa to NDc do not change. In sense amplifier SA2, reference node NR2 is at the H level, transfer gate TZR2 is rendered conductive, and the write inhibiting voltage Vihb is transferred through transfer gate TZR2 to transfer gate TYR2. The global bit line precharge signal φspr has a voltage level of 0.5V+Vthn, and therefore, the voltage level of node ND2 is about 0.5V. As a result, the parasitic capacitance of the global bit line is charged, and inversion of latched data of the sense amplifier is prevented (in order to prevent inversion of latched data in sense amplifiers SA0 to SA2 caused when the global bit line capacitance is connected).

After completion of global bit line precharge, voltage level of transfer control signal φtx is increased to 2V+Vthn, to drive transfer gates TXR0 to TXR2 to the conductive state. Consequently, reference nodes NR0 to NR2 of sense amplifiers SA0 to SA2 are respectively coupled to nodes NDa to NDc. Nodes NDa and NDb are reliably driven to the ground voltage level (Vss=0V), in accordance with the voltage levels of reference nodes NR0 and NR1 of sense amplifiers SA0 and SA1 (driven to the ground voltage level by the N channel MOS transistor connected to the low-side power supply node of CMOS inverter of the sense amplifier).

At this time, the control signal φc attains to the H level, and select gates QT0 to QT2 are turned ON. Here again, select gates TQ0 and TQ1 are non-conductive, and latched data of sense amplifiers SA0 and SA1 are not changed. In sense amplifier SA2, when transfer gate TXR2 turns on, by a P channel MOS transistor (P channel MOS transistor coupled to the high-side power supply node of CMOS inverter) included in sense amplifier SA2, the voltage level of node ND2 is set to the level of write inhibiting voltage Vihb of, for example, 2V, in accordance with the power supply voltage of the sense amplifier. When the voltage level of node NDc is driven to the write inhibiting voltage level, sense node NS2 of sense amplifier SA2 is reliably maintained at the L level, by transfer gates QT2 and TQ2.

As the global bit lines GBLj−1, GBLj+1 and GBLj+3 are used as the source bit lines, it is possible to transmit the ground voltage or the write inhibiting voltage Vihb through the global bit line to the diffusion layer connected to memory cell MC1, by setting the selecting signal SD1 shown in FIG. 11 to a voltage level of, for example, 6V and setting selection transistors SDT10, SDT11 and SDT12 shown in FIG. 11 to the conductive state. Specifically for transferring the source voltage, selecting signal φsel1 is set to the H level (voltage level not lower than 2V+Vth), transfer gates TRj−1, TRj+1 and TRj+3 are set to the conductive state, and nodes NDa to NDc are respectively coupled to global bit lines GBLj−1, GBLj+1 and GBLj+3. Consequently, it becomes possible to permit/inhibit writing to the object memory cell in accordance with the latched data of sense amplifiers SA0 to SA2. Global bit lines GBLj−1, GBLj and GBLj+2 serving as the drain bit lines are charged using the charge capacitance control circuit, and write charges are supplied thereto.

At the time of data reading from memory cell MC0, when the sense/latch circuit is used as a data register, the following reading operation is executed. Specifically, transfer gates STRj−1, STRj+1 and STRj+3 are rendered conductive, and global bit lines GBLj−1, GBLj+1 and GBLj+3 are maintained at the ground voltage level. Global bit lines GBLj−2, GBLj and GBLj+2 serving as the drain bit lines are maintained at a prescribed voltage level, as a read voltage is supplied thereto. At this time, transfer gates TRj−2, TRj and TRj+2 are rendered conductive by selecting signal φsel0, and global bit lines GBLj−2, GBLj and GBLj+2 as the drain bit lines are connected to nodes NDa, NDb and NDc, respectively.

When data is read, the potential of the drain global bit line changes in accordance with the data stored in the corresponding memory cell (dependent on presence/absence of discharge current). Therefore, the voltage levels of nodes NDa to NDc decrease from the prescribed precharge level. By activating the control signal φc, voltage levels of sense nodes NS0 to NS2 of sense amplifiers SA0 to SA2 are determined in accordance with the voltage levels of nodes NDa to NDc. Specifically, when the voltage levels of nodes NDa to NDc are at the H level, transfer gates TQ0 to TQ2 are rendered conductive, and sense nodes NS0 to NS2 are maintained at the ground voltage level. When the nodes NDa to NDc are discharged to the L level (voltage level not higher than the threshold voltage of transfer gates TQ0 to TQ2), sense nodes NS0 to NS2 are at the precharge voltage level. At the time of sensing operation, by precharging the reference nodes NR0 to NR2 to a prescribed voltage level, it becomes possible to accurately amplify and latch the voltage level of the sense nodes, in accordance with the voltage levels of nodes ND0 to ND2. Latched data of sense amplifiers SA0 to SA2 may be used for the verifying operation, or may be used for normal mode data reading, in this data reading.

Naturally, at the time of data writing, the write inhibiting voltage is generated to charge diffusion line of the memory cell, and thereafter, selective division of the global bit line is executed.

Figure 16:
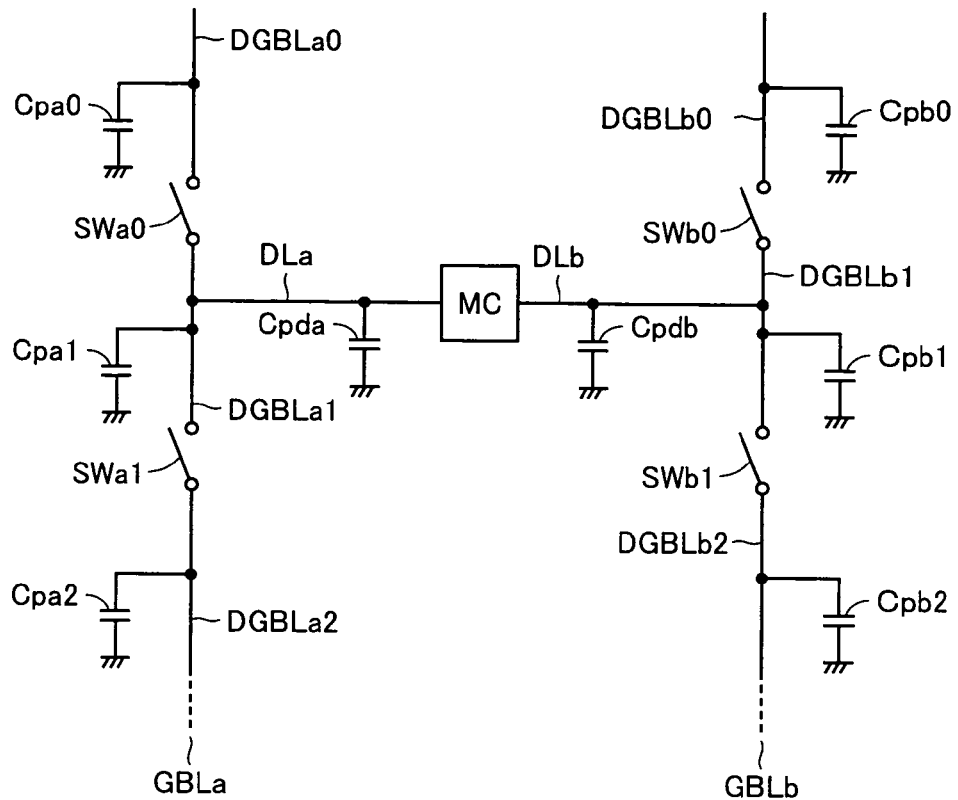
FIG. 16 schematically shows capacitance distribution in data writing in accordance with Embodiment 3 of the present invention.

FIG. 16 schematically shows capacitance distribution for the selected memory cell at the time of data writing, in accordance with Embodiment 3 of the present invention. Global bit line GBLa is divided into divided global bit lines DGBLa0, DGBLa1 and DGBLa2 . . . , and global bit line GBLb is divided into divided global bit lines DGBLb0, DGBLb1 and DGBLb2, . . . . Divided global bit lines DGBLa0 to DGBLa2 have parasitic capacitances (line capacitances) Cpa0, Cpa1 and Cpa2, respectively, and divided global bit lines DGBLb0, DGBLb1 and DGBLb2 have line parasitic capacitances Cbp0, Cbp1 and Cbp2, respectively.

Divided global bit lines DGBLa0 and DGBLa1 are coupled through a switching element SWj0, and between divided global bit lines DGBLa1 and DGBLa2, a switching element SWa1 is provided. Divided global bit lines DGBLb0 and DGBLb1 are coupled through a switching element SWb0, and between divided global bit lines DGBLb1 and DGBLb2, a switching element SWb1 is provided.

Memory cell MC is coupled to divided global bit lines DGBLa1 and DGBLb1 through diffusion lines DLa and DLb. Diffusion lines DLa and DLb have parasitic capacitances (PN junction capacitances with substrate region) Cpda and Cpdb, respectively.

Therefore, by selectively setting switching elements SWa0, SWa1, SWb0 and SWb1 to the conductive state as shown in FIG. 16, capacitance values of drain node and source node of memory cell MC can be adjusted, and the amount of charges accumulated for writing on the drain-side node can be adjusted accordingly. Further, by adjusting the capacitance value on the source-side node, the amount of current flowing through memory cell MC at the time of data writing can be adjusted, and the amount of charges to be injected to the floating gate of the memory cell can be adjusted accordingly.

At the time of writing, when the voltage difference level between the voltage of source-side node capacitance and drain-side node capacitance attains to such level that does not cause hot electron generation (when there is a voltage difference comparable to the difference between the write inhibiting voltage and the high voltage for drain writing) before attaining to the same voltage level, the data writing stops.

Figure 17:
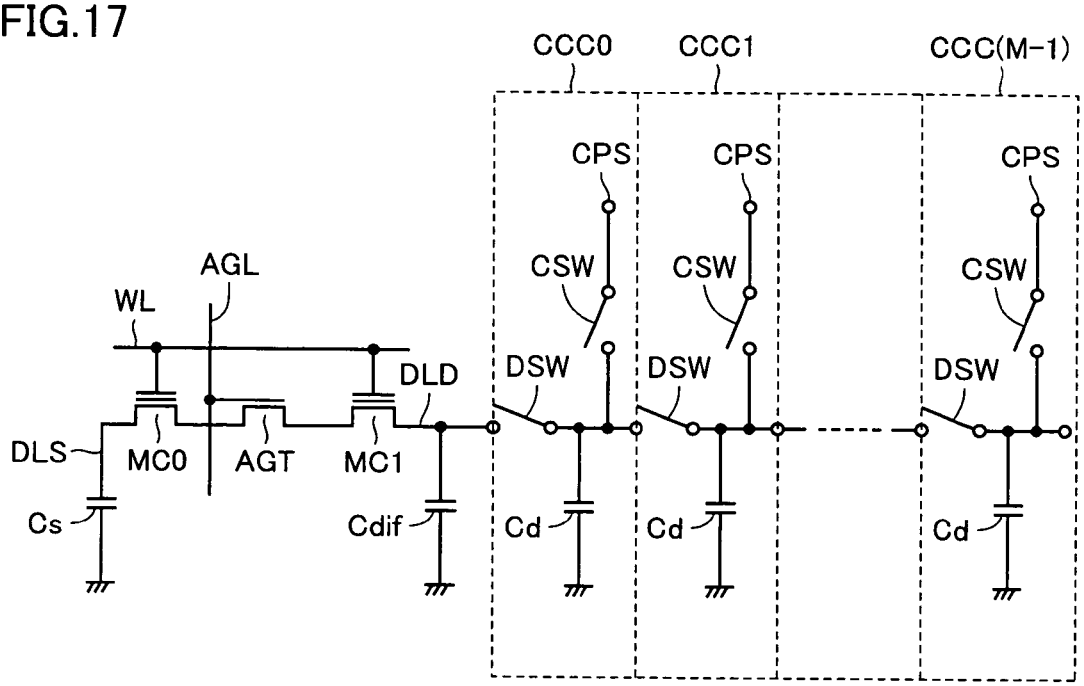
FIG. 17 shows correspondence between the charge capacitance control circuit shown in FIG. 10 and switching elements.

FIG. 17 schematically shows the configuration of write charge accumulating capacitance generating unit and correspondence to the accumulated charge control circuit shown in FIG. 8. Referring to FIG. 17, charge capacitance control circuits CCC0 to CCC(M-1) are connected in series with drain node DLD of memory cell MC1. Each of the charge capacitance control circuits CCC0 to CCC(M-1) includes a switching element CSW for charging connected to write voltage supplying node CPS, a switching element DSW for connecting a capacitance element, and a capacitance element Cd. Capacitance element Cd corresponds to the line capacitance of the divided global bit line.

There is a capacitance Cdif of diffusion line, for the drain node DLD of the memory cell. Further, there is a capacitance Cs of diffusion line, for source node DLS of the memory cell.

Dependent on the position of memory array including memory cells MC0 and MC1, the order of connection of charge capacitance control circuits CCC0 to CCC(M-1) differs.

Figure 18:
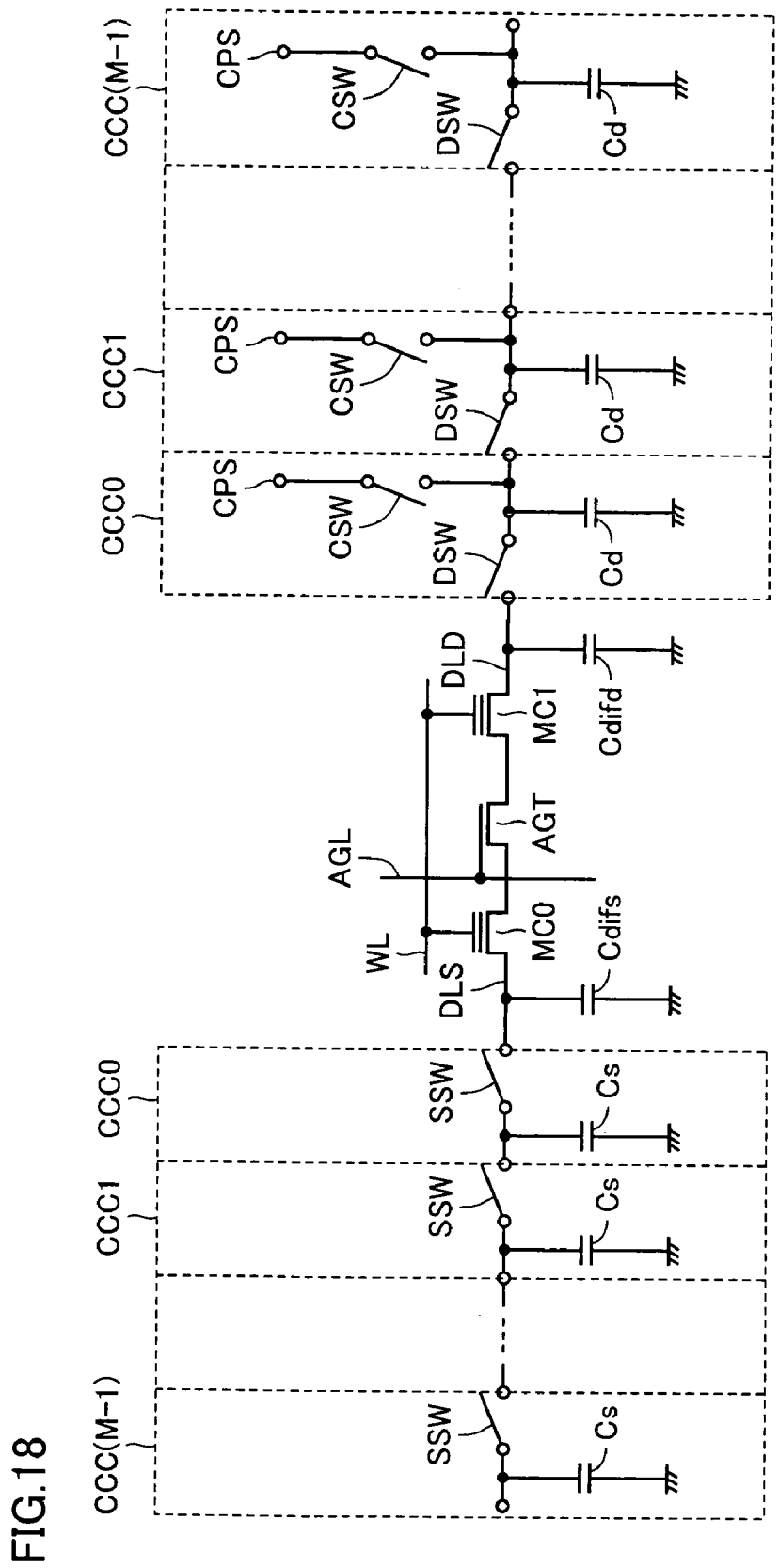
FIG. 18 schematically shows the charge capacitance control circuit shown in FIG. 10 and drain side and source side capacitance elements.

FIG. 18 schematically shows correspondence between the series of switching elements and the charge capacitance control circuits. In the example shown in FIG. 18, capacitance values of both drain node DLD and source node DLS are controlled. Therefore, charge capacitance control circuits CCC0 to CCC(M-1) include a switching element CSW for charging, a capacitance element Cd formed by the divided global bit line, a switching element DSW for connection to the drain node, a switching element SSW for connecting a capacitance on the source side and a capacitance Cs. Capacitances Cd and Cs are each formed by the line capacitance of the divided global bit line. Drain node DLD and source node DLS have parasitic capacitances Cdifd and Cdifs of diffusion lines. In the configuration shown in FIG. 18 also, the order of connection of charge capacitance control circuits CCC0 to CCC(M-1) differ dependent on the position of memory array including the memory cells.

As to the control of connection of capacitance elements, switch control is executed in accordance with the position of the selected memory array and the value of write data, by the control circuit shown in FIG. 10, as will be described later.

As described above, according to Embodiment 3 of the present invention, as the capacitance accumulating charges for writing to the memory cell, the line capacitance of global bit line and the parasitic capacitance of diffusion line are used, and therefore, the area occupied by the memory mat in which memory arrays are arranged can be reduced, as it is unnecessary to separately provide capacitance elements for accumulating charges for writing.

Embodiment 4

There are various methods of data writing, possibly including the following.

[Writing Method 1]

As can be seen from the waveform diagrams of FIGS. 5 and 6, in Embodiment 1 described above, the capacitance of drain diffusion line is charged by the global bit line, and using charges accumulated in the (divided) global bit line capacitance and the drain diffusion capacitance, electric charges for writing are generated.

Figure 19:
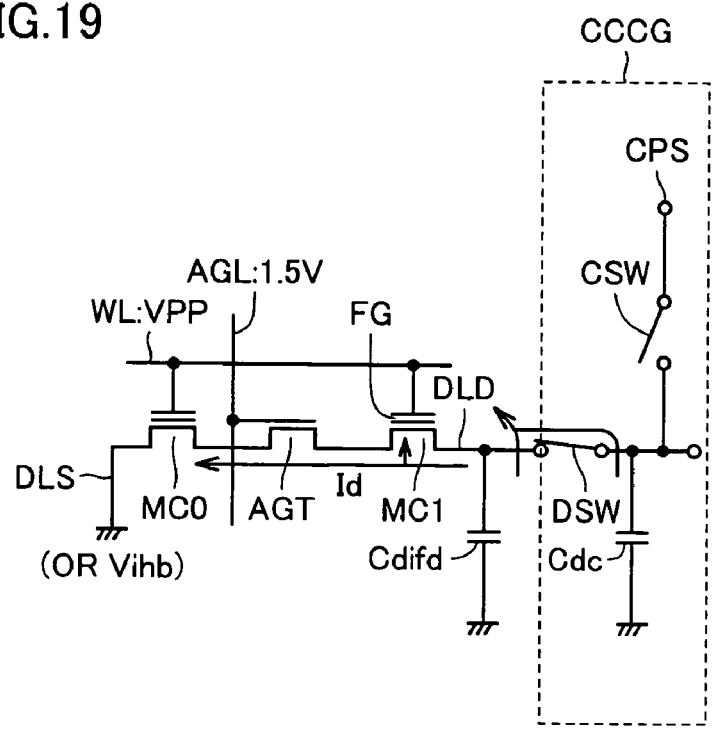
FIG. 19 represents a first method of writing in data writing of a non-volatile semiconductor memory device in accordance with Embodiment 4 of the present invention.

Specifically, as shown in FIG. 19, in a combined charge capacitance control circuit CCCG, switching element CSW is rendered conductive, and drain diffusion line capacitance Cdifd of node DLD and global bit line capacitance Cdc are charged to prescribed voltage levels. Thereafter, switching element CSW is rendered non-conductive, and a voltage, for example, of 1.5V is supplied to assist gate line AGL, so that drain current Id is generated by the charges accumulated in these capacitances Cdifd and Cdc, a high electric field is generated by the inversion layer at the assist gate AGT, and charges are injected to the floating gate FG of memory cell MC1 in accordance with source side injection method.

Here, combined charge capacitance control circuit CCCG represents the entire charge capacitance control circuits for which divided global bit lines are used, among charge capacitance control circuits CCC0 to CCC(M-1) described in Embodiment 3 above. Therefore, global bit line capacitance Cdc corresponds to the combined capacitance of the capacitances of divided global bit lines connected to the drain node DLD of the selected memory cell.

In this method of writing, charges accumulated on the global bit lines are utilized, and hence, this method will be referred to as "global bit line constant charge writing method" here. When writing to memory cell 1 is to be stopped, the write inhibiting voltage Vihb is applied instead of the ground voltage, to source node DLS.

[Writing Method 2]

Figure 20:
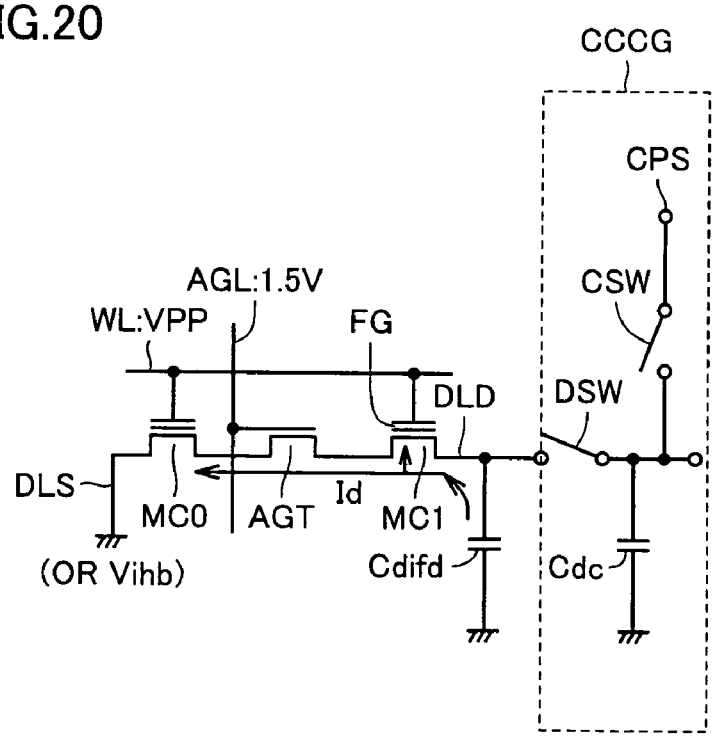
FIG. 20 shows connection of capacitance elements for a second method of writing in accordance with Embodiment 4 of the present invention.

FIG. 20 shows a second method of writing. In the configuration shown in FIG. 20, portions related to the memory cells are of the same configuration as that of FIG. 19, and combined charge capacitance control circuit CCCG is provided for drain node DLD. The operation of charging capacitances Cdc and Cdifd to the write voltage level by switching element CSW in combined charge capacitance control circuit CCCG is the same as in the configuration show in FIG. 11.

Here, switching elements DSW and CSW are both set to the non-conductive state, a high level voltage (for example, 1.5V) is applied to assist gate line AGL, and an inversion layer is formed at the assist gate AGT. Here, by the charges accumulated in capacitance Cdifd of drain diffusion line, drain write current Id is generated, and charges are injected to the floating gate of memory cell MC1.

Figure 21:
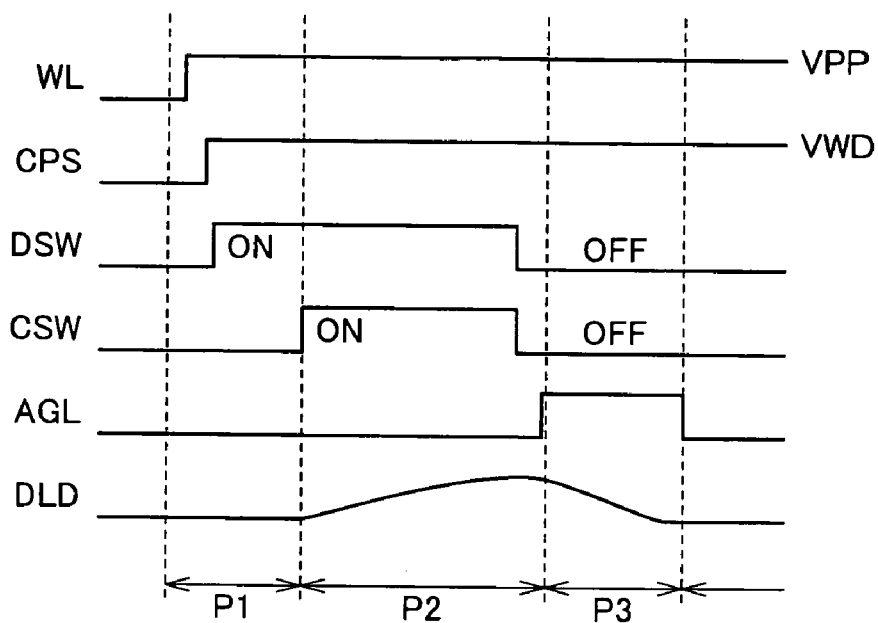
FIG. 21 is a diagram of waveforms in data writing by the configuration shown in FIG. 20.

Specifically, as shown in FIG. 21, in period P1, word line WL is driven to the level of a positive high write voltage VPP, and write voltage supplying node CPS is raised to the voltage level of drain write voltage VWD. At this time, switching element DSW is set on, and capacitances Cdifd and Cdc are coupled. Thereafter, in period P2, switching element CSW is turned off, and the charging operation to capacitance element Cdc is completed. Further, at this time, switching element DSW is turned off, so that capacitance Cdc is separated from drain node DLD.

Thereafter, in period P3, assist gate line AGL is raised to the voltage level of, for example, 1.5V, to form an inversion layer at assist gate AGT. Consequently, by the charges accumulated in diffusion line capacitance Cifd, drain write current Id is generated, and flows to the source node DLS, so that electrons are injected to the floating gate FG of memory cell MC1. In this case also, when in a write inhibited state, the source node DLS is set to the level of write inhibiting voltage Vihb.

The writing method of generating write drain current Id using only the charges accumulated in diffusion line capacitance Cdfd will be referred to as "local bit line constant charge writing method." When this local bit line constant charge writing method is used, the amount of electrons injected to the floating gate in one write cycle (injection) can be made small, and the amount of movement of the threshold voltage can be made small accordingly. Therefore, it becomes possible to write data while the threshold voltage is varied gradually, with high precision. Further, using this local bit line constant charge writing method, electrons can be injected with high precision when data of which threshold voltage state is the second lowest to the initial state is to be written.

[Writing Method 3]

Figure 22:
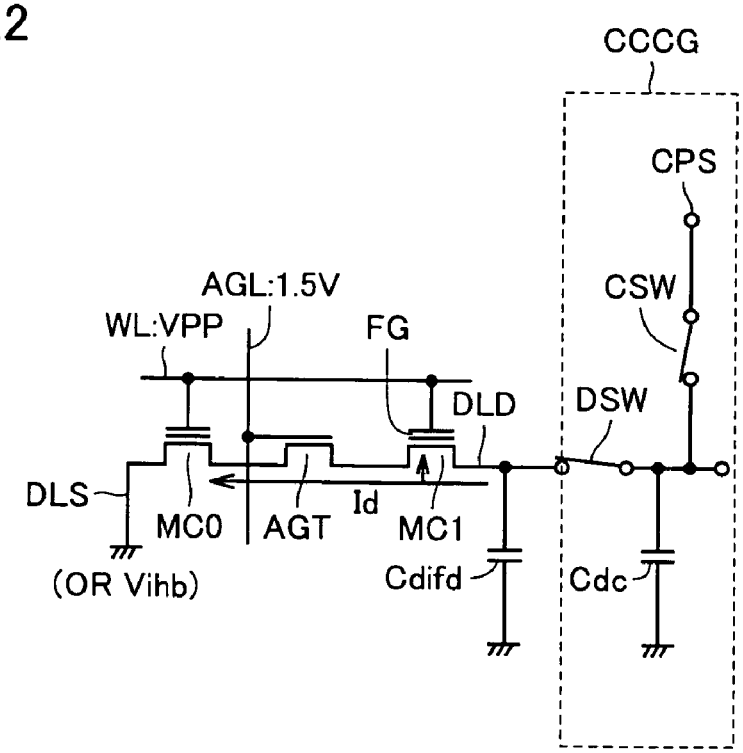
FIG. 22 represents values of switching elements for a third method of writing in accordance with Embodiment 4 of the present invention.
Figure 23:
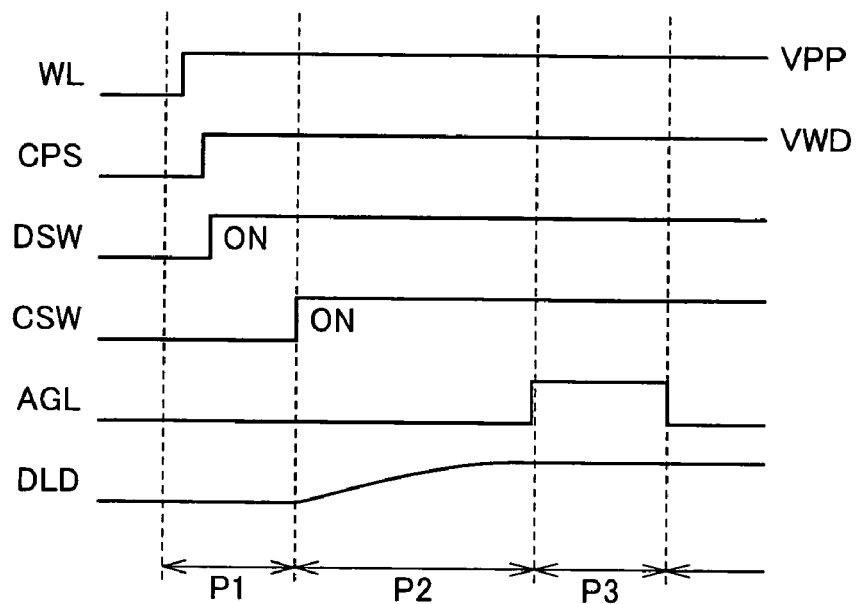
FIG. 23 is a diagram of waveforms in data writing with the configuration shown in FIG. 22.

FIG. 22 shows a manner of connection of switching elements when the third method of writing is executed. In the configuration shown in FIG. 22, switching elements CSW and GSW of combined charge capacitance control circuit CCCG are both set to the conductive state in data writing. As shown in the diagram of signal waveforms of FIG. 23, first, power-up and word line activating period P1 starts. Then, in period P2, through switching elements DSW and CSW, capacitances Cdc and Cdifd are charged from write voltage supplying node CPS. In this state, the voltage level of assist gate line AGL is increased in period P3. Here, the drain current Id for memory cell MC1 is applied from write voltage supplying node CPS, and drain node DLD is maintained at an approximately constant voltage level. The method of writing will be referred to as "DC writing method", as it is source side injection writing using a DC current.

By this DC writing method also, the value of capacitance Cdc can be made smaller, and as compared with an example in which the capacitance of overall global bit line is charged, the time necessary for charging can be made shorter. Therefore, as compared with the configuration using the conventional constant voltage writing method, the period P2 shown in FIG. 23 can be made shorter. Further, the switching element CSW is implemented by a transfer gate formed of an MOS transistor, as the specific circuit configuration shown in Embodiment 3. Therefore, by setting the gate voltage of MOS transistor implementing the switching element CSW to a relatively low voltage level, it is possible to prevent a large rush current from flowing in, with the threshold voltage of memory cell MC1 being relatively low at the initial stage of writing.

In Writing Methods 2 and 3 also, when data writing to memory cell MC1 is to be inhibited, the write inhibiting voltage Vihb is applied to source node DLS.

[Writing Method 4]

Figure 24:
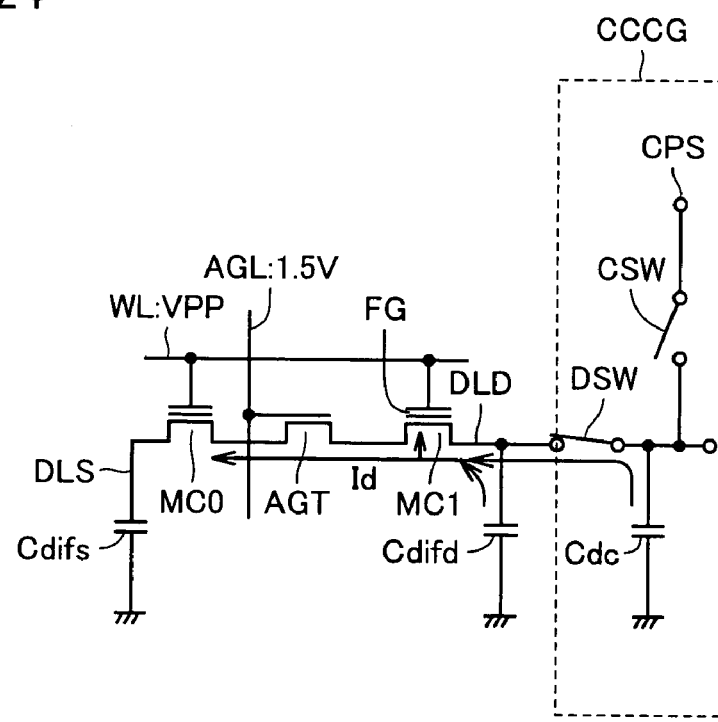
FIG. 24 schematically shows a manner of connection of capacitance elements for a fourth method of writing in accordance with Embodiment 4 of the present invention.

FIG. 24 shows a manner of connection of switching elements at the time of data writing in accordance with Writing Method 4. In the configuration shown in FIG. 24, diffusion capacitance Cdifs is connected to source node DLS of memory cell MC0. Source node DLS is maintained at the ground voltage level at the time of data writing, and maintained at the level of write inhibiting voltage Vihb when data writing is inhibited. The configuration of combined charge capacitance control circuit CCCG for drain node DLD is the same as that for Writing Methods 1 to 3 above, and also the same for the following methods of writing. Therefore, corresponding portions are denoted by the same reference characters and detailed description thereof will not be repeated.

In Writing Method 4, charges are accumulated and transferred in accordance with the diagram of waveforms of FIGS. 5 and 6. Specifically, word line WL is maintained at the high voltage level of VPP, and capacitance elements Cdifd and Cdc are charged. Further, switching element CSW is set to the non-conductive state and an inversion layer is formed below assist gate AGT.

In this case, drain current Id of memory cell MC1 is given by capacitance elements Cdifd and Cdc, and the total amount of current is effectively represented by the amount of charges flowing in the period until the charging voltage of capacitance element Cdifs becomes equal to the voltage value of combined capacitance of capacitance elements Cdifd and Cdc. In the data writing method shown in FIG. 24, the write current is generated by charge distribution among capacitances, and movement (distribution) of charges by capacitance connection is referred to as "charge-sharing". Writing in accordance with source side injection using the current that flows as the charges move by the charge-sharing will be referred to as "global bit line/local source charge-sharing writing" method.

[Writing Method 5]

Figure 25:
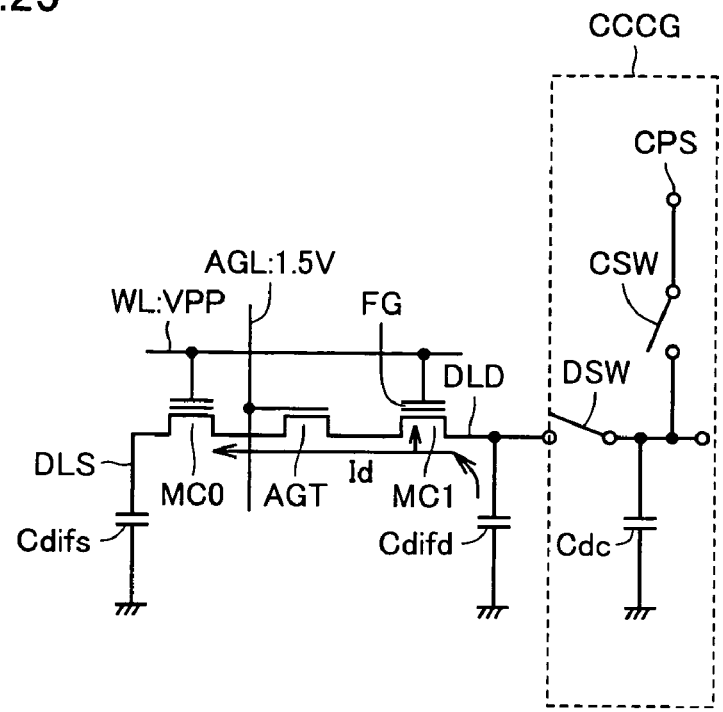
FIG. 25 schematically shows a manner of connection of capacitance elements at the time of data writing by a fifth method of writing in accordance with Embodiment 4 of the present invention.

FIG. 25 shows a manner of connection of switching elements at the time of data writing in accordance with Writing Method 5. The circuit configuration is the same as that shown in FIG. 24. Drain side capacitance elements Cdifd and Cdc are charged in the same manner as represented by the waveforms shown in FIG. 21. The word line WL is at the high voltage level VPP. In this state, switching elements SW and DSW are both set to the non-conductive state, and an inversion layer is formed at the assist gate AGT, to form a current path.

Here, the drain current Id is generated by the charge-sharing between diffusion line capacitance Cdifs of source node DLS and diffusion line capacitance Cdfd of drain node DLD. Data writing with the write current generated by the charge-sharing between diffusion line capacitances Cdifs and Cdifd is referred to as "local bit line/local source charge-sharing writing" method.

[Writing Method 6]

Figure 26:
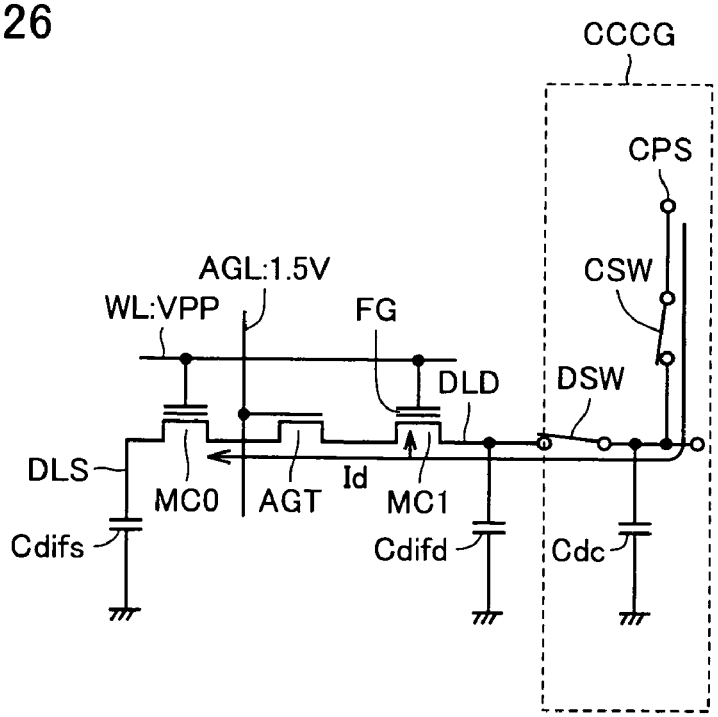
FIG. 26 schematically shows a manner of connection of capacitance elements in data writing by a seventh method of writing in accordance with Embodiment 4 of the present invention.

FIG. 26 shows a manner of connection of switching elements at the time of data writing in accordance with Writing Method 6. The circuit configuration of FIG. 26 is the same as that of FIG. 25, and corresponding portions are denoted by the same reference characters.

In the configuration shown in FIG. 26, in a state where assist gate AGT forms an inversion layer, switching elements CSW and DSW are kept conductive. Therefore, through an operation similar to that represented by the signal waveforms shown in FIG. 23, drain side capacitance elements Cdifd and Cdc are charged, inversion layer is formed at the assist gate AGT, and drain current Id flows. Here, when writing is executed, drain current Id is generated in accordance with the write current from write voltage supplying node CPS. When electrons are injected to the floating gate of memory cell MC1, writing is inhibited when the voltage of source node diffusion line capacitance Cdifs attains to the write inhibiting voltage level. Therefore, while a so-called constant voltage writing is performed to memory cell MC1 in accordance with the write voltage from write voltage supplying node CPS, even when a rush current flows while the threshold voltage of memory cell MC1 is small, the voltage level of source node DLS increases accordingly because of diffusion line capacitance Cdifs of source node DLS, and therefore, abrupt increase in drain current Id can be suppressed. Therefore, stable data writing becomes possible.

[Writing Method 7]

Figure 27:
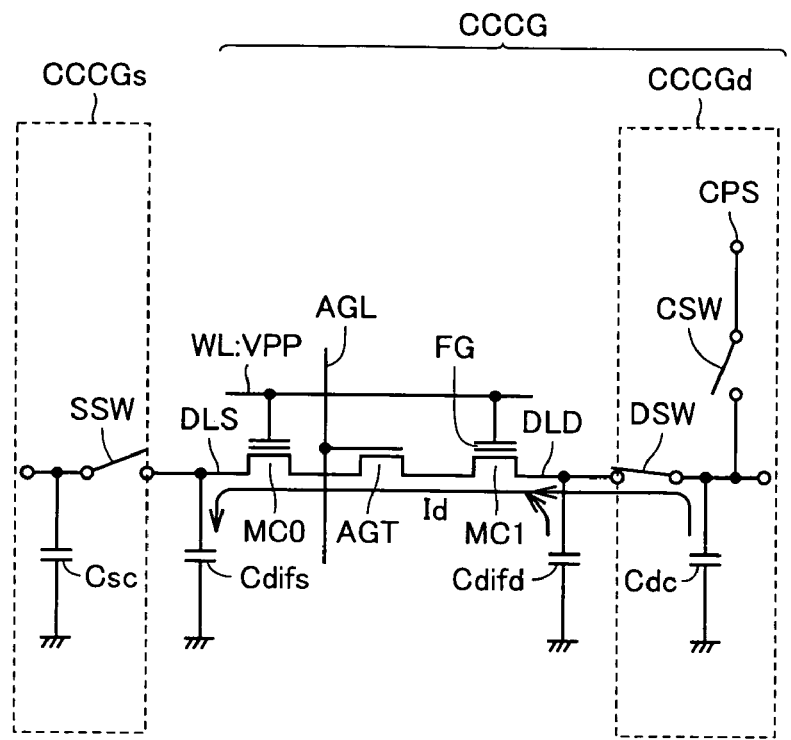
FIG. 27 schematically shows a manner of connection of capacitance elements in data writing by an eighth method of writing in accordance with Embodiment 4 of the present invention.

FIG. 27 shows a manner of connection of switching elements at the time of data writing in accordance with Writing Method 7 of Embodiment 4. In the configuration shown in FIG. 27, a source side combined charge capacitance control circuit CCCGs is connected to source node DLS, and a drain side combined charge capacitance control circuit CCCGd is connected to drain node DLD. These charge capacitance control circuits CCCGs and CCCGd correspond to the combined circuit (entire circuitry related to supply of write charges) of charge capacitance control circuits CCC0 to CCC(M−1) of Embodiment 2.

In drain side combined charge capacitance control circuit CCCGd, combined capacitance Cdc of divided global bit lines and capacitance Cdifd of drain diffusion line are connected to drain node DLD, and combined capacitance Csc of divided global bit lines and capacitance Cdifs of source diffusion line are connected to source node DLS.

The charging operation is the same as that in Writing Methods 1 to 6 described above, and switching element CSW is rendered conductive to charge capacitance elements Cdifd and Cdc. At this time, word line WL is at the high voltage level VPP. Thereafter, assist gate line AGL is set to the high level for writing. In Writing Method 7, at the time of injection, switching element DSW is set conductive, and switching element SSW of source node DLS is set to the non-conductive state. Therefore, in this case, charges accumulated in capacitances Cdifd and Cdc of drain node DLD flow as the drain current Id to source side diffusion line capacitance Cdifs (at the time of data writing). Writing Method 7 is the same as the global bit line/local source charge-sharing writing method described above (see FIG. 24).

When writing to memory cell MC1 is inhibited, the write inhibiting voltage is transmitted to source node DLS, and it is held in diffusion line capacitance Cdifs.

[Writing Method 8]

Figure 28:
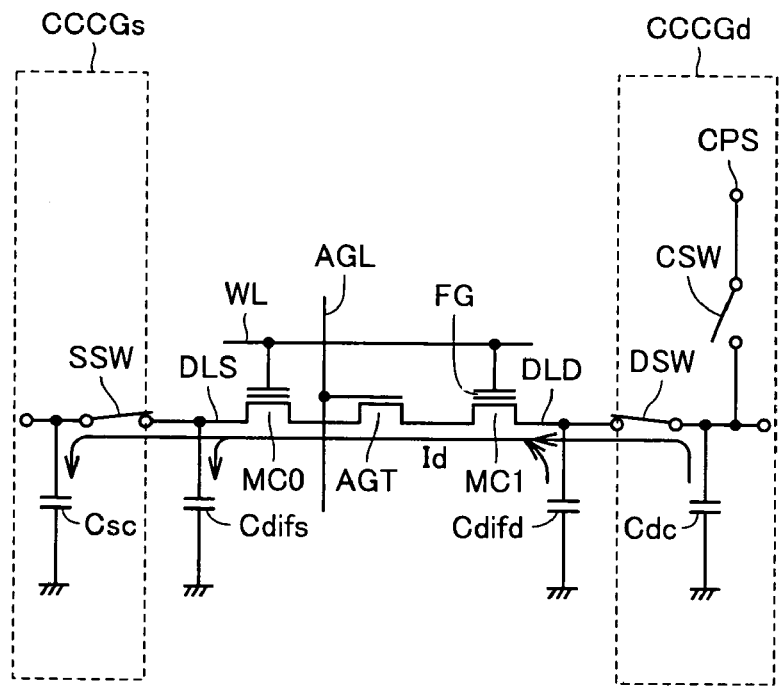
FIG. 28 schematically shows a manner of connection of capacitance elements at the time of data writing by a ninth method of writing in accordance with Embodiment 4 of the present invention.

FIG. 28 shows a manner of connection of switching elements at the time of data writing in accordance with Writing Method 8 in accordance with Embodiment 4 of the present invention. In the configuration shown in FIG. 28 also, distribution of capacitance elements is the same as in the configuration shown in FIG. 27 and, therefore, corresponding portions are denoted by the same reference characters and detailed description thereof will not be repeated.

Figure 29:
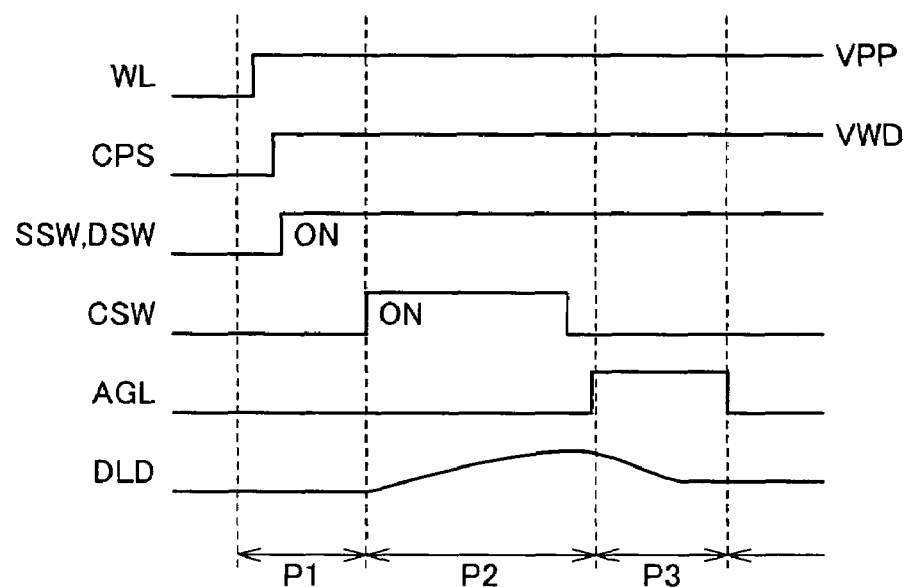
FIG. 29 is a waveform diagram representing an operation in data writing by the configuration shown in FIG. 28.

FIG. 29 is a diagram of signal waveforms representing an operation of the charge capacitance control unit shown in FIG. 28. Operation periods P1 and P3 are the same as those of Embodiment 1 described above. In period P1, a word line is selected, a write voltage is activated, switching elements SSW and DSW are both set to the on state, and global bit line capacitances Cdc and Csc are coupled to the drain node and source node DLD and DLS, respectively.

In period P2, switching element CSW is rendered conductive, and capacitance elements Cdifd and Cdc are charged.

Thereafter, in period P3, switching element CSW is set to the non-conductive state, and charges are distributed (charge-sharing) between drain side capacitance elements Cdifd and Cdc and source side capacitance elements Cdifs and Cs. Assist gate line AGL is set to the high level to form an inversion layer, so as to form a current flowing path.

Therefore, drain current Id stops flowing when re-distribution among drain side capacitances Cdifd and Cdc and source side capacitances Cdifs and Cs ends. Writing Method 8 is referred to as "global bit line/global source/charge-sharing writing method."

[Writing Method 9]

Figure 30:
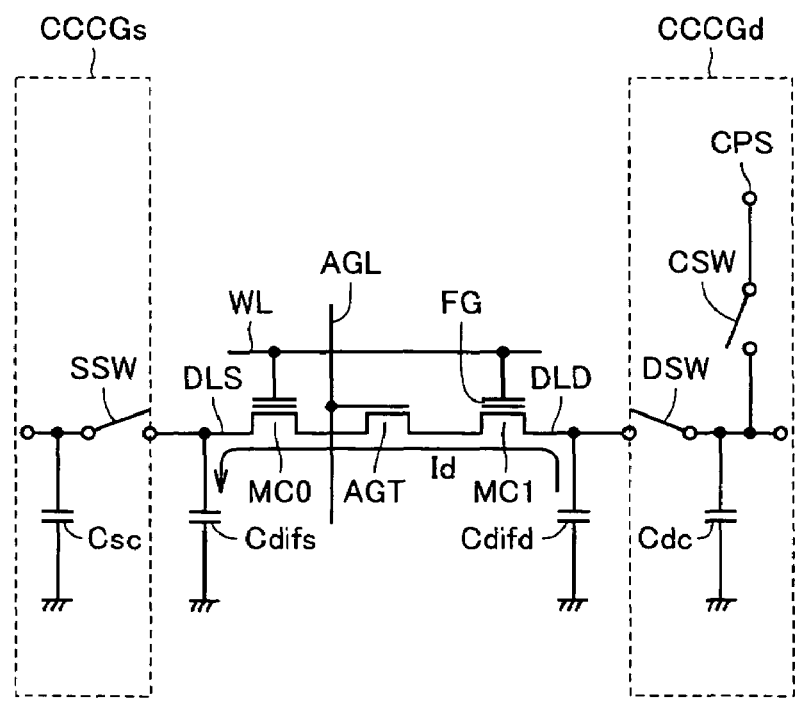
FIG. 30 schematically shows a manner of connection of capacitance elements in data writing by a tenth method of writing in accordance with Embodiment 4 of the present invention.

FIG. 30 shows a manner of connection of capacitances at the time of data writing in accordance with Writing Method 9. Distribution of capacitance elements shown in FIG. 30 is the same as that shown in FIGS. 27 and 28 and, therefore, corresponding portions are denoted by the same reference characters and detailed description thereof will not be repeated.

Figure 31:
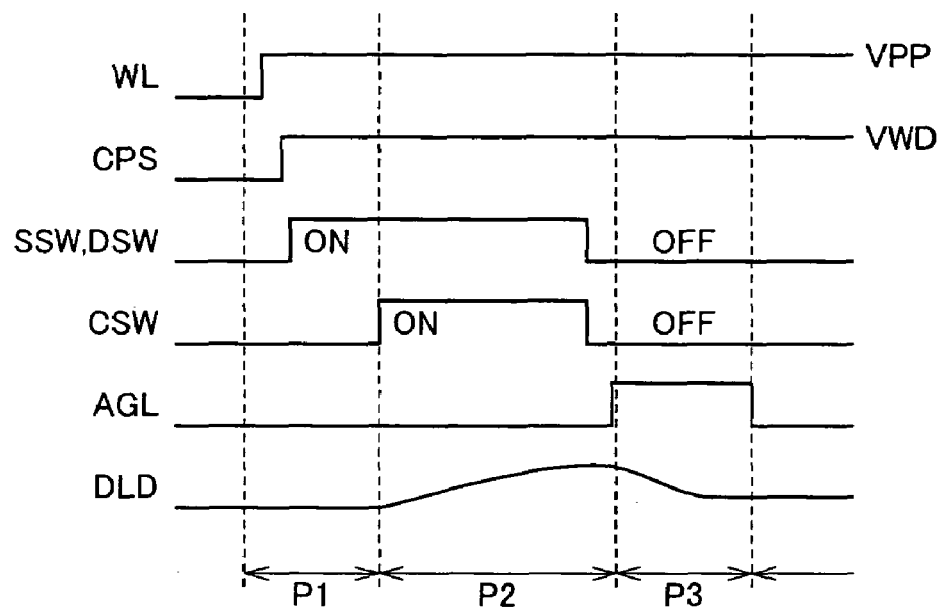
FIG. 31 is a waveform diagram representing an operation in data writing by the configuration shown in FIG. 30.

FIG. 31 is a diagram of signal waveforms representing an operation of the charge capacitance control circuit with the charge distribution as shown in FIG. 30. The write charge accumulating operation shown in FIG. 30 will be described with reference to FIG. 31.

In the configuration shown in FIG. 30, in period P1, word line WL is driven to the selected state of high voltage level VPP, and a write voltage VWD is generated and supplied to write voltage supplying node CPS. Further, in period P1, switching elements SSW and DSW are set to the conductive state (on), and capacitances Csc and Cdc are connected to source node DLS and drain node DLD, respectively.

In period P2, switching element CSW is set to the conductive state (on), drain node DLD is charged and capacitance elements Cdifd and Cdc are charged to the level of the write voltage VWD. Then, switching elements SSW, DSW and CSW are all set to the non-conductive state (off), and the charging operation ends.

In period P3, the voltage level of assist gate AGL is increased to form an inversion layer at the assist gate, and drain current Id is caused to flow through memory cells MC1 and MC0. Here, charges are distributed only between diffusion line capacitances Cdifd and Cdifs, and the writing method is the same as "local bit line/local source/charge-sharing writing method" described above.

In this case also, when data writing is to be inhibited, switching element SSW on the source side is set to the conductive state, so that the write inhibiting voltage from the sense amplifier is transmitted, to establish the state inhibiting writing to the memory cell.

[Writing Method 10]

Figure 32:
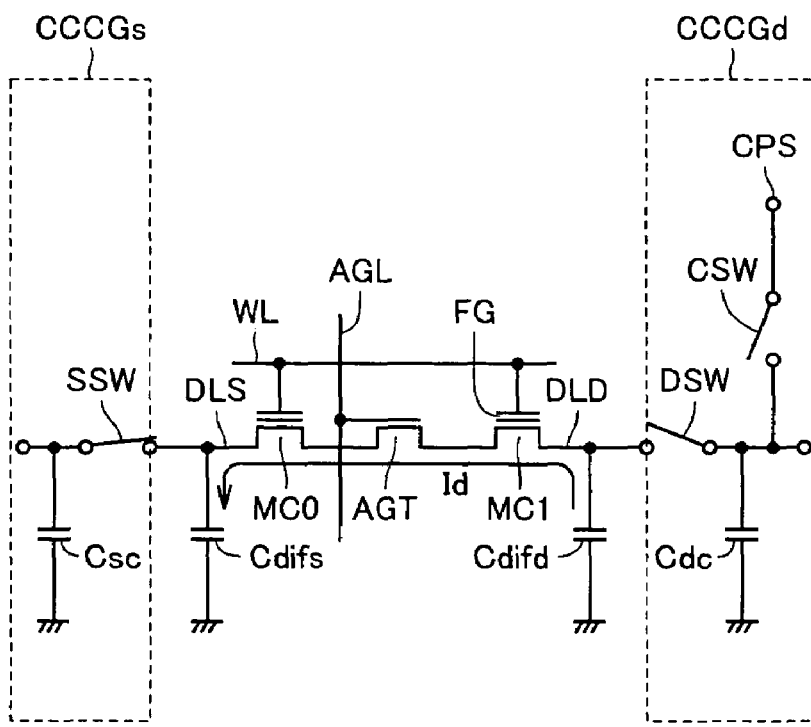
FIG. 32 schematically shows a manner of connection of capacitance elements in data writing by an eleventh method of writing in accordance with Embodiment 4 of the present invention.

FIG. 32 shows a manner of connection of capacitances at the time of data writing in accordance with Writing Method 10. In FIG. 32 also, the configuration of connected capacitances is the same as that of FIGS. 27 and 28, and corresponding portions are denoted by the same reference characters.

Figure 33:
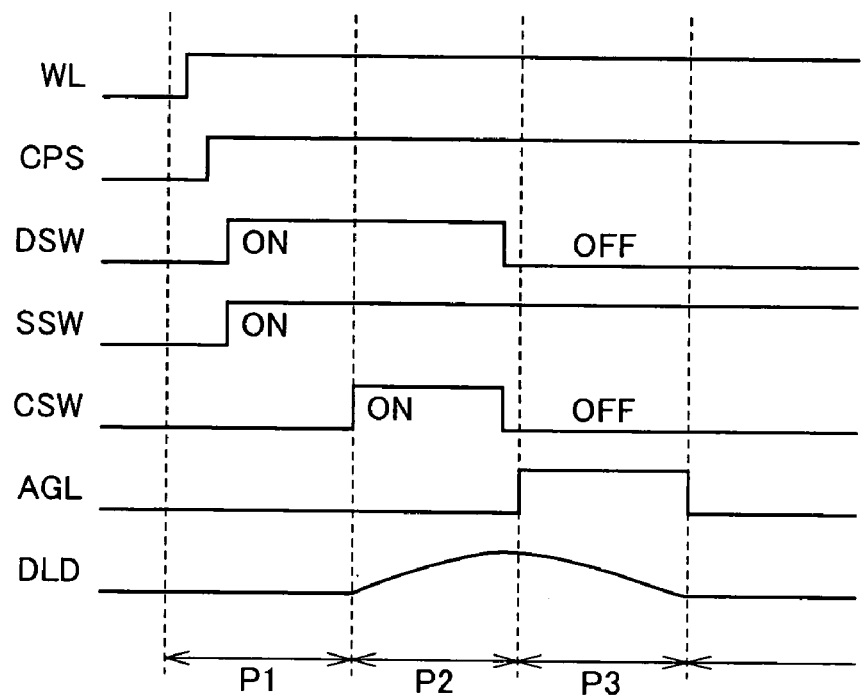
FIG. 33 is a diagram of waveforms representing a writing operation by the configuration shown in FIG. 32.

FIG. 33 is a diagram of waveforms representing an operation of the charge capacitance control circuit shown in FIG. 32. An operation of the configuration shown in FIG. 32 at the time of data writing will be described with reference to FIG. 33.

In period P1, similar to Writing Method 9 shown in FIGS. 9 and 10, word line WL is selected, write voltage VWD is activated, and switching elements DSW and SSW are set to the conductive state (on).

Next, in period P2, by the switching element CSW that is set to the conductive state (on), capacitance elements Cdifd and Cdc are charged. In period P2, after completion of charging, switching element DSW is set to the non-conductive state (off), and switching element CSW is also set to the non-conductive state (off). Switching element SSW is kept conductive.

In this state, the voltage level of assist gate line AGL is increased in period P3, so that an inversion layer is formed and drain current Id flows. Here, charges flow from diffusion line capacitance Cdifd to diffusion line capacitance Cdifs and to global bit line combined capacitance Csc. Therefore, as the capacitance value of source node DLS is larger than the capacitance of drain node DLD, it is possible to cause larger amount of charges to flow as the write current (than by Writing Method 9).

This method utilizes charge distribution among capacitances, that is, the source side injection writing with charge-sharing, and it is referred to as "local bit line/global source/charge-sharing writing."

[Writing Method 11]

Figure 34:
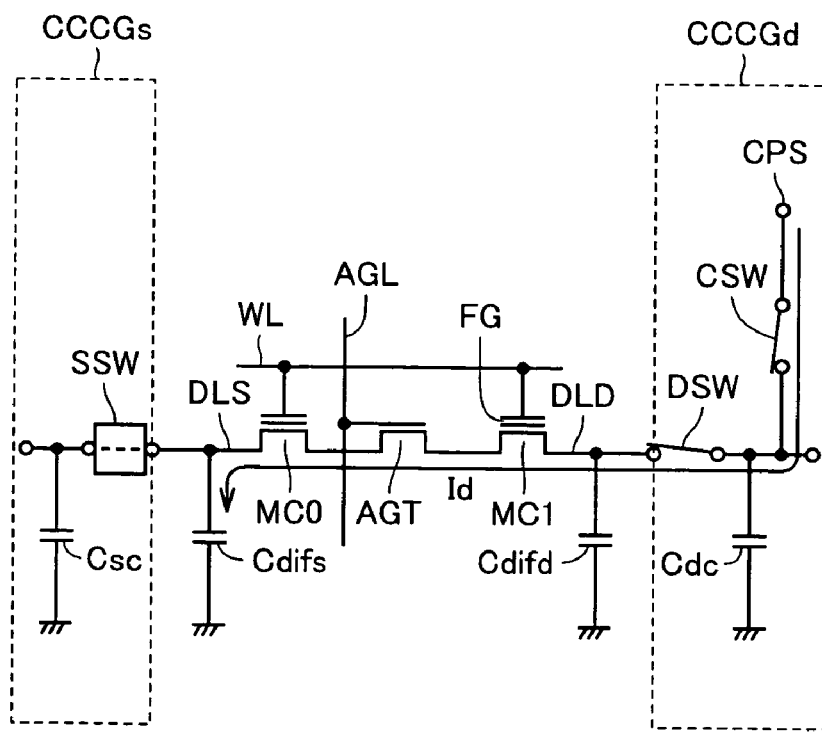
FIG. 34 schematically shows a manner of connection of capacitance elements for a twelfth method of writing in accordance with Embodiment 4 of the present invention.

FIG. 34 shows a manner of connection of capacitances at the time of data writing in accordance with Writing Method 11 in accordance with Embodiment 3 of the present invention. In the example of FIG. 34 also, combined charge capacitance control circuits CCCGd and CCCGs are provided for the source node DLS and the drain node DLD, respectively. Configurations of portions related to the memory cells are the same as those of FIG. 32 and other figures described above. Therefore, corresponding portions are denoted by the same reference characters and detailed description thereof will not be repeated.

According to Writing Method 11, at the time of injecting electrons (injection), switching elements CSW and DSW are both set to the conductive state. At this time, the manner of connection of switching element SSW in combined charge capacitance control circuit on the source side may be any of the manners in accordance with Writing Methods 7 to 10. A DC current from write voltage supplying node CPS is supplied as the drain current Id, and electrons are injected in accordance with source side injection method to the floating gate FG of memory cell MC1.

At the time of injection, capacitance elements are coupled to the source node DLS, and the global bit line capacitance and source diffusion line are separated from the ground node. Therefore, flow of a large rush current can be prevented. Further, in combined charge capacitance control circuit CCCG on the source side, by selectively setting the state of switching element SSW to adjust the capacitance value of combined capacitance Csd, the amount of electrons to be injected by drain current Id can be adjusted (when the voltage of source node DLS increases to the write inhibiting voltage level, writing stops, and therefore, the amount of electrons to be injected to the floating gate can be determined by the capacitance value of the capacitance on the source side).

Therefore, by injecting electrons in accordance with any of Writing Methods 1 to 10, using source side injection method, it becomes possible to set an optimal amount of electron injection in accordance with the value of write data. The amount of electrons to be injected can be set delicately, and the width of threshold voltage distribution can be adjusted with high precision.

Embodiment 5

Figure 35:
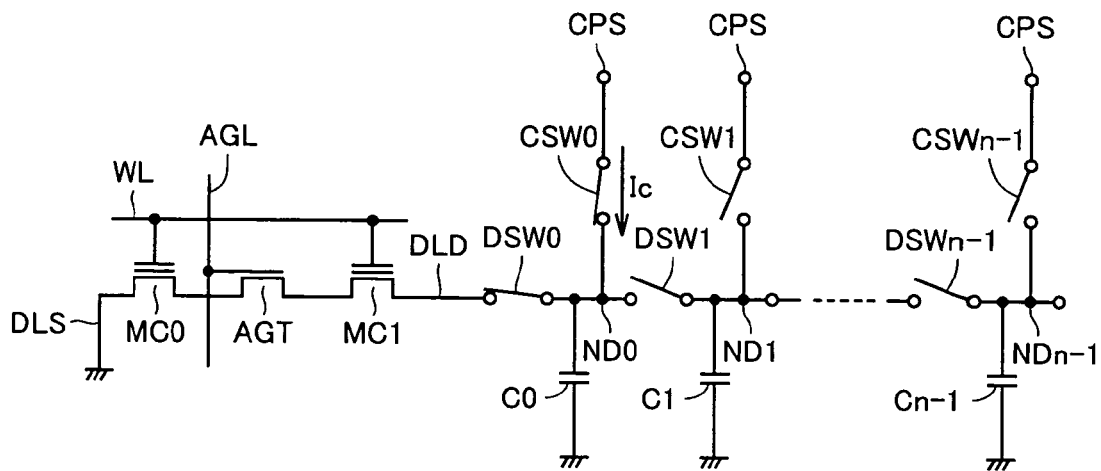
FIG. 35 schematically shows a manner of connection of drain side capacitance elements in data writing of a non-volatile semiconductor memory device in accordance with Embodiment 5 of the present invention.
Figure 36:
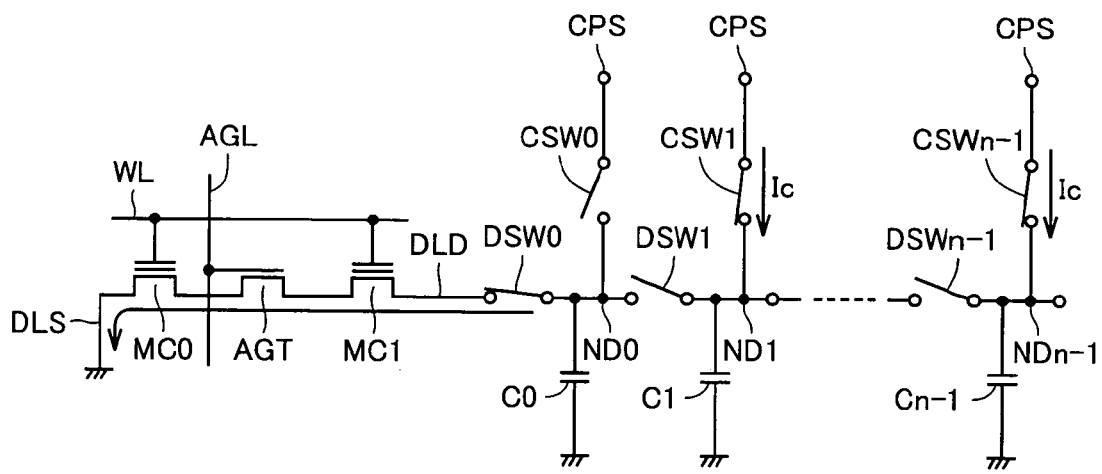
FIG. 36 schematically shows a manner of connection of capacitance elements in injection for data writing in accordance with Embodiment 5 of the present invention.
Figure 37:
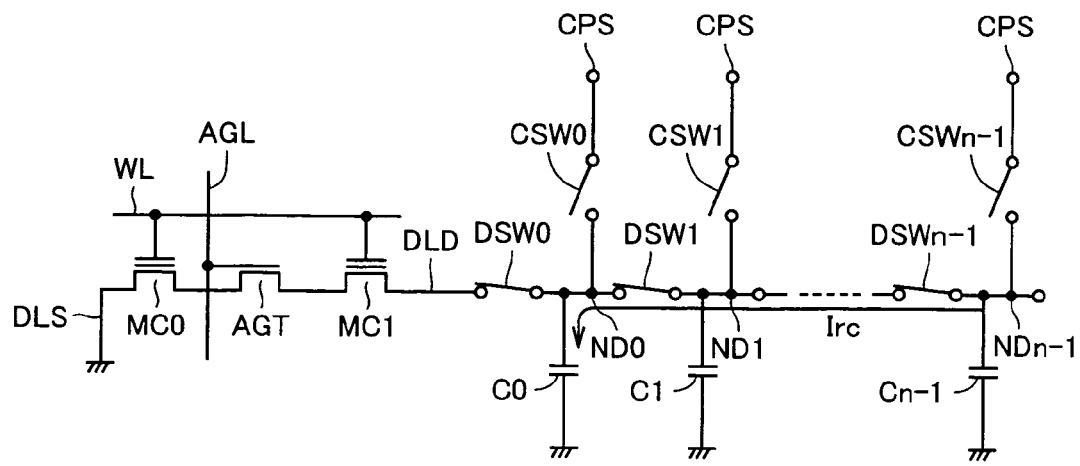
FIG. 37 schematically shows a manner of connection of capacitance elements at the time of re-injection in accordance with Embodiment 5 of the present invention.

FIGS. 35 to 37 represent a manner of connection of capacitance elements in data writing in accordance with Embodiment 5 of the present invention. A data writing operation by capacitance connection shown in FIGS. 35 to 37 will be described with reference to an operation timing chart of FIG. 38.

In Embodiment 5, memory cells MC0 and MC1 are connected in series, with assist gate AGT in between. To the drain node DLD of memory cell MC1, switching elements DSW0 to DSWn−1 are connected in series, and capacitance elements C0 to Cn−1 are connected corresponding to switching elements DSW0 to DSWn−1, respectively. Switching elements CSW0 to CSWn−1 supplying a voltage from write voltage supplying node CPS are provided corresponding to capacitance elements C0 to Cn−1, respectively. Source node DLS of memory cell MC0 is coupled to the ground node.

As the configuration of capacitance value control circuit for the drain, the charge capacitance control circuit shown in Embodiment 3 may be used, or a capacitance element may be connected, together with a series of switching elements, to the drain bit line.

An operation of injecting electrons in accordance with source side injection method to memory cell MC1 using charges accumulated in capacitance element C0 will be described.

Figure 38:
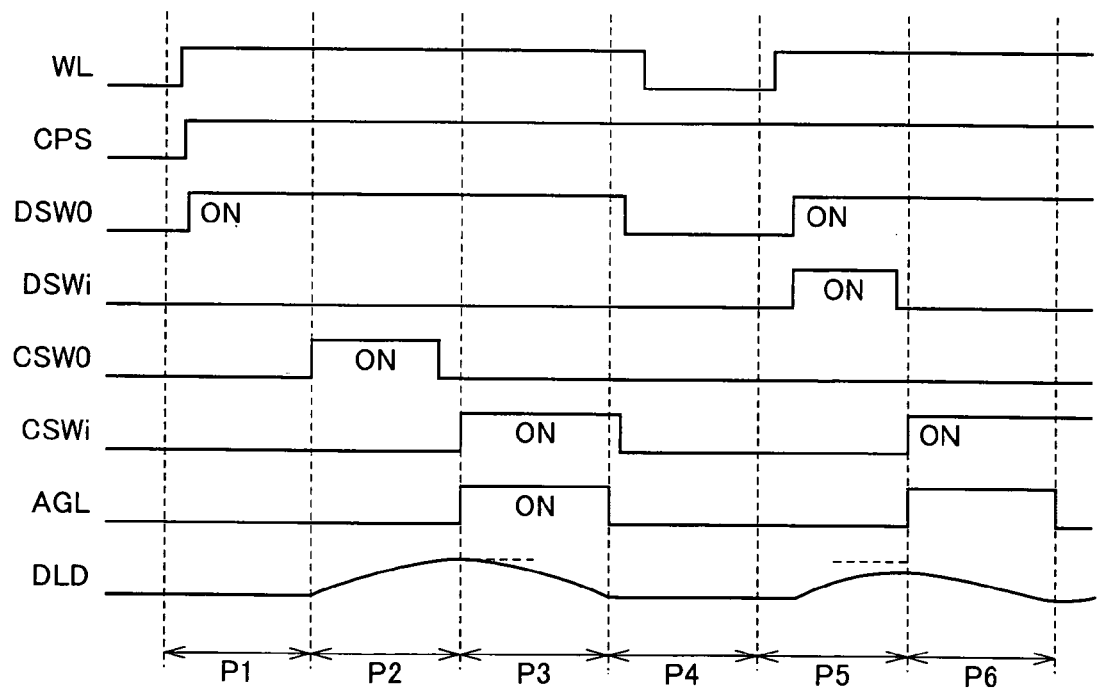
FIG. 38 is a diagram of waveforms representing the operations of configurations shown in FIGS. 35 to 37.

In period P1 shown in FIG. 38, word line WL is driven to the selected state, a drain write voltage Cvwd is generated, and the voltage level of write voltage supplying node CPS increases. In this state, switching element DSW0 is rendered conductive, and capacitance element C0 is connected to drain node DLD. Switching elements DSW1 to DSWn−1 are all non-conductive. In the waveform diagram of FIG. 38, the state of these switching elements DSW1 to DSWn−1 is generally represented by switching element DSWi.

Next, in period P2, switching element CSW0 is rendered conductive (on), capacitance element C0 receives charging current Ic and is charged to the write voltage level, as shown. By this charging operation, the voltage level of drain node DLD increases. In period P2 shown in FIG. 38, switching elements CSW1 to CSWn−1 are all non-conductive. In FIG. 38, the state of these switching elements CSW1 to CSWn−1 is generally represented by switching element CSWi.

Next, as shown in FIG. 36, switching element CSW0 is set to the non-conductive state. This state corresponds to period P3 shown in FIG. 38, in which the voltage level of assist gate AGL is driven to the high level for writing, and charges accumulated in capacitance element C0 flows to source node DLS. By the write current, writing to the floating gate of memory cell MC1 is executed.

In period P3 shown in FIG. 38, switching elements CSW1 to CSWn−1 (CSWj) are rendered conductive (on) as shown in FIG. 36, and capacitance elements C1 to Cn−1 are charged. Switching elements DSW1 to DSWn−1 are non-conductive, as shown in FIG. 36.

After period P3, word line WL is inactivated, a data write terminating process is performed, and a verifying operation is performed. When it is found by the verifying operation that the threshold voltage of memory cell MC1 does not reach a prescribed voltage level, electrons are injected again. Here, when the verifying operation takes place in period P4 of FIG. 38, word line WL is driven to a verifying voltage level, and the level of drain node DLD also changes because of the memory cell current at the time of verifying, though not shown in FIG. 38.

When rewriting (electron injection) is done as a result of the verifying operation, word line WL is again driven to the selected state in period P5, to the high voltage level VPP for writing, as shown in FIG. 38. At this time, in period P5 of FIG. 38, switching elements CSW0 to CSWn−1 are all non-conductive, as shown in FIG. 37. Switching elements DSW0 to DSWn−1 are all set to the conductive state (on), so that charges are moved among capacitance elements C0 to Cn−1 (charge-sharing operation). Therefore, in period P5 of FIG. 38, the voltage level of drain node DLD shown in FIG. 37 increases. The voltage level of drain node DLD at this time is set to the voltage level changed by the charging among capacitance elements C0 to Cn−1, which is slightly lower than the initially applied write voltage.

Thereafter, as shown in FIG. 38, in period P6, switching elements DSW1 to DSWn−1 (DSWj) are set to the non-conductive state, and capacitance elements C1 to Cn−1 are isolated from capacitance element C0. At this time, in period P6, switching elements CSW1 to CSWn−1 are set to the conductive state (on), to charge capacitance elements C1 to Cn−1.

In this period P6, assist gate line AGL is again set to the high level, and in accordance with the charges accumulated in capacitance element C0, electrons are injected to the floating gate of memory cell MC1.

Specifically, to a memory cell that is found by the verifying operation to be in need of re-injection, the states shown in FIGS. 36 and 37 are set again, and this operation is repeated until the threshold voltage reaches a prescribed value or higher.

In this re-injection, when the word line is selected in period P5 shown in FIG. 38, because of the movement of electrons among capacitance elements C0 to Cn−1, the voltage level of drain node DLD can be set at high speed to the write voltage level through re-distribution of charges, the time period for charging drain node DLD through switching element CSW2 can be eliminated, and the cycle time of rewriting after verification can be made shorter (in the operation of charging switching element CSW0, the time for charging derived from RC delay of charging current has been necessary).

As regards the operation timings shown in FIG. 38, for the first writing, the operations shown in FIGS. 35 to 37 are performed, and for the second and following re-writing operations, operations shown in FIGS. 36 and 37 are repeated. As the number of times of verifying operations increases, the threshold voltage of the object memory cell increases gradually. After the verifying operation by lowering the voltage level of the write voltage through charge distribution, it becomes possible to prevent the threshold voltage from attaining excessively high (from exceeding an upper limit), and the number of times of verifying operations can be reduced and the time period necessary for writing can be reduced accordingly.

Figure 39:
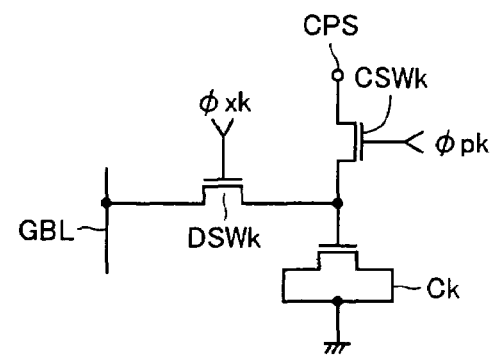
FIG. 39 shows an exemplary configuration of the capacitance control unit in accordance with Embodiment 5 of the present invention.

FIG. 39 shows an exemplary configuration of switching elements CSW0 to CSWn−1, DSW0 to DSWn−1 and C0 to Cn−1. Referring to FIG. 39, capacitance element Ck is formed of an MOS capacitor, of which gate is coupled to write voltage supplying node CPS through switching element CSWk. Similarly, the gate electrode of MOS capacitor Ck is coupled to global bit line (divided global bit line) GBL through switching element DSWk. Switching elements DSWk and CSWk are formed of N channel MOS transistors (insulated gate type field effect transistors), and selectively rendered conductive in response to control signals φxk and φpk, respectively.

Therefore, even when a verifying operation is performed at every write cycle (injection) of memory cells and the verifying current flows through global bit line, the operation of charging capacitance element Ck can be performed by setting the switching element DSWk to the non-conductive state in accordance with control signal φxk.

Control signals φpk and φxk must be set at a voltage level higher than the write voltage (for example, 6V). The switching elements DSWk and CSWk, however, may be formed by P channel MOS transistors. Here, k is an integer from 0 to n−1.

Further, when parasitic capacitance of divided global bit line is used as capacitance elements C0 to Cn−1 as shown in Embodiment 3, after executing the operation shown in FIG. 35, the operations shown in FIGS. 36 and 37 are repeated a prescribed number of times. Specifically, after executing the operations of periods P1 to P4 shown in FIG. 38, the operations of periods P5 and P6 are executed successively for a prescribed number of times. In this case, the word line WL is driven continuously to the selected state until the write cycle is complete, and switching element DSW0 may be normally kept conductive. Specifically, when the capacitances of local bit lines and diffusion lines are utilized, the word line is not driven to the unselected state and the verifying operation is not performed in period P4, and therefore, the states of word line WL and switching element DSW0 may be maintained until the start of the verifying operation.

At the time of data writing, the number of capacitance elements connected to each other may be appropriately selected in accordance with the amount of change in the threshold voltage, that is, the logical value of write data.

In the configurations shown in FIGS. 35 to 37, no capacitance is connected to source node DLS. A capacitance element of a fixed value may be connected to source node DLS, or a series of switching element and a capacitance element allowing change in capacitance value of combined capacitances may be used.

[Modification]

Figure 40:
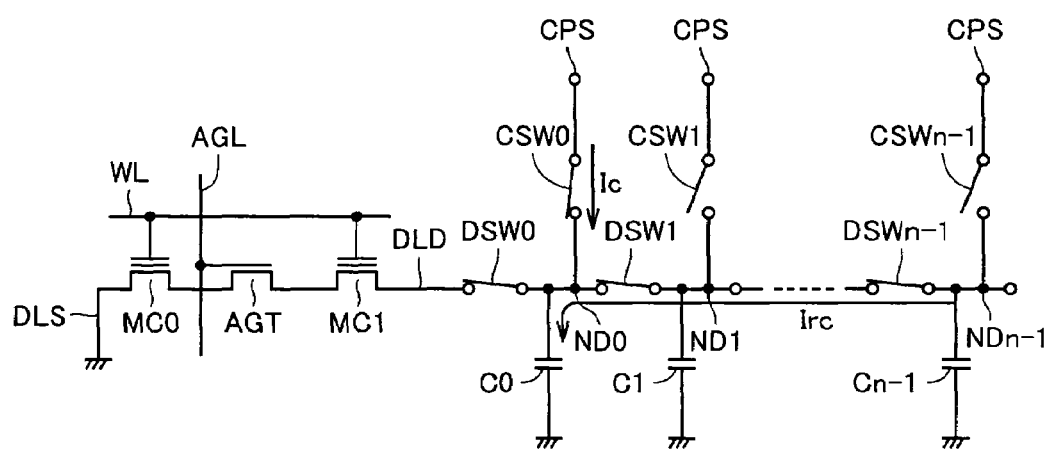
FIG. 40 schematically shows a manner of connection of capacitance elements in re-charging a write voltage in accordance with Embodiment 5 of the present invention.
Figure 41:
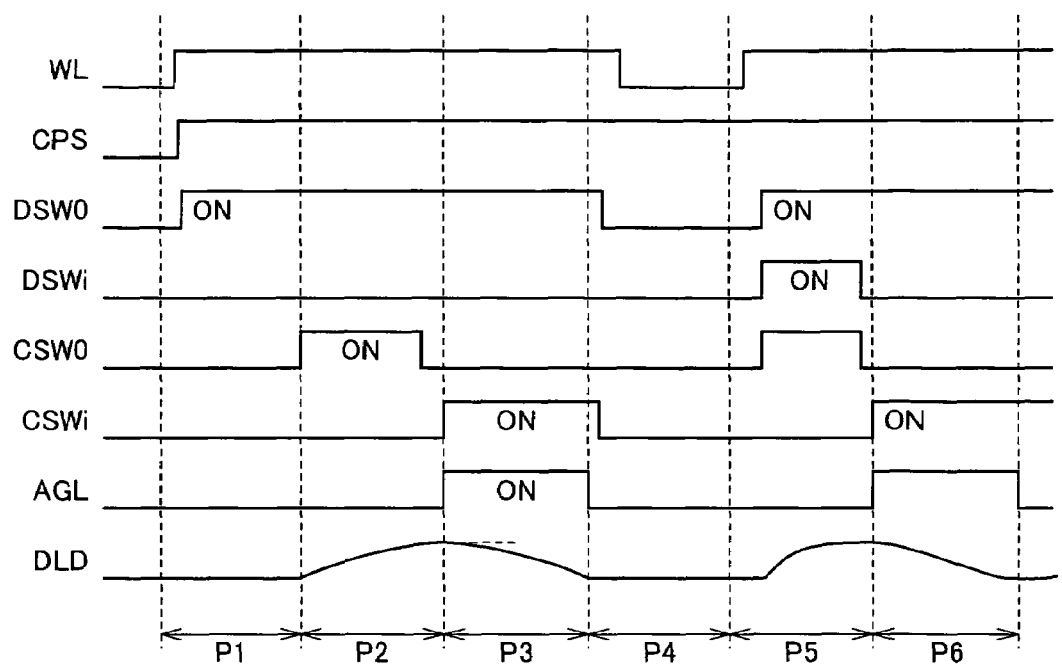
FIG. 41 is a diagram of signal waveforms representing an operation in data writing by the configuration shown in FIG. 40.

FIG. 40 shows a manner of capacitance connection in accordance with a modification of Embodiment 5 of the present invention. The configuration shown in FIG. 40 is a modification of the state shown in FIG. 37. Specifically, after the completion of verifying operation or at the time of second writing, when capacitance elements C0 to Cn−1 are connected to charge capacitance element C0, the corresponding switching element CSW0 is turned on. Therefore, in this example, as shown in FIG. 41, capacitance element C0 receives charges from capacitance elements C1 to Cn−1 and the charging current from write voltage supplying node CPS in period P5, whereby the time necessary for charging capacitance element C0 can be made shorter. Accordingly, the voltage level of drain node DLD can be set quickly to the high voltage level for writing.

Therefore, by performing the operation shown in FIG. 35 to execute operations of periods P1 to P3 shown in FIG. 41, performing the operation shown in FIG. 37 to charge capacitance elements CSW1 to CSWn−1 (CSWi) and thereafter by charging capacitance element C0 as shown in FIG. 40, the time necessary for charging drain node DLD can be made shorter, and the drain node DLD can be charged accurately to the write voltage level.

In the modified configuration also, a capacitance element or a variable capacitance element may be connected to source node DLS.

As described above, according to Embodiment 5, charges accumulated in a capacitance element charged during a writing operation are utilized for re-writing to the memory cell, so that the time necessary for charging the drain node for re-writing can be reduced, and hence the time necessary for writing can be reduced.

Conduction control of the switching element is executed by a control circuit shown in FIG. 11, in accordance with the position of the selected memory array and the value of write data.

Embodiment 6

Figure 42:
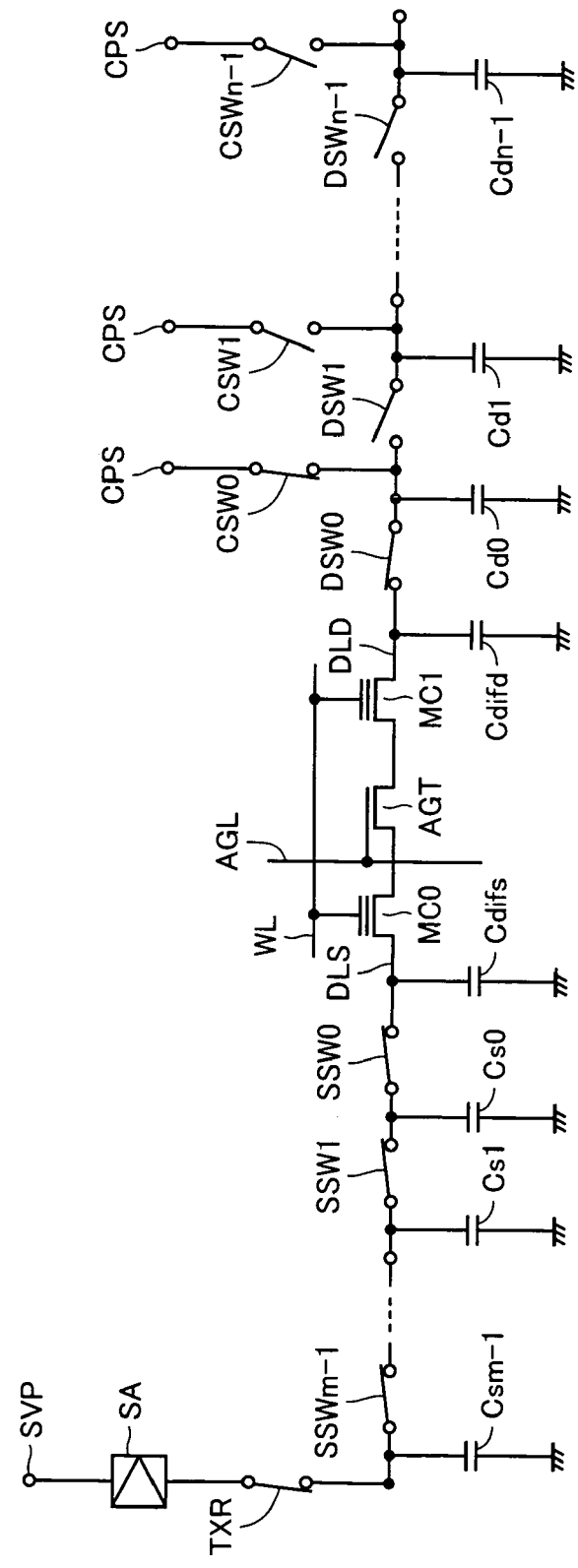
FIG. 42 schematically shows a manner of connection of capacitance elements in when a write inhibiting voltage is transmitted, in accordance with Embodiment 6 of the present invention.
Figure 43:
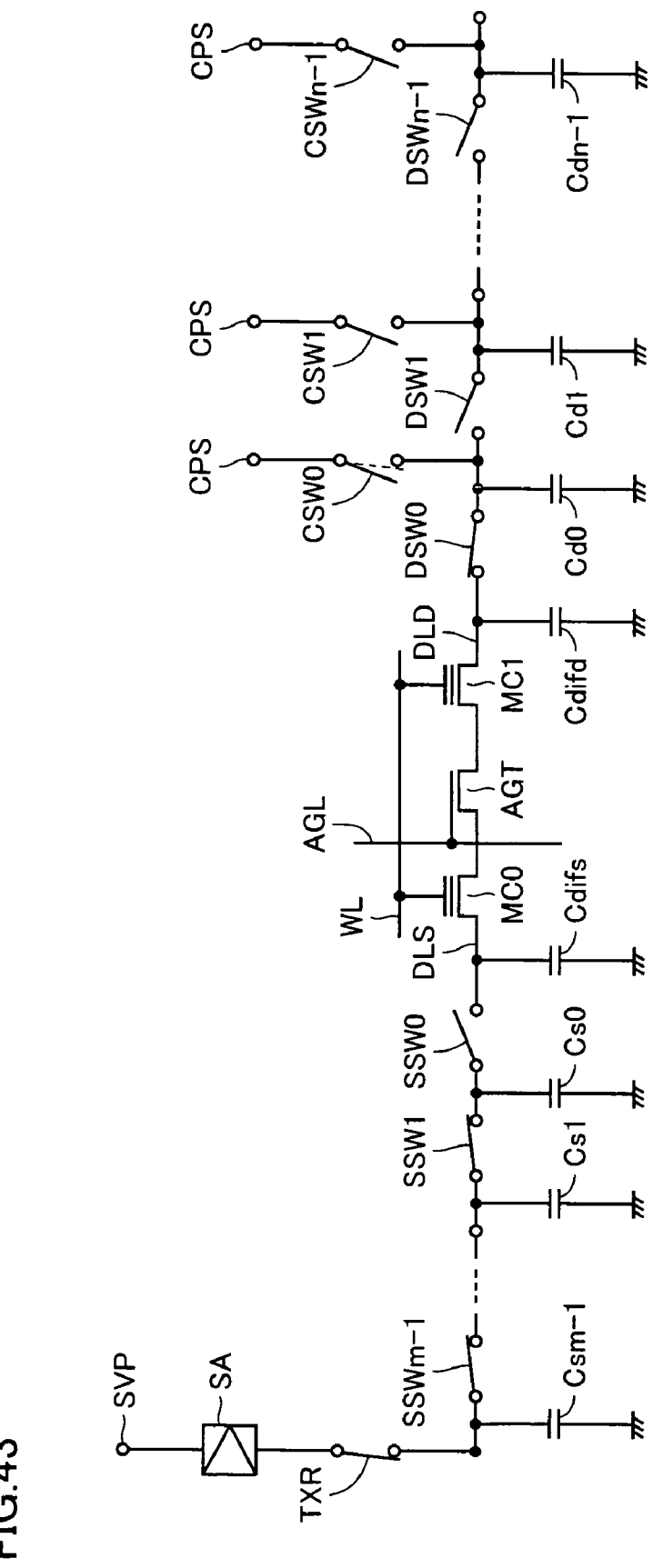
FIG. 43 schematically shows a manner of connection of capacitance elements in transmitting a write inhibiting voltage, in accordance with Embodiment 6 of the present invention.
Figure 44:
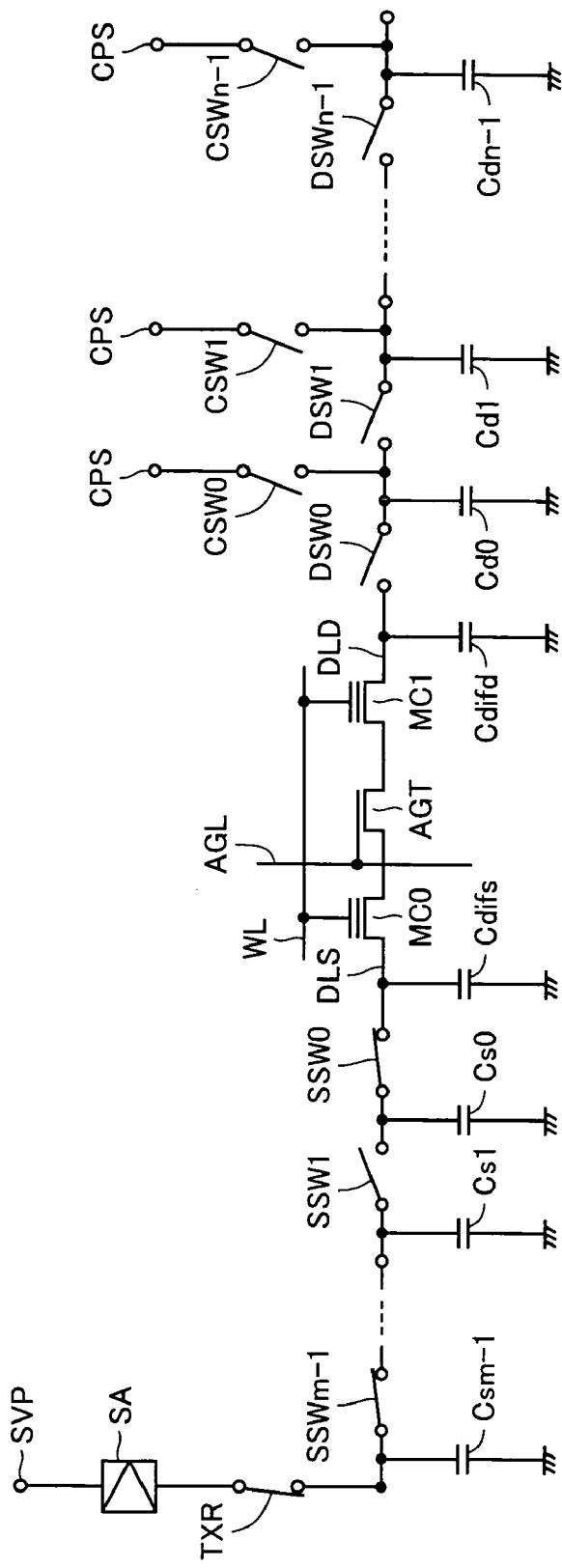
FIG. 44 schematically shows a manner of connection of capacitance elements at the time of injecting electrons in accordance with Embodiment 6 of the present invention.
Figure 45:
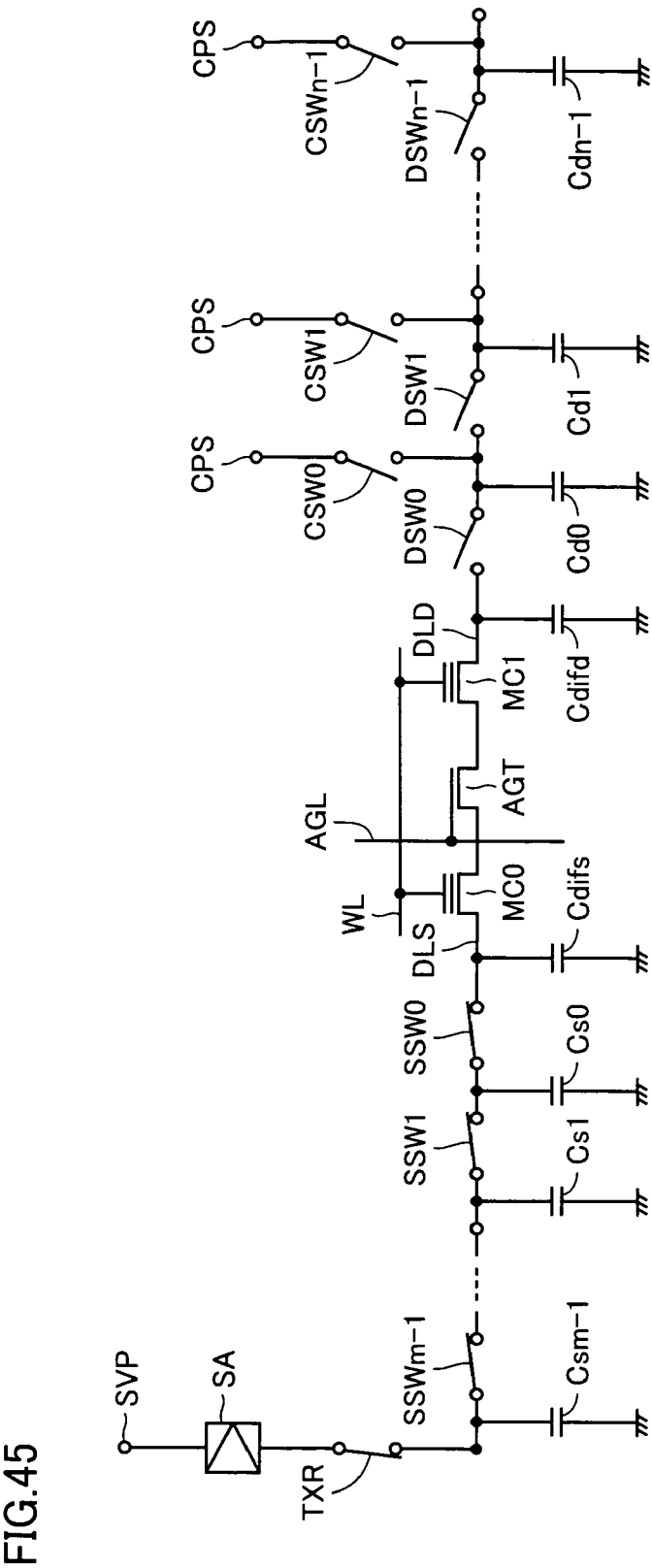
FIG. 45 schematically shows a manner of connection of capacitance elements in transmitting a write inhibiting voltage, in accordance with Embodiment 5 of the present invention.

FIGS. 42 to 44 schematically show capacitance connection in an operation of charging the write inhibiting voltage in accordance with Embodiment 6 of the present invention. In FIGS. 42 to 44, switching elements DSW0 to DSWn−1 are connected in series to drain node DLD, and corresponding capacitance elements Cd0 to Cdn−1 exist as line capacitances of divided global bit lines, respectively. Switching elements DSW0 to DSWn−1 are arranged corresponding to capacitance elements Cd0 to Cdn−1, respectively.

To the source node DLS of memory cell MC0, switching elements SSW0 to SSWm−1 are connected in series, and line capacitances Cs0 to Csm−1 are connected respectively thereto. A sense amplifier SA is coupled to divided global bit line capacitance Csm−1 through a transfer gate TXR. A voltage from a high-side power supply node SVP of sense amplifier SA is transmitted as the write inhibiting voltage. Transfer gate TXR corresponds to any of transfer gates TXR0 to TXR2 shown in FIG. 14. Further, sense amplifier SA corresponds to any of sense amplifiers SA0 to SA2 shown in FIG. 14.

The position of switching element to which the sense amplifier is connected differ dependent on the position of selected memory array that includes the selected memory cell (the divided global bit lines are connected downward from the selected memory array group, and when the lowermost divided global bit line is used and the bit line capacitance should further be increased, a divided global bit line is extended upward from the selected array).

Diffusion line capacitance Cdifd exists at drain node DLD and diffusion line capacitance Cdifs exists at source node DLS, of memory cell MC1. Connection of memory cells MC1 and MC0 and assist gate AGT in between is the same as those of the embodiments described above.

When the write inhibiting voltage is to be transmitted from sense amplifier SA, switching elements SSW0 to SSWm−1 are all set to the conductive state, and transfer gate TXR coupled to the reference node of the sense amplifier is also set to the conductive state. Consequently, through transfer gate TXR and switching elements SSWm−1 to SSW0, the write inhibiting voltage is transmitted from the high-side power supply node SVP to line capacitance Cdifs.

On the side of drain node DLS, switching elements CSW0 and DSW0 are rendered conductive, to charge line capacitance Cd0 of global bit line and diffusion line capacitance Cdifd. Here, an example is shown in which one divided global bit line, that is, line capacitance Cd0, is used. Therefore, here, switching elements DSW1 to DSWn−1 are non-conductive, and switching elements CSW1 to CSWn−1 are all non-conductive.

Charging of source node DLS by the write inhibiting voltage and charging of drain side node DLD to the write voltage level may be executed in parallel, or charging operations of source node DLS and drain node DLD may be executed sequentially in different cycles.

FIG. 42 shows charging operations of source node DLS and drain node DLD executed in parallel in one same cycle.

Thereafter, as shown in FIG. 43, switching element SSW0 is set to the non-conductive state, and switching element DSW0 on the drain node DLD is set to the conductive or non-conductive state for charge-sharing writing, that is, charges are re-distributed between capacitances Cdifs and Cdifd (and Cd0) to generate the write current. Here, the DC current writing may be executed by setting switching element CSW0 to the conductive state, as shown in FIG. 43.

FIG. 44 shows another state of switching elements when the charge-sharing is executed after the generation of write current. In the state shown in FIG. 44, switching element SSW1 is rendered non-conductive, and switching element SSW0 is rendered conductive. Further, switching element DSW0 is rendered non-conductive, and switching elements provided on the side of drain node DLD are all rendered non-conductive. Here, charges are distributed among capacitance Cdidf and combined capacitance of Cdifs and Cs0.

By using the configuration of FIG. 43 or FIG. 44, it becomes possible to use the diffusion line capacitance only as the source side capacitance and to additionally use parasitic capacitance Cs of divided global bit line as the source node side capacitance. The same applies to the operation of charge capacitance control circuit of drain side node DLD.

When the threshold voltage of memory cell MC1 is lower than a prescribed value, rewriting, that is, re-injection is executed. Here, it is assumed that the divided global bit line on the source side is not used for the verifying operation, the global bit line capacitance Cs that is not used (combined capacitance of divided global bit lines that are not used) is charged by the write inhibiting voltage of sense amplifier SA. Therefore, here, transfer gate TXR and switching elements SSW0 to SSWm−1 are all set to the conductive state, and source diffusion line capacitance Cdifs is charged. In this case, a write current is supplied in verifying operation to the global bit line on the drain side for data reading, and therefore, it is necessary to set switching element CSW for charging and switching element DSW for connection to the conductive state for charging again.

Figure 46:
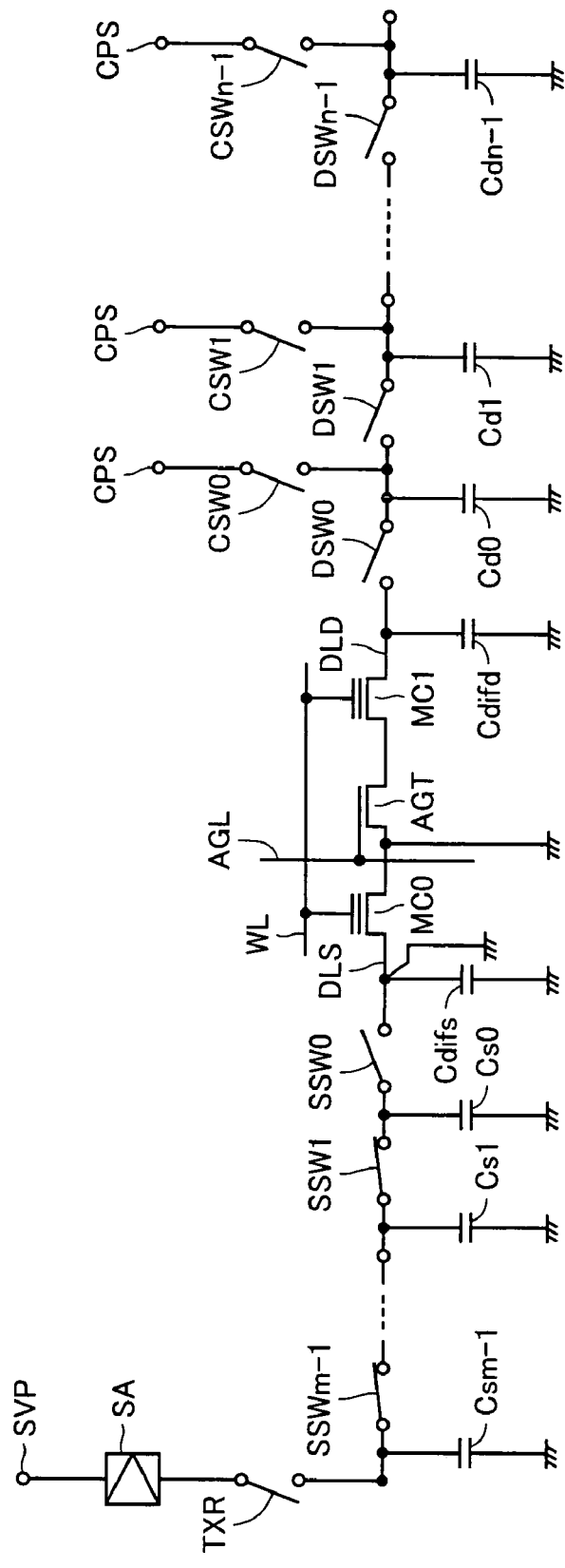
FIG. 46 schematically shows a manner of connection of capacitance elements in transmitting a write inhibiting voltage, in accordance with Embodiment 6 of the present invention.

A configuration in which the source side global bit line is not used for the verifying operation is shown in FIG. 46. Specifically, when data is read in the verifying operation, an inversion layer is formed at the assist gate AGT, and the inversion layer is set to the ground voltage level. Similarly, switching element SSW0 on the side of source node for memory cell MC0 is set to the non-conductive state, and diffusion line capacitance Cdifs on the source side is connected to the ground node. Further, by the assist gate adjacent to the memory cell MC0, source node DLS is coupled to the ground node.

Therefore, while accumulated charges are left in the capacitances Cs0 to Csm−1 of global bit lines on the source side, the inversion layer below the assist gate is fixed to the ground voltage, whereby a current is caused to flow to the memory cell in accordance with the verify reading current from the drain side global bit line. Therefore, the potential on the source side global bit line is not influenced. Therefore, in each write cycle, the write inhibiting voltage can be transmitted to diffusion line capacitance Cdifs on the source side, at each verifying operation for determining whether the threshold voltage is at a prescribed value or higher.

For fixing the inversion layer of assist gate AGT to the ground voltage, a transistor for grounding is arranged for a source line IL, in the configuration shown in FIG. 11.

When the global bit line is used both on the drain side and on the source side at the time of verifying operation (when the inversion layer of the assist gate is connected to the global bit line on the source side), a verifying sense amplifier may be provided separate from the sense amplifier SA of the sense/latch circuit latching the write data, or sense amplifier SA may be used as the verifying sense amplifier.

When the recharging operation through charge distribution among the capacitances on the drain side node is performed for each injection and the diffusion line capacitance Cdifs on the source node is charged concurrently as in the embodiment described above, the verifying operation is performed after the above-described operation is repeated a prescribed number of times. Here, the global bit lines both on the drain side and on the source side are used in verifying, and therefore, sense amplifier SA can be used as the verifying sense amplifier.

Figure 47:
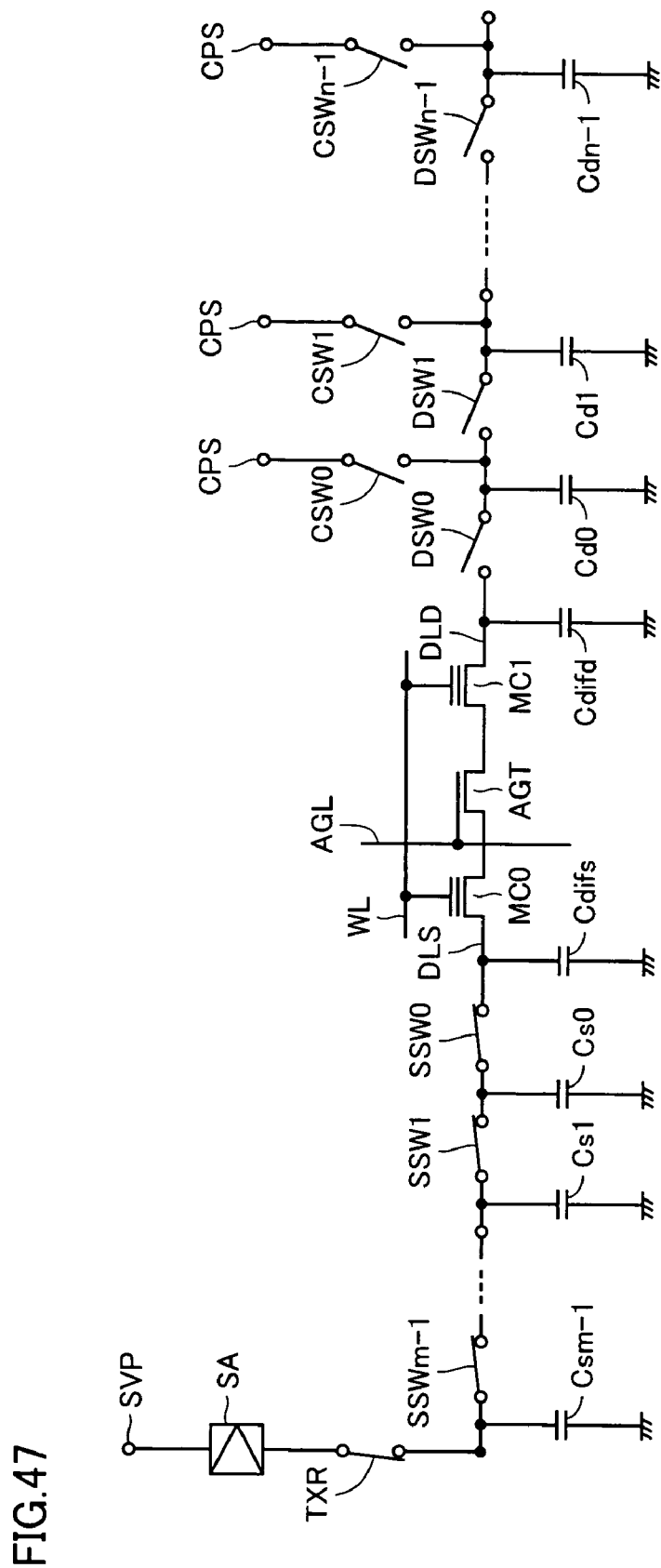
FIG. 47 schematically shows another example of the manner of connection of capacitance elements at the time when a write inhibiting voltage is re-charged, in accordance with Embodiment 6 of the present invention.

Further, as shown in FIG. 47, when the write inhibiting voltage is re-charged, transfer gate TXR may be set to the conductive state for supplying the voltage from the high-side sense power supply node SVP of sense amplifier SA.

The method of recharging the write inhibiting voltage in accordance with Embodiment 6 may be applied to the writing method in which charge-sharing is done with the source side capacitance according to Embodiments 2 to 5, as well as to the DC writing method in which charges are supplied in the DC manner from the drain side to the capacitance of a constant value (source side line capacitance) of the source node. When the source node of memory cell (MC1) is fixed at the ground voltage level using the assist gate, there is no capacitance that has a significant capacitance value on the source node, as in the case where the source diffusion line is coupled to the ground node.

As described above, according to Embodiment 6 of the present invention, in the operation of re-injecting electrons to the floating gate, charges accumulated in the line capacitance of the source side bit line are utilized, so that the source side node can be set to the level of write inhibiting voltage at high speed, using the write inhibiting voltage. Further, when the write inhibiting voltage is transmitted with the sense amplifier being isolated, the current from the high-side power supply node of the sense amplifier is not consumed, and hence, current consumption can be reduced.

Embodiment 7

Figure 48:
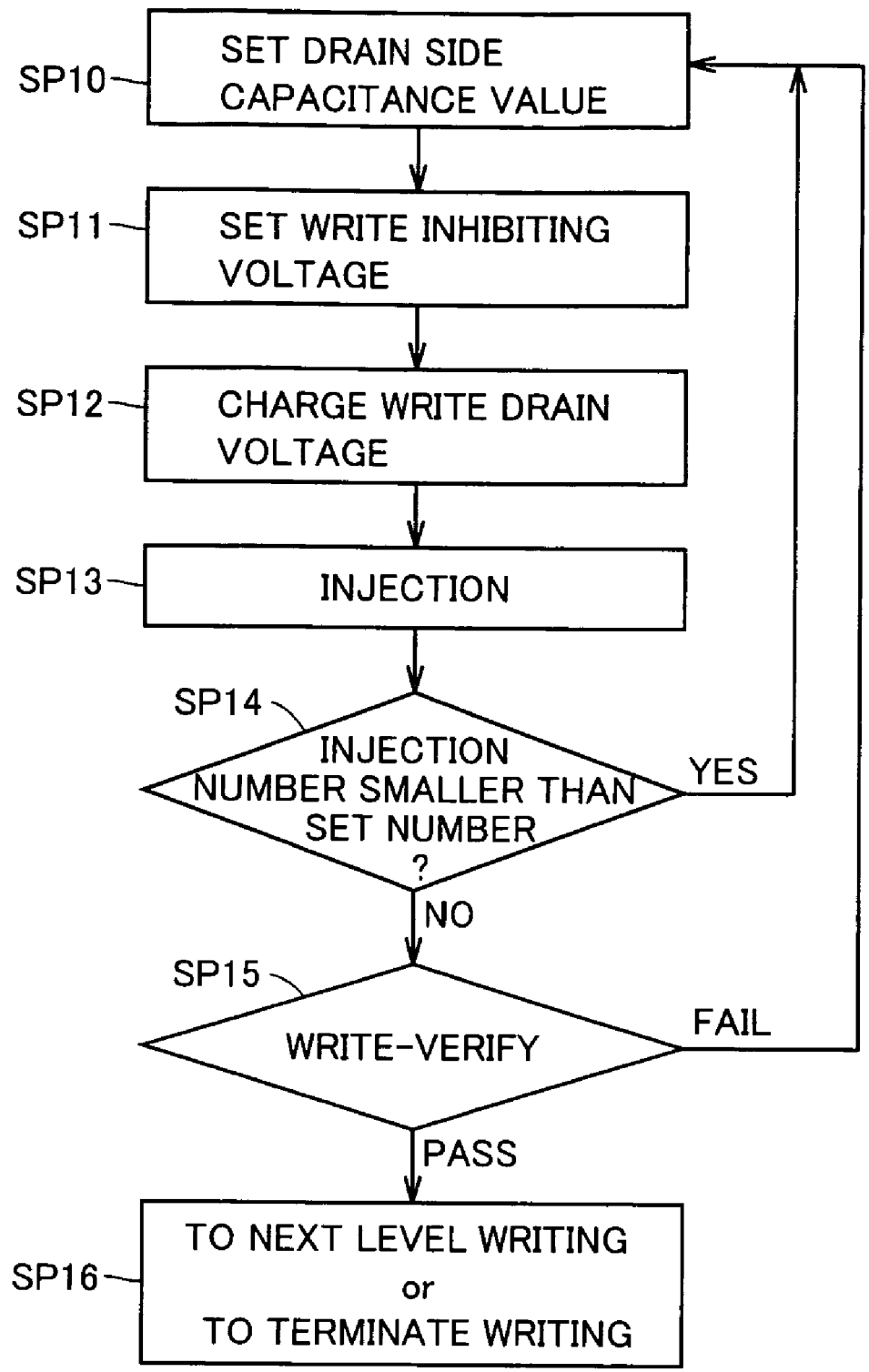
FIG. 48 is a flowchart representing an operation in data writing of a non-volatile semiconductor memory device in accordance with Embodiment 7 of the present invention.

FIG. 48 is a flow chart representing a writing operation in accordance with Embodiment 7 of the present invention. The state of writing operation shown in FIG. 48 corresponds to the sequence WOF of FIG. 7 above. In the following, data writing in accordance with Embodiment 8 of the present invention will be described with reference to the operation flow chart of FIG. 48.

First, in accordance with the value of write data, the capacitance value on the drain side is set (step SP10). Here, the amount of change in the threshold voltage differ dependent on the value of write data, and therefore, the capacitance value on the drain side is set by selectively connecting the divided global bit lines accordingly. At the time of setting the drain side capacitance value, how many divided global bit lines are to be used is determined in accordance with an array group address indicating the memory array group including the selected memory cell and in accordance with the value of write data. The direction of connection of the divided global bit lines is set such that the divided bit line extends downward as the capacitance value increases, in accordance with the position of the selected memory array group. When the divided global bit line used for charging the write voltage extends to the lowermost one, that is, to the divided global bit line coupled to the sense amplifier, the divided global bit line is connected and extended successively upward from the selected memory array group.

In parallel with or following the operation of setting the drain side capacitance value, the write inhibiting voltage is set (step SP11). In step SP11, the source node of the selected memory cell is charged with the write inhibiting voltage, in accordance with the method of Embodiment 6 described above. The write inhibiting voltage is transmitted from the sense amplifier through the global bit lint to the source node. Thereafter, the divided global bit line used as the source side capacitance is selectively connected to the source node (DLS).

Thereafter, the write drain voltage is charged through the set drain side capacitance, that is, the connected global bit line, to generate the drain write voltage (step SP12). The step SP11 of setting the write inhibiting voltage and the step SP12 of charging the write drain voltage may be executed in parallel, or the write inhibiting voltage may be set after charging the write drain voltage.

After setting of the drain voltage and the source voltage of selected memory cell is completed, an inversion layer is formed at the assist gate, and electrons are injected (injection) to the floating gate (step SP13).

Thereafter, whether the number of times of injections has reached a preset number or not is determined (step SP14). Specifically, the operation shown in Embodiment 5 described above is executed repeatedly. When the number of times of injections is smaller than the preset number, the operation from step SP10 is executed again, and the drain capacitance value is re-set and the drain node is charged. At this time, charge distribution through interconnected drain side capacitance elements may be utilized, in accordance with the method described in Embodiment 5.

In step SP14, when it is determined that the number of times of injections has reached the preset number, a write-verify is executed to determine whether the threshold voltage of the selected memory cell, that is, the written memory cell is within a prescribed voltage range or not (step SP15). In the step of write-verify SP15, if it is determined that the threshold voltage is out of the prescribed range (threshold failure: Fail), the operation from step SP10 is executed again, and re-injection is performed. The verifying operation may be executed for each injection.

If it is determined in step SP15 that the threshold voltage of memory cell of the object of writing is within the prescribed range (threshold voltage normal: Pass), writing of data of the next level is performed, or writing is terminated as writing of all data has been completed (step SP16).

By the series of operations, steps of charges of the threshold voltage can be set in accordance with the values of write data and the threshold voltage can be increased by the unit step, so that highly precise writing is achieved. Specifically, when data corresponding to a state of high threshold voltage is to be written, the drain side capacitance value is increased, so that the amount of change in the threshold voltage per one injection is increased. By increasing the unit amount of change in the threshold voltage, the amount of change of the threshold voltage attained by one injection can be increased, and therefore, data corresponding to a high threshold voltage can be written by a reduced number of times of injections. At this time, even though the amount of change of the threshold voltage attained by one injection is large, the range of threshold voltage distribution can be controlled with high precision (excess beyond upper limit can be suppressed), as the threshold voltage changes by the unit amount of change every injection.

[Modification]

Figure 49:
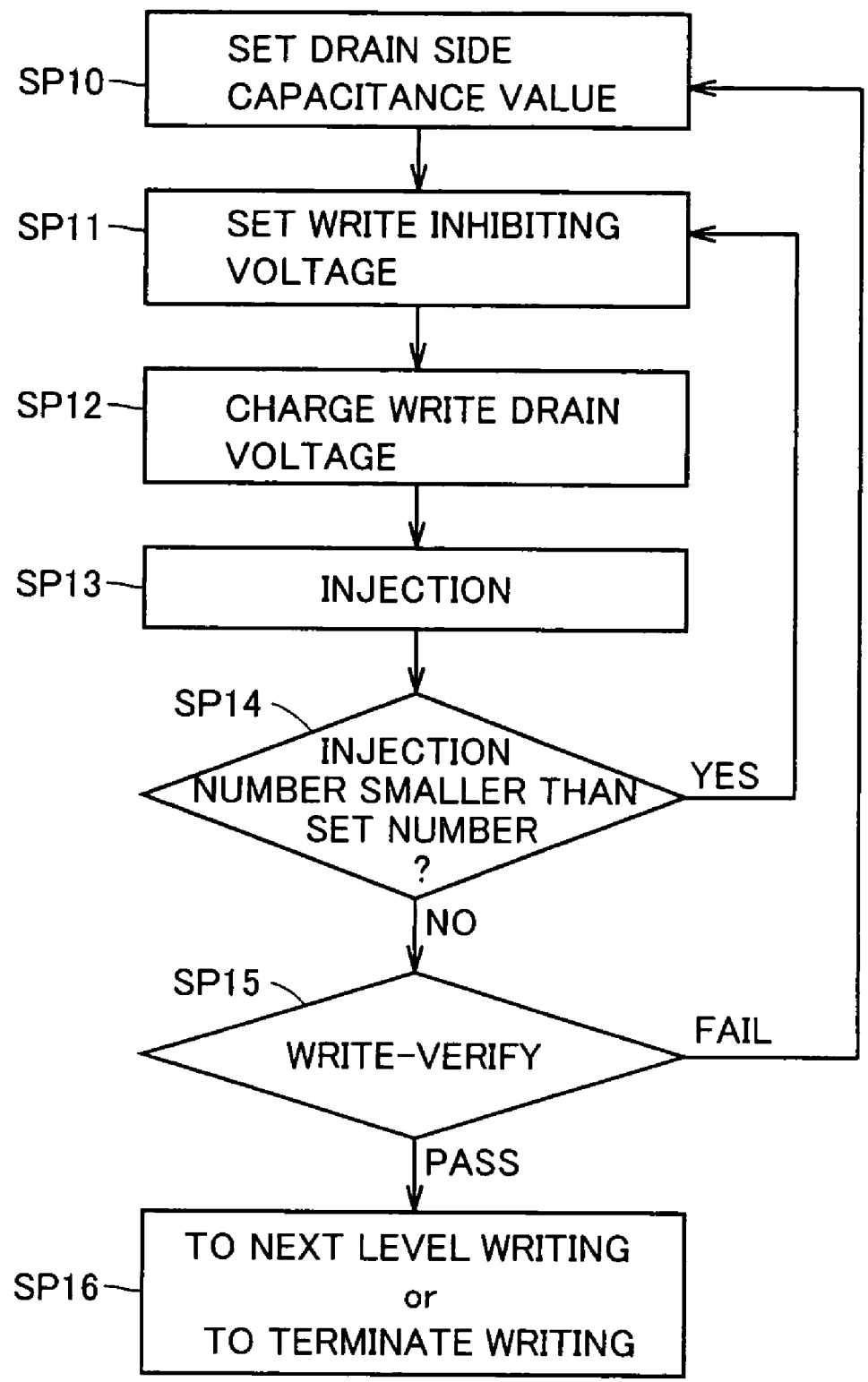
FIG. 49 is a flowchart representing another operation sequence in data writing of the non-volatile semiconductor memory device in accordance with Embodiment 7 of the present invention.

FIG. 49 represents a flow chart of data writing showing a modification of Embodiment 7 of the present invention. The operations performed in each step of the flow of data writing shown in FIG. 49 are the same as those in the data writing operation shown in FIG. 48, and therefore, corresponding portions are denoted by the same step numbers. In the flow chart shown in FIG. 49, in the step SP14 of determining the number of times of injections, until the number of times of injection reaches the set number, the operation returns to step SP11 and the write inhibiting voltage is set again (step SP11). In this state, re-setting of the drain side capacitance value is not performed, and the value of drain side capacitance remains the same. As the charging operation of the drain node, any of Writing Methods 1 to 11 described above may be used.

For each verifying operation, the drain side capacitance value is reset, and every time a verify failure (Fail) occurs, the drain side capacitance value is reset. By this approach, the time necessary for data writing can be reduced as compared with a configuration in which the drain side capacitance value is set every injection.

Here, the drain capacitance value may be changed at each verifying operation, and the amount of write charges may be incremented or decremented at each verifying operation. By adjusting the amount of change in the threshold voltage at every verifying operation, the amount of change in the threshold voltage at the time of re-injection is adjusted, and hence, highly precise and efficient rewriting can be achieved.

Figure 50:
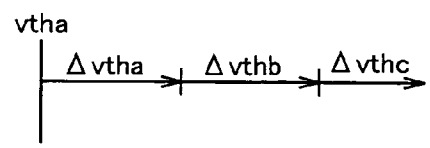
FIG. 50 is a schematic illustration showing the amount of cycle-by-cycle change in threshold voltage in data writing shown in FIGS. 48 and 49.

Specifically, the capacitance value on the drain side is changed at every injection or verifying operation to adjust the amount of charges injected in one data write cycle (injection), and the amount of change in the threshold voltage is gradually made smaller. As shown in FIG. 50, electrons are injected (injection) while the threshold voltage is changed from Vtha (corresponding to the initial state), with the amount of change in the threshold voltage made gradually smaller from ΔVtha, ΔVthb to ΔVthc. By repeating injection a plurality of times, it becomes possible to prevent an overwritten state exceeding the upper limit of threshold voltage, and hence, highly precise writing becomes possible.

In Embodiment 7 of the present invention, only the capacitance value on the drain side is changed. When writing through charge-sharing or by DC writing method is performed, however, the capacitance on the source side is also used. Then, the capacitance value on the source side can also be changed in step SP10 shown in FIG. 48 or 49, and by gradually making smaller the capacitance value of the source node, the drain current of the memory cell becomes smaller and the amount of charge injection per one writing can be reduced.

Alternatively, re-injection may be performed with the amount of change in the threshold voltage made larger every verifying operation.

Execution of the determining operation from step SP10 to SP16 shown in FIGS. 48 and 49 is controlled by the control circuit shown in FIG. 10.

Embodiment 8

Figure 51:
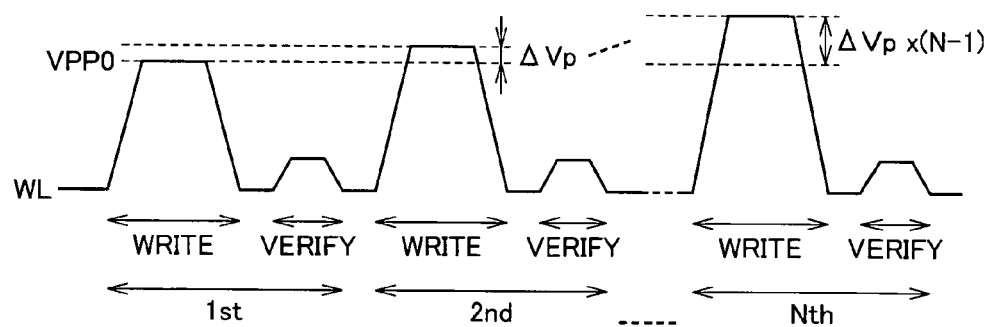
FIG. 51 schematically shows a sequence of change in a word line programming voltage at the time of writing of a non-volatile semiconductor memory device in accordance with the present invention.

FIG. 51 schematically shows the change in voltage of the word line in data writing in accordance with Embodiment 8 of the present invention. Referring to FIG. 51, writing is done with the write voltage of word line WL set to voltage VPP0, and thereafter, a verifying operation is performed to determine whether the threshold voltage of the memory cell is within a prescribed range or not. In this writing, injection may be repeated a number of times. FIG. 51 shows an example in which the voltage of word line WL is set to the level of write-verifying voltage. The verifying voltage is set for each of the upper and lower limits of the threshold voltage, and whether the drain current flows or not is detected, for the write-verify.

If it is determined by the verifying operation that the threshold voltage fails, the voltage level VPP0 of word line WL is increased by ΔVp. Thereafter, when re-writing is executed for the verifying operation, the voltage level of word line WL is increased by ΔVp. Therefore, after writing is done N times, the programming voltage of word line WL will be at the voltage level ΔVp·(N−1)+VPP0.

When the voltage level of programming voltage VPP on word line WL increases, an electric field in the vertical direction increases in the selected memory cell, and injection efficiency increases. Therefore, the amount of electrons to be injected at one time in the write cycle can be increased, and the prescribed threshold voltage can be reached through a smaller number of times of operations.

In this case, a configuration in which the voltage level on the word line is gradually lowered every write-verifying operation may be used.

Figure 52:
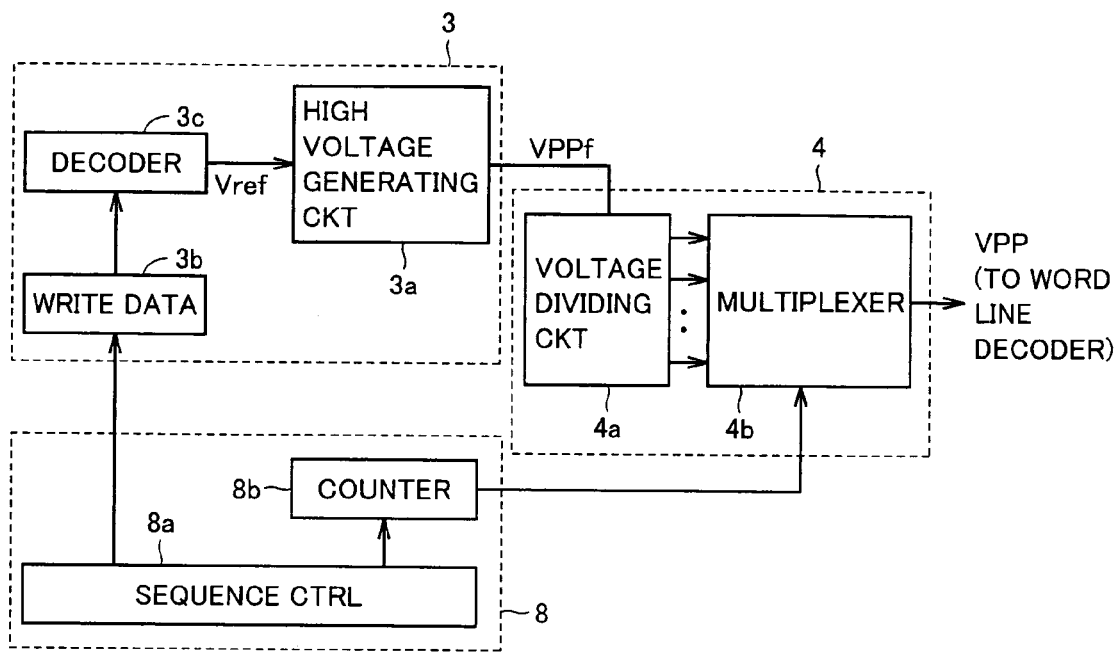
FIG. 52 schematically shows an exemplary configuration of a portion generating the word line programming voltage shown in FIG. 51.

FIG. 52 schematically shows an exemplary configuration of a word line write voltage generating unit. Referring to FIG. 52, the circuit shown in FIG. 10 is used for generating the word line write voltage, and therefore, portions shown in FIG. 52 that correspond to the circuit of FIG. 10 are denoted by the same reference characters to represent correspondence between the circuits.

Referring to FIG. 52, a power supply circuit 3 includes a high voltage generating circuit 3a for generating a word line programming voltage VPP0 at the time of writing, a write data register 3b for storing write data from control circuit 8, and a decoder 3c for decoding the data stored in write data register 3b and generating a reference voltage Vref in accordance with the result of decoding.

High voltage generating circuit 3a generates the highest word line programming voltage VPPf. High voltage generating circuit 3a includes, by way of example, a charge pump circuit, and a level detecting circuit for comparing an output voltage of the charge pump circuit with a reference voltage Vref (through a voltage dividing circuit), and controlling the operation of high voltage generation in accordance with the result of comparison. The configuration in which the generated voltage level is adjusted by level detection allows setting of the level of word line programming voltage VPPf generated by high voltage generating circuit 3a in accordance with the value of write data.

Voltage switching circuit 4 includes a circuit for selecting either the high voltage from high voltage generating circuit 3a or a negative voltage, though not shown in FIG. 52. FIG. 52 shows portions related to the word line programming voltage of voltage switching circuit 4. Voltage switching circuit 4 includes a voltage dividing circuit 4a for dividing the high voltage VPPf generated by high voltage generating circuit 3a, and a multiplexer 4b for selecting an output voltage of voltage dividing circuit 4a in accordance with a count value of a counter 8b included in control circuit 8 to generate the word line write voltage VPP.

In accordance with a verifying operation designating signal from a sequence controller 8a controlling the writing operation included in control circuit 8, a counter 8b counts the number of times of operations. Therefore, voltage dividing circuit 4a is formed, for example, by a resistance voltage dividing circuit and performs resistive division of high voltage VPPf. Multiplexer 4b selects the voltage VPP0 as the initial value and, thereafter, selects the voltage on the higher voltage side generated by voltage dividing circuit 4a successively in accordance with the count value of counter 8b, so that the voltage level of word line programming voltage VPP is increased.

Here, the high voltage VPPf is changed in accordance with the write data and, therefore, the width ΔVp of voltage change naturally differs in accordance with the value of each data, assuming that the ratio of voltage division is constant.

Alternatively, in voltage dividing circuit 4a, the ratio of voltage division, that is, the width of change (step) of the divided voltage, may be changed in accordance with the data latched by write data register 3a. Further, if the output node of voltage dividing circuit 4a selected by multiplexer 4b is set in accordance with the value of write data, the ratio of voltage division of voltage dividing circuit 4a can be changed in accordance with the value of each write data. In this configuration, when the minimum step of voltage division by voltage dividing circuit 4a is ΔU, the voltage step can be changed by an integer multiple, that is, n·ΔU, of the minimum step ΔU of voltage division, in accordance with the write data.

Alternatively, a configuration may be used in which the voltage level of reference voltage Vref generated by decoder 3c is increased successively in accordance with the count value of counter 8b (one of a plurality of divided voltages of different levels of the basic reference voltage is selected in accordance with the number of times of injections), or other configurations may be used.

[Modification]

Figure 53:
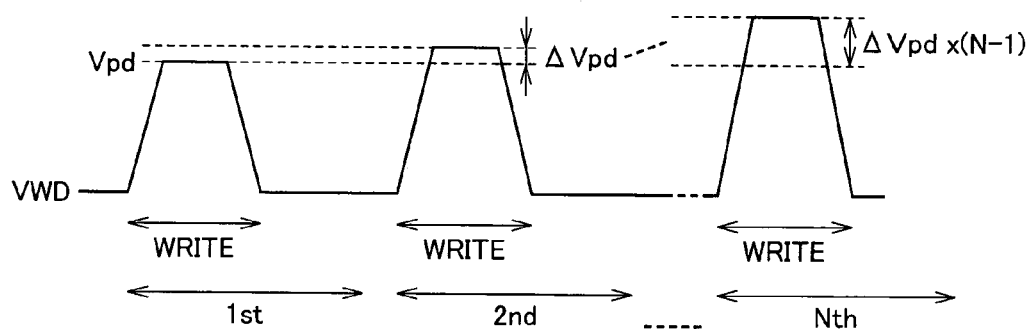
FIG. 53 shows an example of a sequence of change in a drain write voltage in accordance with Embodiment 8 of the present invention.

FIG. 53 shows a sequence of change in the write voltage in accordance with a modification of Embodiment 8 of the present invention. In the method of data writing shown in FIG. 53, the voltage level of write voltage VWD supplied to the drain bit line is increased by a prescribed value ΔVpd, every time writing is done. Therefore, after N times of writing, the voltage level of write voltage VWD will be Vpd+ΔVpd·(N−1). As the voltage level of drain write high voltage VWD, voltage difference between the drain and source becomes larger, and in this example, the amount of charges accumulated in the drain side capacitance also increases. As the voltage ΔVpd increases, the amount of charges injected at each injection increases and, accordingly, the width of change in the threshold voltage can be increased. Therefore, the distribution of threshold voltage can be converged at high speed.

In the write sequence shown in FIG. 53, for writing, the voltage level of write high voltage VWD may be changed at every verifying operation, or the verifying operation may be performed after a prescribed number of times of injections, and the voltage level of write high voltage VWD may be changed at each write operation cycle including the verifying operation.

[Modification 2]

Figure 54:
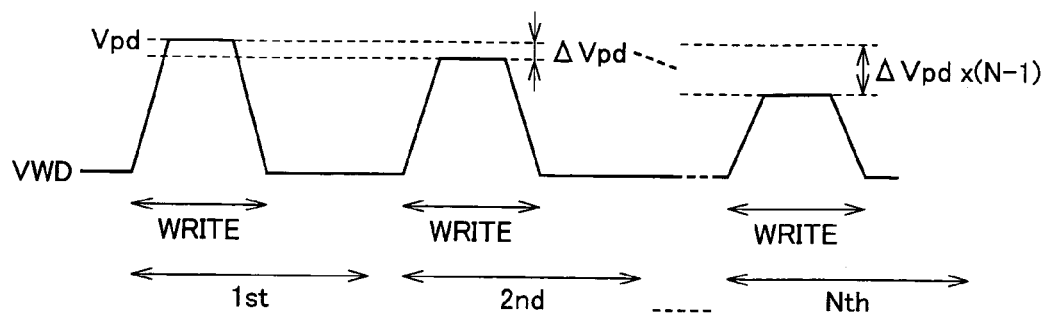
FIG. 54 shows another example of a sequence of change in a drain write voltage in accordance with Embodiment 8 of the present invention.

FIG. 54 shows a modification of the sequence of change in the write high voltage at the time of writing operation in accordance with Embodiment 8 of the present invention. In the write sequence shown in FIG. 54, the voltage level of drain write voltage VWD in data writing is decreased by the prescribed value ΔVpd every writing. Assuming that the voltage level of drain write high voltage VWD at the first time is Vpd, the voltage level of drain write high voltage VWD for the N-th operation will be Vpd−ΔVpd·(N−1).

In the write sequence shown in FIG. 54, at each write cycle, the amount of injected electrons decreases, and the amount of change in the threshold voltage can be reduced. Therefore, the threshold voltage can be adjusted with higher precision, and variation in threshold voltage distribution can be suppressed.

Figure 55:
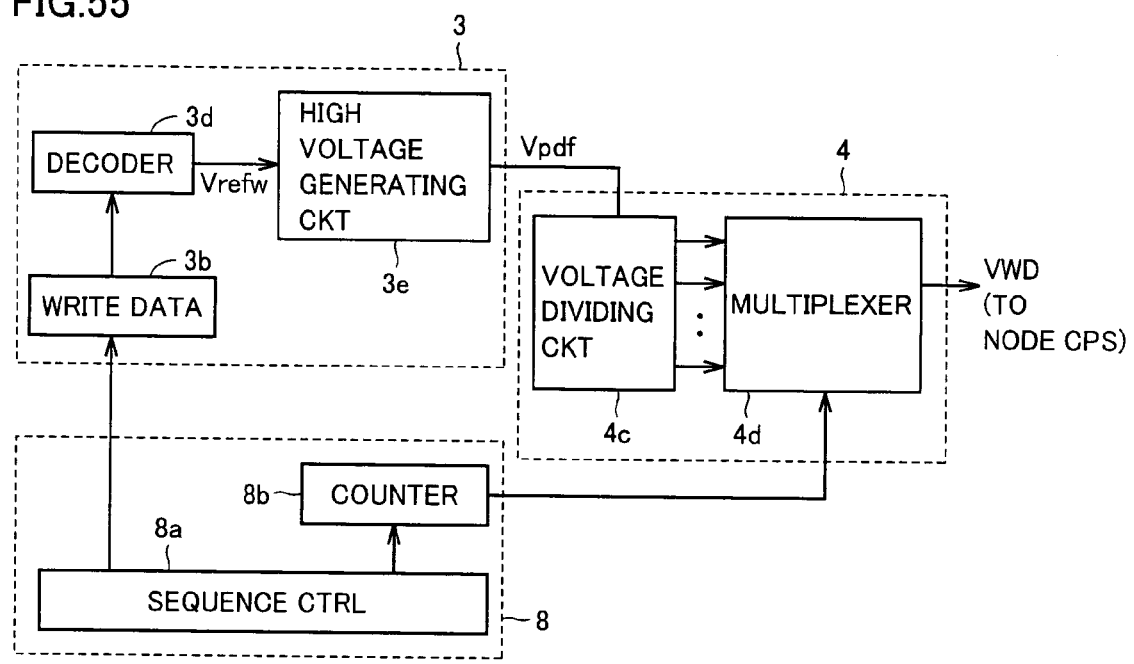
FIG. 55 schematically shows an exemplary configuration of a portion generating a drain write voltage shown in FIGS. 53 and 54.

As the configuration for generating the drain write voltage shown in FIGS. 53 and 54, a configuration similar to that of FIG. 52 may be used. Specifically, as shown in FIG. 55, in power supply circuit 3, by decoder 3d, a reference voltage for writing Vrefw is generated in accordance with the write data from write data register 3b. In accordance with the reference voltage Vrefw, a high voltage generating circuit 3e of the power supply circuit generates the write high voltage Vpd of the voltage level defined by the reference voltage Vrefw. The voltage level of write high voltage VWD is adjusted in accordance with the value of write data.

In voltage switching circuit 4, the high voltage Vpd is subjected to resistive division by voltage dividing circuit 4c, multiplexer 4d selects a voltage of one of a plurality of output nodes of voltage dividing circuit 4c in accordance with the count of number of times of writing from counter 8b included in control circuit 8, and the drain write voltage VWD is generated. The drain write high voltage VWD is applied to the write voltage supplying node CPS of the embodiments above. When multiplexer 4d selects the voltage of the central value among the plurality of divided voltage output nodes of voltage dividing circuit 4c as the initial value at the first writing operation and outputs the voltage Vpd, it is possible to change the voltage level of write high voltage VWD in both the increasing and decreasing directions by the voltage ΔVpd every write operation cycle (every injection or every prescribed number of injections and verifying operations).

The word line write high voltage VPP and the drain write high voltage VWD may be changed for every data value at each writing operation.

Further, by changing the voltage level of write high voltage VWD for each write data, the amount of charge accumulation at the drain node can be adjusted even when the same drain side capacitance is used. Therefore, by adjusting both the drain write voltage VWD and the amount of charges accumulated on the drain side, the amount of electrons to be injected can be adjusted delicately, and the width of change in the threshold voltage can be controlled with high precision.

As described above, according to Embodiment 8 of the present invention, at least one of the word line write voltage and the drain side write voltage is changed at each write cycle in data writing, and therefore, highly precise and high speed writing is realized.

The present invention is applicable to a non-volatile semiconductor memory device in which electrons are injected in accordance with source side injection method and information is stored in accordance with the amount of injected electrons. Here, the charge accumulating layer is not limited to the floating gate, and the present invention is applicable to an insulating film charge trap type memory cell structure, in which charges are accumulated in a silicon nitride layer of an ONO film (Oxide/Nitride/Oxide structure).

As the memory cell structure, a configuration in which the source line of the memory cell is formed by an inversion layer at the time of data reading and a channel current and a source high electric field are generated at the time of data writing, using an assist gate, is used. However, in place of the configuration using the assist gate, a memory cell structure may be used in which a selecting transistor is connected in series with the memory cell and forms a path through which a current flows to the memory cell in accordance with the word line voltage. The selecting transistor may be arranged either on the drain side (bit line side) or the source side of the memory cell transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:
    a plurality of non-volatile memory cells each storing data of at least three values, each memory cell causing current flow of different amount in accordance with stored data;
    a plurality of first signal lines arranged corresponding to columns of the memory cells;
    a plurality of second signal lines arranged separate from said plurality of first signal lines and corresponding to the columns of the memory cells;
    a capacitance control circuit for changing a capacitance value of at least one of the first and second signal lines associated with a selected memory cell in accordance with a value of write data, when data is written to the selected memory cell; and
    a write control circuit for supplying charges accumulated in the one of said first and second signal lines as a write current to the selected memory cell, the other of said first and second signal lines receiving the write current applied through said selected memory cell.

2. The non-volatile semiconductor memory device according to claim 1, wherein
    said capacitance control circuit changes the respective capacitances of said plurality of first signal lines.

3. The non-volatile semiconductor memory device according to claim 2, wherein
    said plurality of first signal lines supply charges accumulated in a corresponding capacitance as the write current, at a time of data writing; and
    to said plurality of second signal lines, when data are written to memory cells of the corresponding columns at the time of said data writing, the write current from the corresponding first signal lines flows in.

4. The non-volatile semiconductor memory device according to claim 1, wherein
    said capacitance control circuit changes capacitances of both said plurality of first signal lines and the plurality of second signal lines.

5. The non-volatile semiconductor memory device according to claim 4, wherein
    said plurality of first signal lines each supply charges accumulated in a corresponding capacitance as the write current, at a time of data writing; and
    to said plurality of second signal lines, when data are written to memory cells of the corresponding columns at the time of said data writing, the write current from the corresponding first signal lines flows in.

6. The non-volatile semiconductor memory device according to claim 1, wherein
    said plurality of first and second signal lines include a plurality of conductive lines; and
    each of said plurality of conductive lines is used as said first signal line or said second signal line, dependent on the position of a selected memory cell at the time of data writing.

7. The non-volatile semiconductor memory device according to claim 1, further comprising:
    a plurality of word lines arranged corresponding to the respective rows of the memory cells; and
    a write word line voltage control circuit for changing a voltage level of the word lines every time the number of write cycles increases, in said data writing.

8. The non-volatile semiconductor memory device according to claim 1, further comprising
    a write voltage control circuit for changing a write voltage at each write cycle, to a signal line to which the write voltage is supplied among the first and second signal lines, in said data writing.

* * * * *